United States Patent
Obayashi

(10) Patent No.: US 8,681,527 B2
(45) Date of Patent: Mar. 25, 2014

(54) SEMICONDUCTOR DEVICE

(75) Inventor: Shigeki Obayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 429 days.

(21) Appl. No.: 12/938,001

(22) Filed: Nov. 2, 2010

(65) Prior Publication Data
US 2011/0116299 A1 May 19, 2011

(30) Foreign Application Priority Data
Nov. 16, 2009 (JP) ................................ 2009-260911

(51) Int. Cl.
*G11C 17/14* (2006.01)
(52) U.S. Cl.
USPC ............................. 365/96; 257/751; 257/529
(58) Field of Classification Search
USPC .................. 257/529, 530, 751, 758, E23.149; 365/96, 225.7
See application file for complete search history.

(56) References Cited

U.S. PATENT DOCUMENTS

| | | | |
|---|---|---|---|
| 6,424,041 B1 * | 7/2002 | Oashi et al. | 257/751 |
| 7,443,755 B2 * | 10/2008 | Choi | 365/225.7 |
| 8,242,576 B2 * | 8/2012 | Lin et al. | 257/529 |
| 2003/0085445 A1 * | 5/2003 | Watanabe | 257/529 |
| 2007/0018279 A1 * | 1/2007 | Lin et al. | 257/529 |
| 2007/0280012 A1 | 12/2007 | Obayashi et al. | |
| 2010/0014374 A1 * | 1/2010 | Takase et al. | 365/225.7 |
| 2010/0046291 A1 * | 2/2010 | Dudeck et al. | 365/185.05 |
| 2010/0230780 A1 * | 9/2010 | Obayashi | 257/529 |

FOREIGN PATENT DOCUMENTS

JP  2007-317882  12/2007

* cited by examiner

*Primary Examiner* — Douglas King
(74) *Attorney, Agent, or Firm* — McDermott Will & Emery LLP

(57) ABSTRACT

To provide a semiconductor device capable of reducing the line width of a fuse.
In the semiconductor device, a dummy fuse is provided adjacent to a fuse, each wiring width of the fuse and the dummy fuse is set to the minimum line width, and the interval between the fuse and the dummy fuse is set to the minimum interval. Consequently, the exposure condition of the fuse and the dummy fuse is optimized by OPC, and therefore, it is possible to form the fuse with the minimum line width.

20 Claims, 40 Drawing Sheets

FIG. 16
(a)
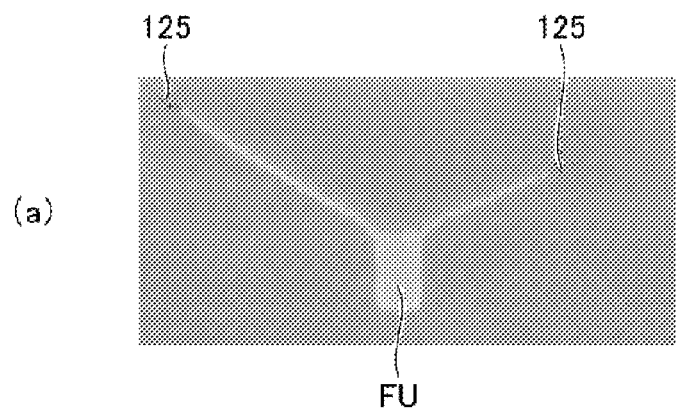
(b)
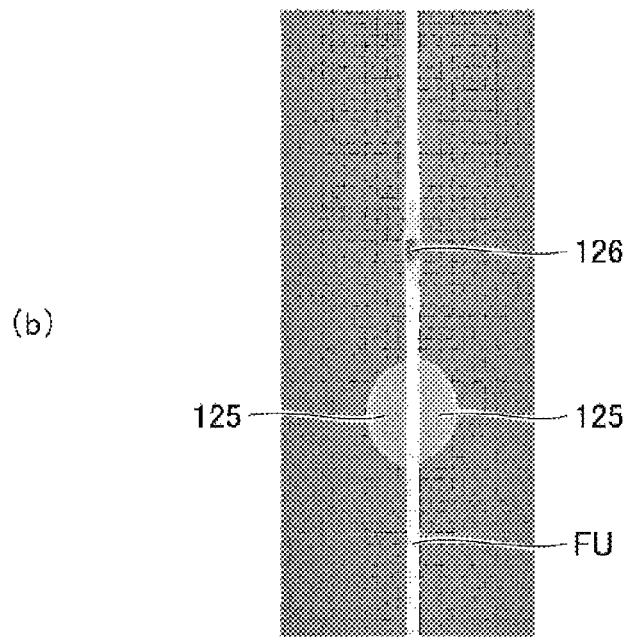

FIG. 17
(a)
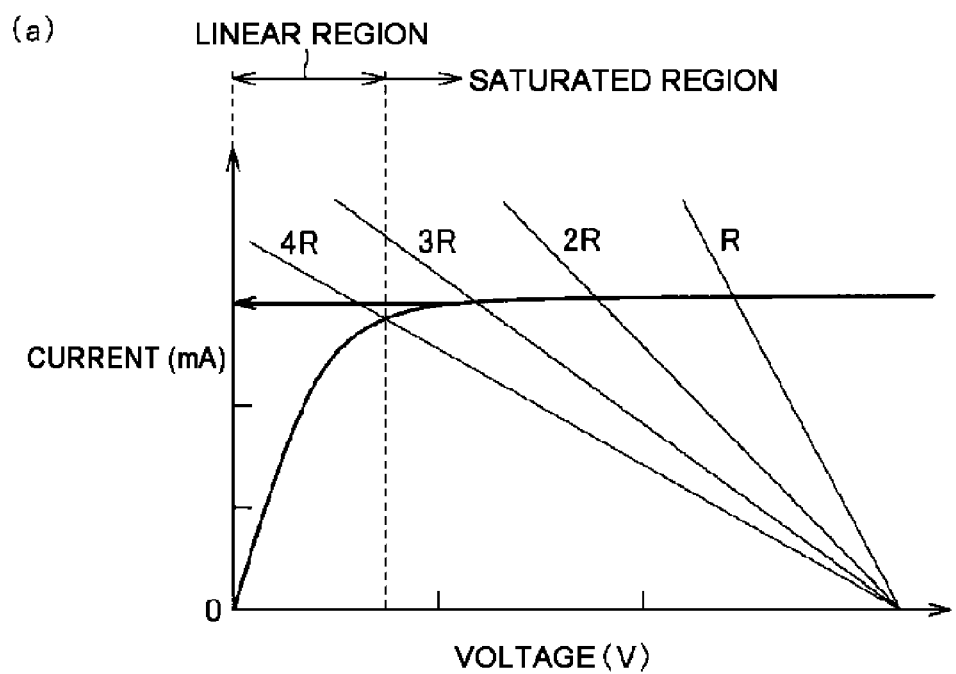
(b)
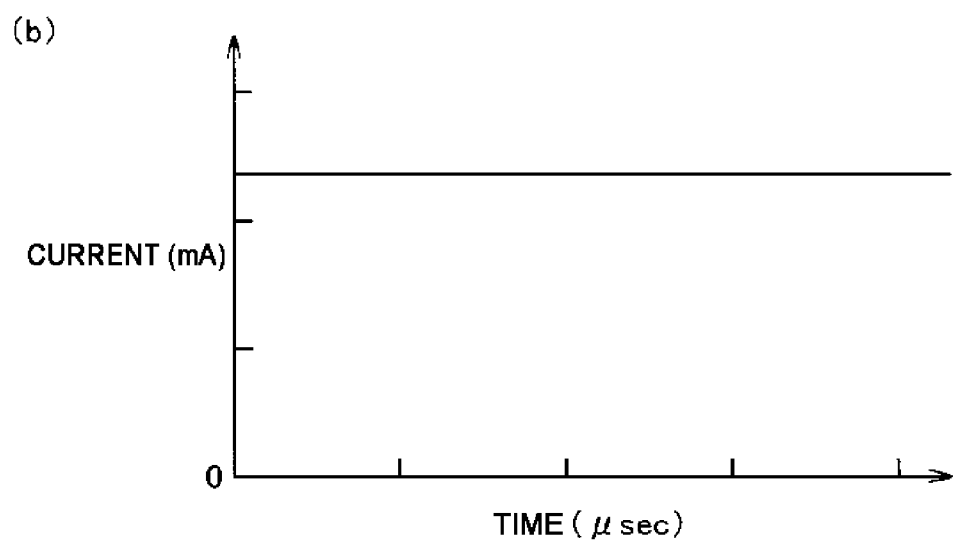

FIG. 18
(a)
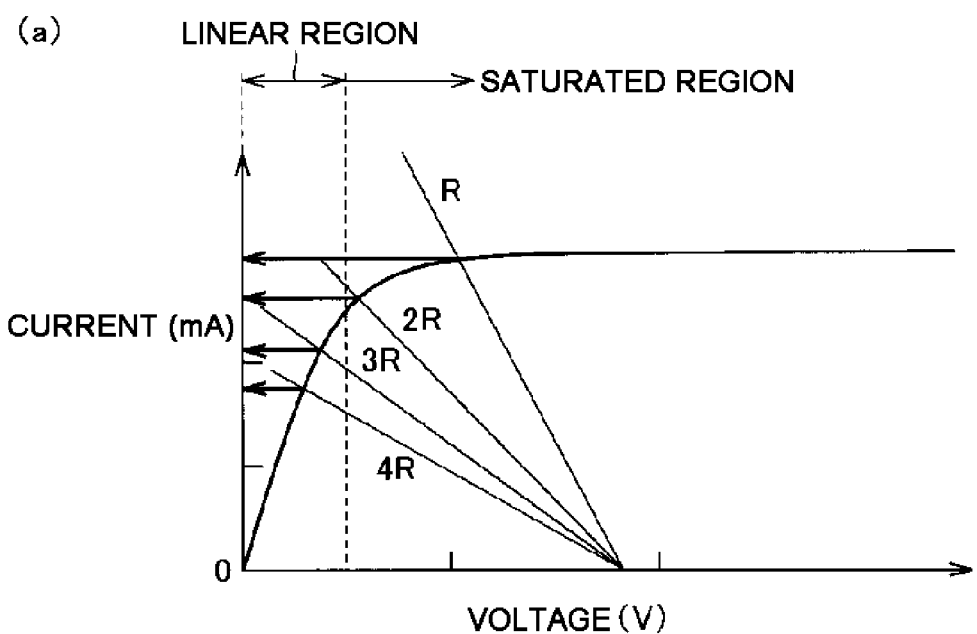
(b)
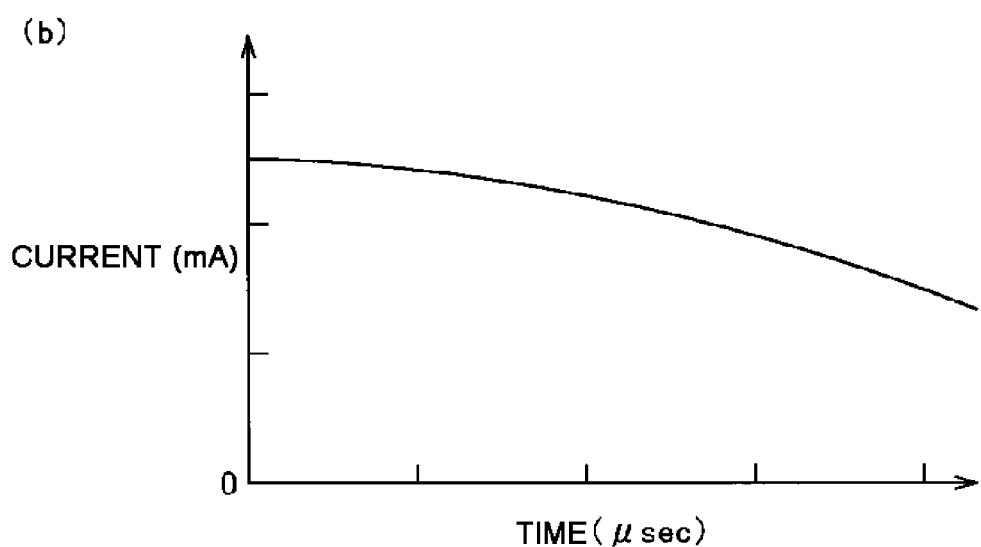

FIG. 19
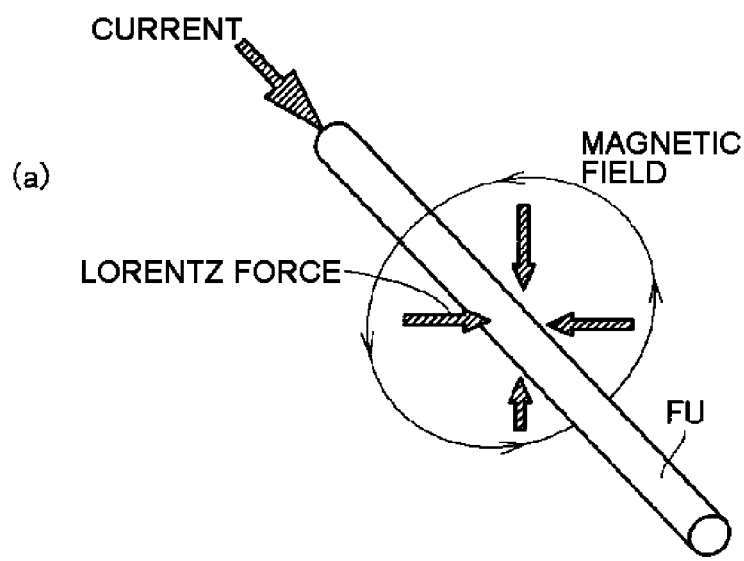
(a)
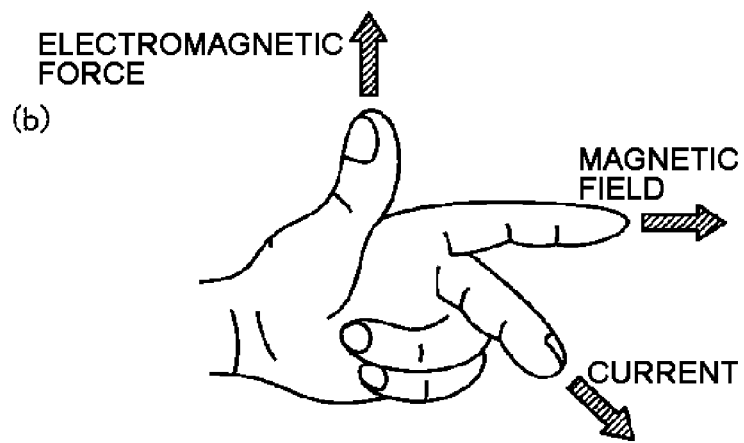
(b)

FIG. 21
(a)
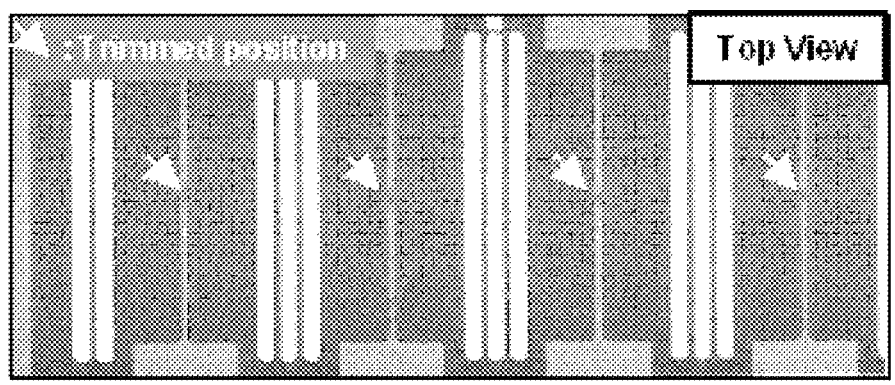
(b)
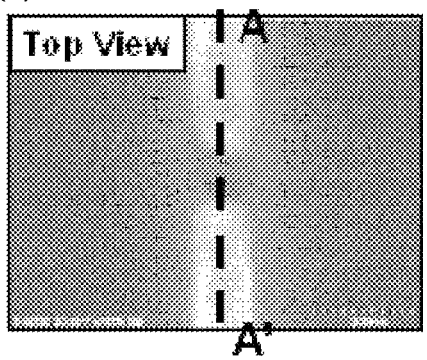
(c)
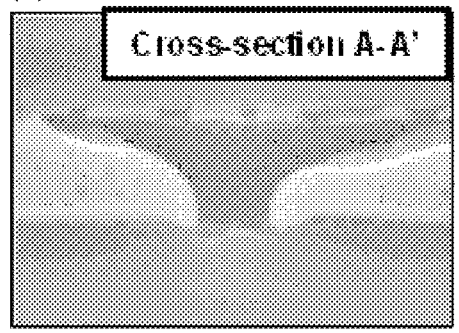

FIG. 23
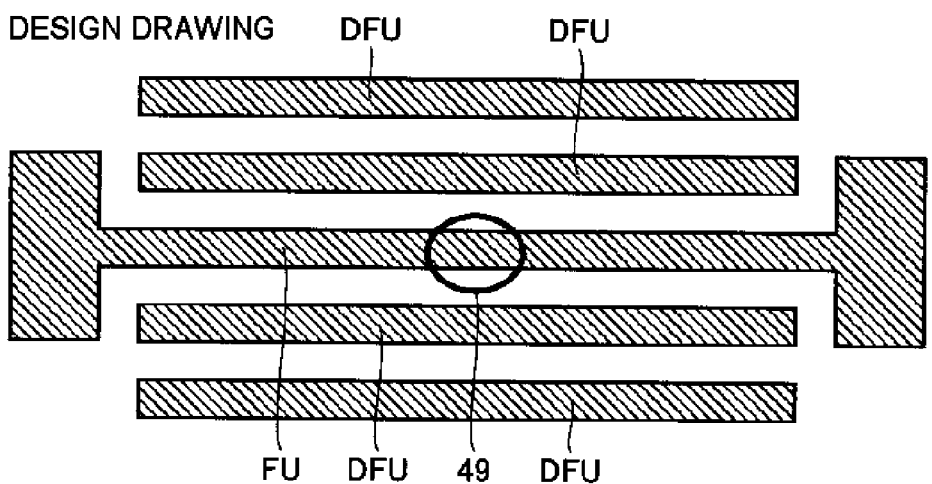
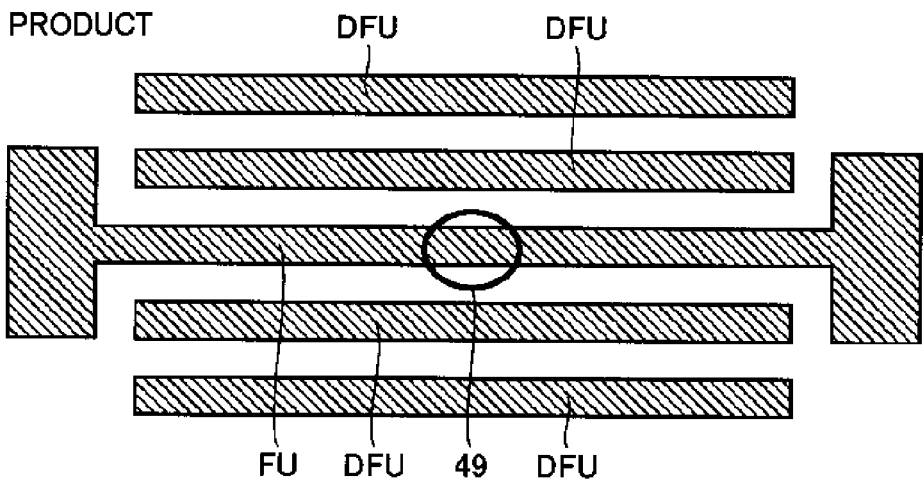

FIG. 25
(a) DESIGN DRAWING
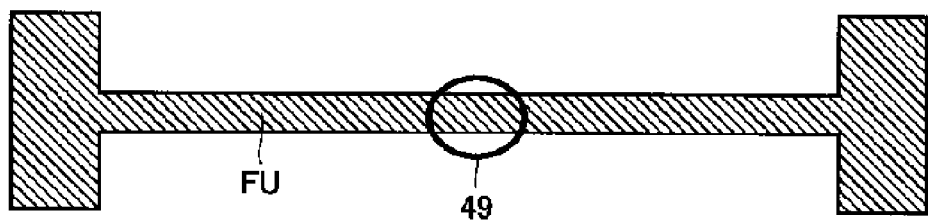
(b) PRODUCT
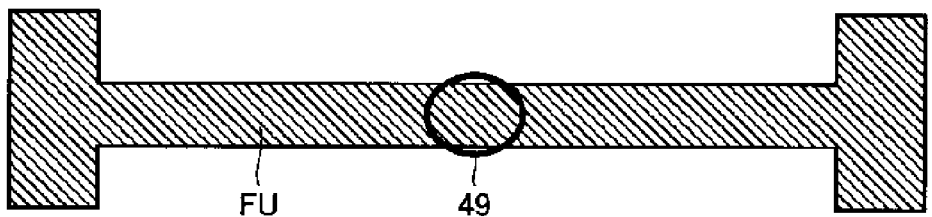

US 8,681,527 B2

SEMICONDUCTOR DEVICE

CROSS-REFERENCE TO RELATED APPLICATION

The disclosure of Japanese Patent Application No. 2009-260911 filed on Nov. 16, 2009 including the specification, drawings and abstract is incorporated herein by reference in its entirety.

BACKGROUND OF THE INVENTION

The present invention relates to a semiconductor device and particularly, to a semiconductor device that comprises a fuse for storing a data signal by being melted or not.

In a semiconductor integrated circuit device (semiconductor device), a fuse program circuit is used for various applications. In the fuse program circuit, the state of an output signal is set fixedly depending on whether a fuse element is melted or not. For example, in order to fine-adjust (trim) the constant of an analog circuit, such a fuse element is used. Specifically, programming (melt/not melt) of a fuse element is performed for the adjustment of the current drive force of a transistor element, the adjustment of the amount of supply current of a reference current source, and/or the adjustment of a reference voltage level generated by a reference voltage source. Further, in order to fine-adjust the resistance value of a resistor element, such a fuse program circuit is used.

Furthermore, in a semiconductor memory, it is necessary to program a defective address to identify a defective cell in order to replace the defective cell with a redundant cell and a fuse program circuit is used to store such a defective address. By utilizing such a fuse program circuit, the optimization of the circuit operation characteristics is realized whether the circuit is analog or digital and the improvement of yields is aimed at by restoring a defective cell in a semiconductor memory.

A configuration of a fuse program circuit including a wire fusing type electric fuse element that melts a fuse element with an electric current in such a fuse program is described in Patent Document 1 (Japanese Patent Laid-Open No. 2007-317882). In the configuration described in Patent Document 1, a fuse is formed using a wire in the upper layer of a multilayer metal wiring layer and a diffusion protective wall is formed so as to surround the fuse. The fuse is formed by a copper (Cu) wire and the cutting defect due to the diffusion of copper after melting is suppressed from occurring by the diffusion protective wall.

SUMMARY OF THE INVENTION

It is necessary to form a fuse as thin as possible in order to melt the fuse with a small current. However, in the manufacturing process of a 100 nm or less node, there is such a problem that even if a fuse, which is an isolated copper wire, is designed to have a minimum line width, in fact, the fuse is formed thicker than the minimum line width.

That is, in such a manufacturing process, OPC (Optical Proximity Correction) is performed. The OPC is a technique to correct an original image in view of the deficiency in resolution of a manufacturing apparatus in advance. By the OPC, the exposure condition is optimized in a region in which a plurality of wires with a minimum line width is arranged at minimum intervals and the resolution of the isolated wire is reduced. Because of this, even if the fuse, which is an isolated copper wire, is designed to have a minimum line width, it is formed thick in fact.

In Patent Document 1, there is such a problem that when the number of fuses increases, the layout area increases because the diffusion protective wall is provided for each fuse.

The present invention has been made in view of the above circumstances and has an object to provide a semiconductor device capable of reducing the line width of a fuse.

Another object of the present invention is to provide a semiconductor device capable of reducing the layout area.

A semiconductor device according to the present invention is a semiconductor device having a plurality of metal wiring layers, the semiconductor device comprising: a fuse which is formed using a first copper wire in a metal wiring layer upper than the lowermost metal wiring layer of the metal wiring layers and which stores a data signal by being melted or not; a dummy fuse provided adjacent to the fuse and formed using a second copper wire in the same metal wiring layer as that of the fuse; and a diffusion protective wall which is formed using the metal wiring layers so as to surround the fuse and the dummy fuse and which prevents diffusion of copper. Here, each wiring width of the fuse and the dummy fuse is set to the minimum line width in a region surrounded by the diffusion protective wall, and wherein the interval between the fuse and the dummy fuse is set to the minimum interval in the region surrounded by the diffusion protective wall.

Another semiconductor device according to the present invention is a semiconductor having a plurality of metal wiring layers, the semiconductor device comprising a memory array including: a plurality of fuses arranged in a plurality of rows and columns and each of which stores a data signal by being melt or not; a plurality of word lines provided corresponding to the rows, respectively; a plurality of bit lines provided corresponding to the columns, respectively; and a plurality of transistors each provided corresponding to each of the fuses and each of which has a gate coupled to the corresponding word line. Each of the fuses and the transistor corresponding thereto are coupled in series between a fuse power source node and the corresponding bit line. Each of the fuses is formed using a first copper wire in a metal wiring layer upper than the lowermost metal wiring layer of the metal wiring layers. The semiconductor device further includes: a row decoder that sets any of the word lines to a selection level according to a row address signal and turns on the transistor corresponding to the word line; a column decoder that selects any of the bit lines according to a column address signal; a write circuit that melts the selected fuse by applying a predetermined voltage between the fuse power source node and the bit line selected by the column decoder at the time of write operation; a read circuit that detects whether or not an electric current flows between the fuse power source node and the bit line selected by the column decoder and outputs a data signal at a logic level in accordance with the detection result at the time of read operation; and a diffusion protective wall formed using a metal wire in the same metal wiring layer as that of the fuses so as to surround at least the fuses and which prevents diffusion of copper.

In a semiconductor device according to the present invention, the dummy fuse is provided adjacent to the fuse, each wiring width of the fuse and the dummy fuse is set to the minimum line width, and the interval between the fuse and the dummy fuse is set to the minimum interval. Consequently, the exposure condition of the fuse and the dummy fuse is optimized, and therefore, it is possible to form a fuse with a minimum line width.

Further, in another semiconductor device according to the present invention, the fuses are surrounded by one diffusion protective wall, and therefore, it is possible to reduce the layout area compared to the conventional case where each fuse is surrounded by the diffusion protective wall.

BRIEF DESCRIPTION OF THE DRAWINGS

FIG. 16 is an SEM photo of the fuse melted by the conventional method shown in FIG. 14 and FIG. 15;

FIG. 17 is a diagram showing the operation of a fusing current supply transistor in the conventional method shown in FIG. 14 to FIG. 16;

FIG. 18 is a diagram showing the operation of a fusing current supply transistor in a fuse melting method of the present application;

FIG. 19 is a diagram showing the pinch effect utilized in the fuse melting method of the present application;

FIG. 21 is an SEM photo of a fuse melted by the fuse melting method of the present application shown in FIG. 18 to FIG. 20;

FIG. 23 is a diagram for explaining the effect of the first embodiment;

FIG. 25 is a diagram showing a problem of the comparative example shown in FIG. 24;

DETAILED DESCRIPTION OF THE PREFERRED EMBODIMENTS

First Embodiment

Figure 1:
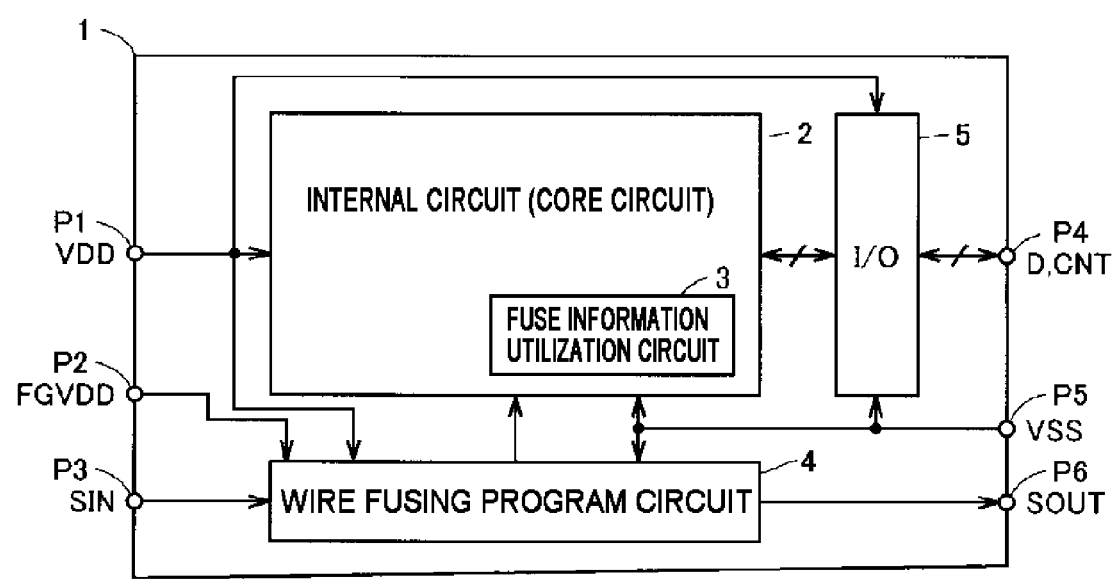
FIG. 1 is a diagram roughly showing a general configuration of a semiconductor device according to a first embodiment of the present invention.

FIG. 1 is a diagram roughly showing a general configuration of a semiconductor device according to a first embodiment of the present invention. In FIG. 1, a semiconductor device 1 includes an internal circuit (core circuit) 2 that realizes predetermined functions, a wire fusing program circuit 4 that fixedly stores information that specifies the operation state or operation aspect of the internal circuit 2 (information on the internal circuit), and a signal input/output (I/O) circuit 5.

The semiconductor device 1 may be formed over one semiconductor chip or integrated over the same chip as that of the functional blocks, such as another processor and a memory, and the semiconductor device is equivalent to a semiconductor integrated circuit device.

The internal circuit 2 receives a ground voltage VSS given from outside via a ground pad P5 as a reference voltage as well as receiving a power source voltage VDD given from outside via a power source pad P1 as an operating power source voltage to realize the predetermined functions. The internal circuit 2 is a core circuit of the semiconductor device (semiconductor integrated circuit device) 1 and may be, for example, a memory circuit including a memory cell array or may be a processing device such as a processor. The internal circuit 2 is only required that the internal wires be arranged/routed using a multilayer wire of copper (Cu).

The internal circuit 2 includes a fuse information utilization circuit 3 and the operation state or operation aspect of the fuse information utilization circuit 3 is specified according to program information (fuse information) from the wire fusing program circuit 4.

For example, when the internal circuit 2 is a memory circuit, the fuse information utilization circuit 3 includes a redundant decoder to restore a defective cell and the redundant decoder restores the defective cell by selectively performing redundant replacement according to the stored information of the wire fusing program circuit 4. To the fuse information utilization circuit 3, an analog amount may be set, such as a voltage level, electric current, and resistance value that occur according to progressive information (fuse information) from the wire fusing program circuit 4.

The wire fusing program circuit 4 includes a plurality of fuse elements and fixedly stores information depending on whether the fuse element is melted or not. The fuse of a fuse element FS is formed by a wire Mi in an ith-layer in the multilayer wire.

The wire fusing program circuit 4 realizes the fuse element by using the same wire as that of the internal circuit 2 and a metal wire in the upper layer of the metal wire (copper (Cu) wire). The wire fusing program circuit 4 receives the power source voltage VDD from the power source node P1, the ground voltage VSS from the ground pad P5, and a fuse gate power source voltage FGVDD given from outside via a fuse power source pad P2. The fuse gate power source voltage FGVDD is utilized as a control voltage to cause an electric current for melting to flow at the time of fuse element program. By applying the fuse gate power source voltage FGVDD from outside, the amount of fusing current to be supplied to the fuse when melting the fuse is set to an optimum value.

In the wire fusing program circuit 4, the fuse elements are arranged in parallel, as will be explained later, and a scan path is provided to selectively program the melted/non-melted state of the fuse element. The scan path is provided with a flip-flop corresponding to the fuse element. Via the scan path configured by a flip-flop string, a serial input SIN from an input pad P3 is transferred, fuse program information is set to the flip-flop corresponding to each fuse element, and the stored information of the flip-flop from an output pad P6 is output as a serial output SOUT. The use of the serial output SOUT will be explained later.

The signal input/output circuit 5 operates by receiving the power source voltage VDD from the power source pad P1 and the ground voltage VSS from the ground pad P5 and has a large drive force and a low output impedance. The signal input/output circuit 5 increases the amplitudes of a multibit data signal D and a control signal CNT generated in the internal circuit 2 and outputs them to outside via a plurality of input/output pads P4. Further, the signal input/output circuit 5 reduces the amplitudes of the multibit data signal D and the control signal CNT given from outside via the input/output pads P4 and gives them to the internal circuit 2.

As transistors that configure the internal circuit 2, the fuse information utilization circuit 3, and the wire fusing program circuit 4, low withstand voltage transistors capable of high speed operation are used. The gate insulating film of the low withstand voltage transistor is formed by a predetermined low withstand voltage, thin material (for example, silicon oxide film nitrided or a high-k dielectric material including HF compound). On the other hand, in the signal input/output circuit 5, a high withstand voltage transistor is also used besides the low withstand voltage transistor. The gate insulating film of the high withstand voltage transistor is formed by a material that has a higher withstand voltage and a greater thickness than the gate insulating film of the low withstand voltage transistor and which is different from the gate insulating film of the low withstand voltage transistor. The high withstand voltage transistor has a wider range of operating voltage, a larger drive force, and a lower operation speed than the low withstand voltage transistor.

Figure 2:
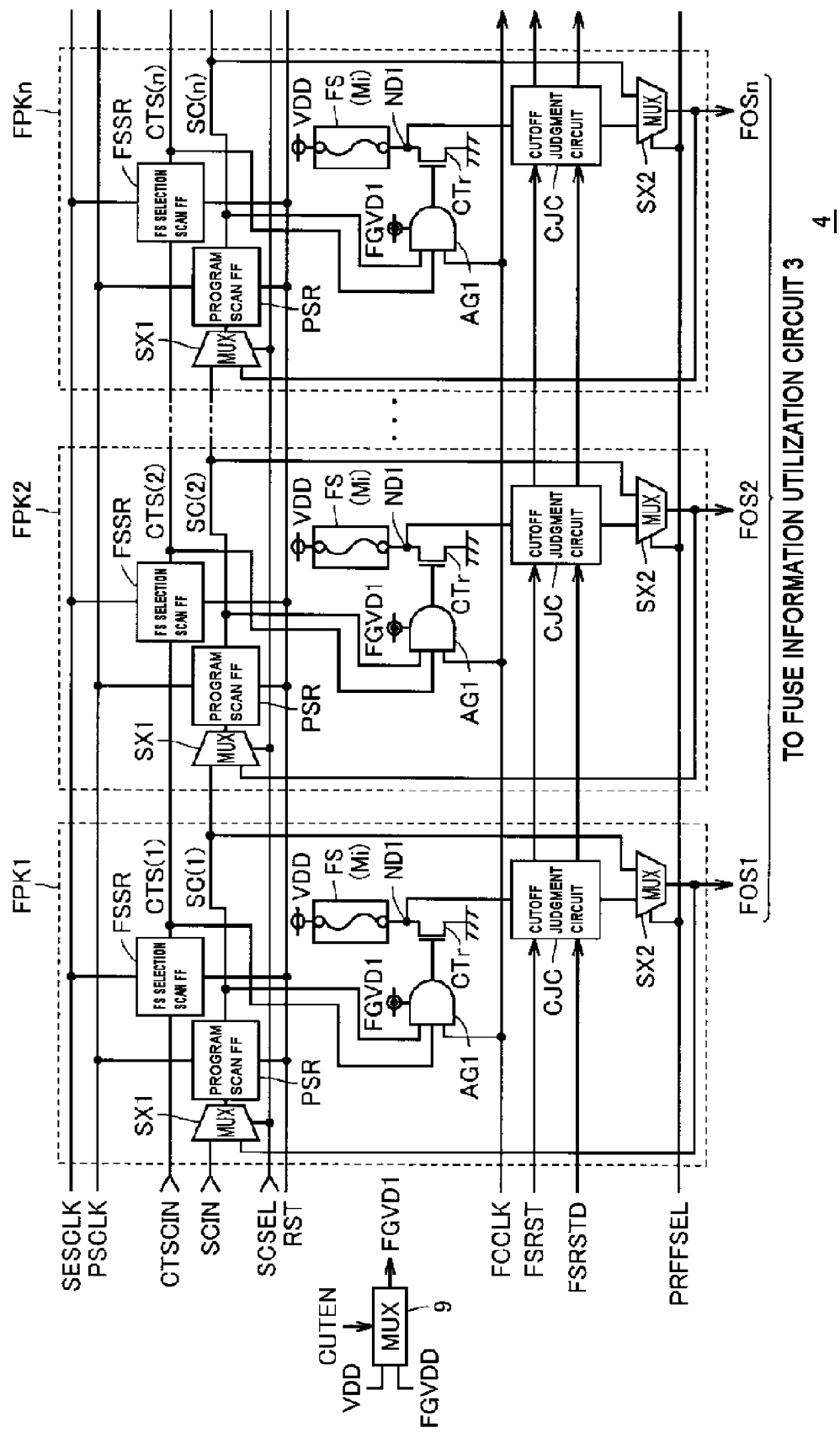
FIG. 2 is a diagram roughly showing a configuration of a wire fusing program circuit shown in FIG. 1.

FIG. 2 is a diagram showing an example of a specific configuration of the wire fusing program circuit 4. In FIG. 2, the wire fusing program circuit 4 includes a plurality of fuse program circuits FPK1 to FPKn each having a fuse circuit and cascade-coupled with one another. The number of the fuse program circuits FPK1 to FPKn is arbitrary. The fuse program circuits FPK1 to FPKn have the same configuration, and therefore, in FIG. 2, the same reference numerals are attached to the same or corresponding components in each of the fuse program circuits FPK1 to FPKn. The fuse program circuits FPK1 to FPKn are configured by the above-mentioned low withstand voltage transistors.

Each of the fuse program circuits FPK1 to FPKn includes the fuse element FS coupled between a node (fuse power source node) that supplies the power source voltage VDD and an internal node ND1, a fusing current supply transistor CTr coupled between the internal node ND1 and the ground node, and a three-input AND circuit AG1 that controls the conduction of the fusing current supply transistor CTr. The AND circuit AG1 receives an internal fuse gate power source voltage FGVD1 as an operating power source voltage.

The fuse gate power source voltage FGVD1 is given by a voltage selection circuit 9 that selects one of the power source voltage VDD and the external fuse gate power source voltage FGVDD according to a cutoff enable signal CUTEN. The cutoff enable signal CUTEN is activated when melting the fuse element FS.

In each of the fuse program circuits FPK2 to FPKn, a program scan flip-flop (FF) PSR and an FS selection flip-flop (FF) FSSR are also provided and these flip-flops PSR and FSSR transfer and set program information that specifies the melt/non-melt state of the fuse element FS.

The AND circuit AG1 receives an output signal of the corresponding FS selection scan flip-flop FSSR, an output signal of the corresponding program scan flip-flop PSR, and a fuse cut clock signal FCCLK.

The FS selection scan flip-flop FSSR takes in the output data of the FS selection scan flip-flop FSSR in the fuse program circuit in the previous stage according to a fuse selection scan clock signal SESCLK and transfers the data to the next stage. The program scan flip-flop PSR takes in data given via a multiplexer (MUX) SX1 arranged in the input section according to a program scan clock signal PSCLK and transfers the data to the next stage. Consequently, the FS selection scan flip-flop FSSR configures a scan path that performs a shift operation according to the fuse selection scan clock signal SESCLK and transfers data and the program scan flip-flop PSR also configures a scan path that sequentially performs the shift operation according to the program scan clock signal PSCLK and transfers data.

By providing a set of the flip-flops FSSR and PSR corresponding to each fuse circuit (including the fuse element FS and the fusing current supply transistor CTr), it is possible to perform the programming (melt/non-melt processing) of the fuse element FS of the fuse circuit both selectively and sequentially in units of single fuse element. It is also possible to transfer the program information of the fuse element to each fuse element by using a small number of pads.

Further, each of the fuse program circuits FPK2 to FPKn includes a cutoff judgment circuit CJC that judges the cutoff state of the fuse element FS according to the voltage level of the node ND1 and a multiplexer SX2 that selects and outputs one of the output signal of the program scan flip-flop PSR and the output signal of the cutoff judgment circuit CJC. The output signal of the multiplexer SX2 is given to the multiplexer SX1 provided in the same fuse program circuit corresponding thereto. The multiplexer SX1 selects one of the output signal of the program scan flip-flop PSR in the previous stage and the output signal of the corresponding multiplexer SX2 according to a scan selection signal SCSEL. Here, "cutoff" means "melt".

By using the two multiplexers SX1 and SX2 in one fuse program circuit and switching the data transfer paths, the following effects can be obtained. The multiplexer SX1 selects the output signal of the multiplexer SX2 and transmits the signal to the program scan flip-flop PSR. The multiplexer SX2 selects the output signal of the cutoff judgment circuit CJC according to a program flip-flop selection signal PRFFSEL at the time of test operation. Due to this coupling aspect, the output signal of the cutoff judgment circuit CJC is transferred sequentially via the program scan flip-flop PSR and the state of the corresponding fuse element FS can be read to outside as the serial output SOUT. Consequently, it is possible to judge the presence/absence of a cutoff defect of the fuse element FS from outside.

The multiplexer SX2 selects the output signal of the program scan flip-flop PSR and the multiplexer SX1 selects the output signal of the multiplexer SX2 according to the scan selection signal SCSEL. In this coupling aspect, it is possible to transfer the data held by the program scan flip-flop PSR in a loop by feeding back the data in each of the fuse program circuits FPK1 to FPKn. Consequently, it is possible to set the program scan clock signal PSCLK to a self-running state (data held by the flip-flop PSR of each of the fuse program circuits FPK1 to FPKn is maintained), and therefore, the degree of freedom in the control and design of the clock signal is increased (the control in relation to timing is simplified and the degree of timing-related freedom is increased).

Further, the multiplexer SX2 outputs program information FOS1 to FOSn in accordance with the melt/non-melt state of the fuse element FS. The multiplexer SX1 selects the output signal of the multiplexer SX2 and stores the signal in the corresponding program scan flip-flop PSR. Subsequently, the multiplexer SX1 is set to the state of selecting the output signal of the flip-flop PSR in the previous stage and the stored data is sequentially transferred via the string of the program scan flip-flops PSR. This transferred data is compared with written information by an external tester or a BIST (built-in self test circuit). Consequently, it is possible to test whether the multiplexer SX2 performs the switching operation normally in accordance with the program flip-flop selection signal PRFFSEL.

The fuse program circuit FPK1 in the first stage has the same configuration as that of the fuse program circuits FPK2 to FPKn in the second and subsequent stages except for points mentioned below. That is, to the FS scan flip-flop FSSR and the program scan flip-flop PSR, cutoff control information CTSCIN and fuse program scan input SCIN from the BIST (built-in self test circuit) formed in the external tester or over the same chip are given, respectively, instead of the output signal of the fuse program circuit in the previous stage.

The output signals FOS1 to FOSn of the fuse program circuits FPK1 to FPKn are given to a circuit that sets a corresponding internal state of the fuse information utilization circuit 3.

As described above, the fuse information utilization circuit 3 may be either a redundant decoder to perform redundant cell replacement in the memory circuit or a circuit that determines a constant of an analog circuit, that is, that performs trimming of a resistance value of a resistor element of an analog circuit or adjustment of an amount of drive current of a transistor element (or adjustment of the reference voltage level). Consequently the fuse information utilization circuit 3 is required only that the operation aspect or operation state be set according to the program information of the fuse program circuits FPK1 to FPKn and the information stored in the wire fusing program circuit only needs to be information on the internal state of the internal circuit (core circuit) 2.

In accordance with the stored data of the FF selection scan flip-flop FSSR, in each fuse program circuit, a cutoff cycle of the corresponding fuse element FS is specified. In the fuse program circuits FPK1 to FPKn, a fusing current is supplied selectively according to the data stored in the program scan flip-flop PSR and the fuse cut clock signal FCCLK sequentially and the fuse element FS is melted selectively according to written information.

To the fuse element FS, the power source voltage VDD from the power source node for the internal circuit (core circuit) is supplied in the first embodiment. In the case of this configuration, it is possible to reduce the number of pads dedicated for fuse melting provided for the fuse program circuits FPK1 to FPKn.

As the transistors of the fuse program circuits FPK1 to FPKn and the control circuit not shown in FIG. 2, those having the same structure (the film thickness and the material of the gate insulating film are the same) as the transistor used in the internal circuit (core circuit) 2 shown in FIG. 1 are used. Due to this, an increase in the area occupied by the wire fusing program circuit 4 and an increase in the number of manufacturing steps are suppressed.

Normally, the current (fusing current) required for melting the fuse element FS is 20 mA to 40 mA, comparatively large. However, as will be described later, in the fuse program circuits FPK1-FPKn, the program (melt) of the fuse element is executed sequentially and selectively according to the stored information of the FS selection scan flip-flop FSSR, and therefore, the current consumption is small and it is possible to share the power source with that of the internal circuit (core circuit) and reduce the number of pads.

To the AND circuit AG1, the fuse gate power source voltage FGVD1 is given as an operating power source voltage. When a fuse is melted, as the fuse gate power source voltage FGVD1, the fuse gate power source voltage FGVDD from outside is selected. In this case, it is only required to simply drive the gate of the fusing current supply transistor CTr and the current consumption in the AND circuit AG1, including the alternating current (AC current), is small. Consequently, even when a number of the fuse elements FS are provided, it is only required to provide one pad to supply the fuse gate power source voltage FGVDD (pad P2 in FIG. 1) and it is possible to reduce the layout area of the wire fusing program circuit 4.

Further, the multiplexer SX2 is used to select and output one of the stored data of the program scan flip-flop PSR and the output signal of the cutoff judgment circuit CJC. Consequently, it is possible to set and test the state of the object circuit (fuse information utilization circuit 3), such as the redundant decoder, according to program information before cutting the fuse element FS. For example, in the memory circuit etc., when the object circuit of the fuse information utilization circuit is the redundant decoder, it is possible to test the redundant decoder and the redundant cell for normality by sequentially applying a redundant address from outside to select the redundant cell row/column. Due to this, it is possible to distinguish a cutoff defect of the fuse element from a defect in the redundant cell system when a defect occurs.

As the configuration of the scan flip-flops PSR and FSSR included in each of the fuse program circuits FPK1-FPKn shown in FIG. 2, it is only required to use a two-stage latch circuit in which the hold state and the through state repeat according to a two-phase clock signal and an arbitrary configuration can be utilized.

Figure 3:
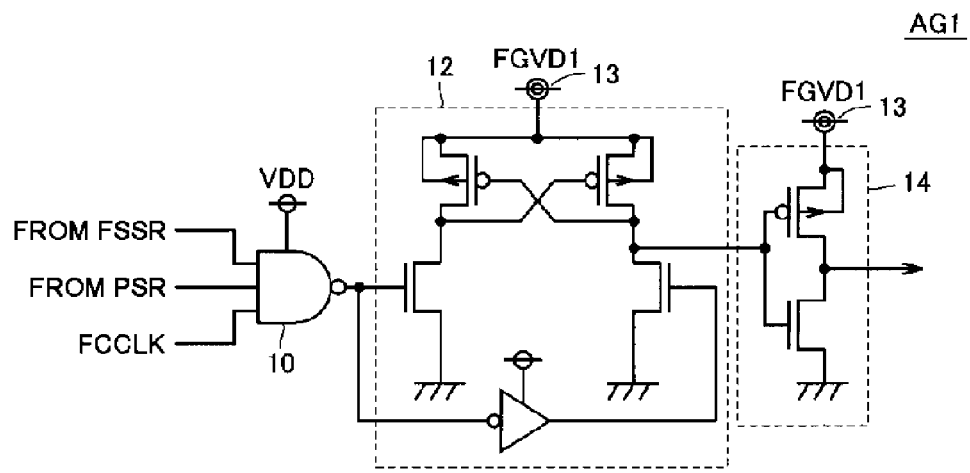
FIG. 3 is a diagram showing an example of a configuration of an AND circuit shown in FIG. 1.

FIG. 3 is a diagram showing an example of the configuration of the AND circuit AG1 shown in FIG. 2. In FIG. 3, the AND circuit AG1 includes a three-input NAND gate 10 that receives the power source voltage VDD of the internal circuit (core circuit) 2 as an operating power source voltage, a level converter 12 that converts the amplitude of the output signal of the three-input NAND gate 10 into the internal fuse gate power source voltage FGVD1 level, and an inverter 14 that inverts the output signal of the level converter 12. The output signal of the inverter 14 is given to the gate of the fusing current supply transistor CTr shown in FIG. 2 and the gate voltage of the fusing current supply transistor CTr is controlled according to the output signal of the inverter 14.

In the AND circuit AG1, to the NAND gate 10, the output signals of the program scan flip-flop PSR and the FS selection scan flip-flop FSSR and the fuse cut clock signal FCCLK are given. The amplitude of these signals is the level of the power source voltage VDD of the internal circuit (core circuit). The NAND gate 10 generates a signal having the power source voltage amplitude according to the signals given and outputs a signal at L level when all the input signals are at H level.

The level converter 12 and the inverter 14 receive the internal fuse gate power source voltage FGVD1 as an operating power source voltage at a power source node 13 and convert the amplitude of the output signal of the NAND gate 10 into the internal fuse gate power source voltage FGVD1 level.

The level converter 12 includes a pair of P-channel MOS transistors coupled in an intersecting manner and a pair of N-channel MOS transistors coupled between the pair of P-channel MOS transistors and the ground node, respectively, and which receive the output signal of the NAND gate 10 and its inverted signal. When the output signal of the NAND gate 10 is at H level, in the level converter 12, the output signal to the inverter 14 changes to H level and in response to this, a signal at L level is output from the inverter 14. On the other hand, when the output signal of the NAND gate 10 is at L level, in the level converter 12, the output signal to the inverter 14 changes to L level and the output signal of the inverter 14 changes to the fuse gate power source voltage FGVD1 level.

The inverter 14 inverts the output signal of the level converter 12 and outputs a signal having a logic value opposite to that of the output signal of the NAND gate 10. Consequently, when all the data from the flip-flops FSSR and PSR and the fuse cut clock signal FCCLK are at H level, the output signal of the inverter 14 changes to H level, the fusing current supply transistor CTr enters the ON state, and the corresponding fuse element is melted.

The fuse gate power source nodes 13 of the level converter 12 and the inverter 14 are coupled to the fuse gate power source pad P2 shown in FIG. 1 via the fuse gate power source selection circuit (MUX) 9. When a fuse is melted, the fuse gate power source voltage FGVDD from outside is selected and transmitted to the internal fuse gate power source line. Consequently, it is possible to adjust the gate voltage of the fusing current supply transistor CTr shown in FIG. 2 by adjusting the voltage level of the voltage FGVDD from the fuse gate power source pad P2. Accordingly, it is possible to adjust the fusing current of the fuse element FS and to optimize the fusing current at the time of program of the fuse element FS.

When the signal from the fuse selection scan flip-flop FSSR changes to H level, it is demonstrated that the corresponding fuse program circuit is selected. According to H level/L level of the signal from the program scan flip-flop PSR, the melt/non-melt state of the corresponding fuse element is set. That is, when the signal from the program scan flip-flop PSR is at H level, it is specified to melt the corresponding fuse element.

The fuse cut clock signal FCCLK is given a predetermined pulse width. Consequently, it is possible to realize the current pulse width and the number of times of current pulse application necessary to melt a fuse element by adjusting the pulse width and the number of times of application of the fuse cut clock signal FCCLK.

When the power source voltage VDD is applied, the fuse gate power source voltage FGVDD is selected as the internal fuse gate power source voltage FGVD1. When the internal circuit power source voltage VDD becomes stable, a reset signal RST is generated in the form of a one-shot pulse according to, for example, a power-on reset signal. When the reset signal RST is activated, the internal nodes of the program scan flip-flop PSR and the FS selection scan flip-flop FSSR of the fuse program circuits FPK1 to FPKn are set to L level. Output signals CTS(1) to CTS(n) and SC(1) to SC(n) are all fixed to L level. In response to this, the output signal from the AND circuit AG1 is initially set to L level. In this state, the fusing current supply transistor CTr is set to the non-conduction state securely and it is possible to prevent a through current from flowing via the fuse element FS in the non-melted state when power source is turned on.

When the internal circuit power source voltage VDD is applied, the fuse gate power source voltage FGVDD is maintained at a voltage level lower than a threshold voltage Vth of the fusing current supply transistor CTr. This is done to obtain the following effects. That is, when power source is turned on, if the fuse gate power source voltage FGVDD reaches a voltage level higher than the threshold voltage Vth of the fusing current supply transistor CTr, the output signal of the AND circuit AG1 changes to H level in an unstable state and there is a possibility that the fusing current supply transistor CTr is turned on. In the fuse element in the non-melted state, the gate voltage of the fusing current supply transistor CTr is set to a voltage level lower than the threshold voltage Vth and thus a large through current is prevented from flowing via the fuse element in the uncut state and the fusing current supply transistor.

Further, there is a case where the voltage level of the internal node reaches an intermediate voltage level according to the output signal of the unstable NAND gate 10 in the level converter 12. In this case, by maintaining the fuse gate power source voltage FGVDD at a voltage level lower than the threshold voltage Vth of the fusing current supply transistor CTr, it is possible to maintain the output signal of the inverter 14 at a voltage level lower than the threshold voltage Vth of the fusing current supply transistor CTr. Due to this, it is possible to prevent the fusing current supply transistor CTr from being turned on.

Consequently, when power source is turned on, the fuse gate power source voltage FGVDD is set to a voltage level (for example, the ground voltage level) lower than the threshold voltage Vth of the fusing current supply transistor CTr until the reset signal RST is activated and thus a state is prevented from occurring where a high current flows from the power source node to the ground node.

The fuse gate power source voltage FGVDD and the internal circuit power source voltage VDD are given from outside the semiconductor device (semiconductor integrated circuit device) as shown in FIG. 1 described above. Consequently, after generating the reset signal RST using the power-on reset signal when the supply of the power source voltage VDD is started and initially setting the inside of the wire fusing program circuit 4, the external power source control section supplies the fuse gate power source voltage FGVDD (increases the voltage level). In this power source control, it is only required that the power source supply sequence be controlled by a sequence controller, such as a processor.

Figure 4:
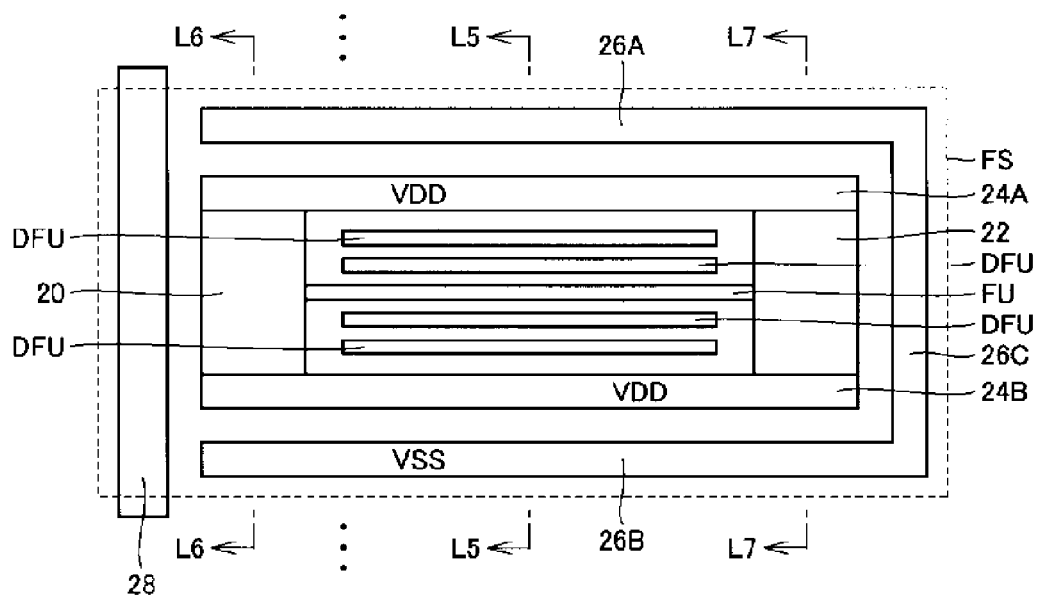
FIG. 4 is a diagram roughly showing a general planar layout of a fuse element shown in FIG. 2.

FIG. 4 is a diagram roughly showing a planar layout of the fuse element FS when viewed from above. In FIG. 4, the formation region of the fuse element FS includes a fuse FU and pad/bed wiring regions 20 and 22 arranged on both ends of the fuse FU. One of the pad/bed wiring regions 20 and 22 is coupled to the node ND1 and the other is coupled to a power source line through which the power source voltage VDD is supplied.

Two dummy fuses DFU are provided on one side of the fuse FU and two dummy fuses DFU are provided on the other side of the fuse FU. Here, the dummy fuse DFU is any of a fuse not used for circuit operation, a fuse in a floating state, and a fuse not given a fixed potential. Normally, the dummy fuse DFU does not relate to the circuit operation. Each wiring width of the fuse FU and the dummy fuse DFU is set to the minimum line width in the region where the fuse element FS is formed. Further, the fuse FU and the four dummy fuses DFU are arranged at equal intervals and the interval is set to the minimum interval in the fuse formation region. Consequently, the exposure condition of the fuse FU and the dummy fuse DFU is optimized by the OPC in the manufacturing process, and therefore, it is possible to form the fuse FU with the minimum line width.

On both sides of the fuse FU and the four dummy fuses DFU, first sub diffusion protective wall structures 24A and 24B for forming a first diffusion protective wall structure are arranged and outside the first diffusion protective wall structure, second sub diffusion protective wall structures 26A, 26B, and 26C for forming a second diffusion protective wall structure are formed extending continuously in the U-shape. The first sub diffusion protective wall structures 24A and 24B are coupled to the power source line through which the power source voltage VDD is supplied and the second sub diffusion protective wall structures 26A, 26B, and 26C are coupled to the ground line through which the ground voltage VSS is transmitted. These diffusion protective wall structures 24A, 24B and 26A to 26C shut off the path through which the copper (Cu) atoms generated when the fuse FU is melted is thermally diffused.

Outside the pad/bed wiring region 20, a global wiring region 28 is further disposed. The global wiring region 28 is provided commonly to a plurality of the fuse elements FS and realizes a diffusion protective wall structure to prevent the copper atoms from thermally diffusing to the outside of the fuse box in cooperation with a groove-shaped via. The fuse elements FS are arranged in one column in the direction orthogonal to the direction in which the fuse FU extends (in the vertical direction in FIG. 4).

Although not shown explicitly in FIG. 4, above the fuse FU (above the fuse trimming region), a copper diffusion protective wall is formed using a power source wire.

Figure 5:
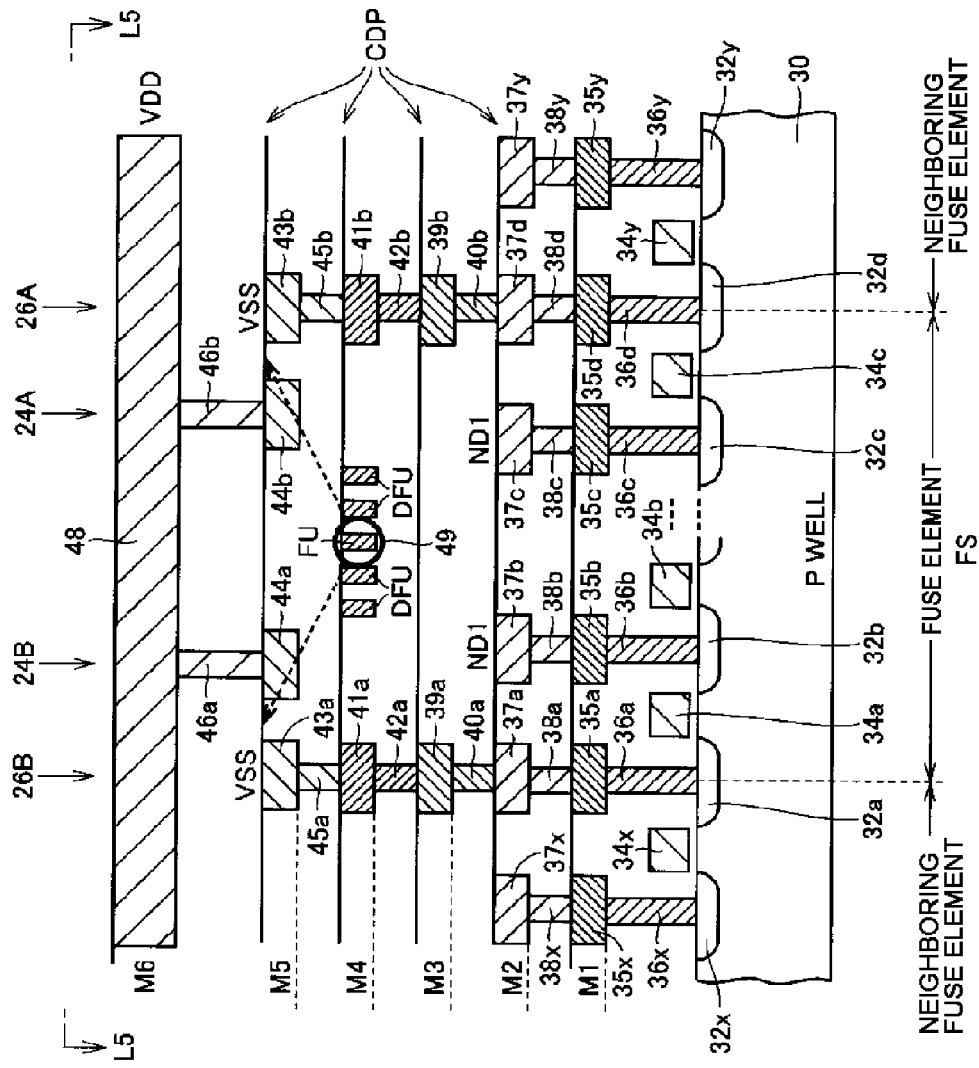
FIG. 5 is a diagram roughly showing a sectional structure along line L5-L5 shown in FIG. 4.

FIG. 5 is a diagram roughly showing a sectional structure along line L5-L5 shown in FIG. 4. In FIG. 5, the fuse element FS is formed over the surface of a P well (semiconductor substrate region) 30. On the surface of the P well 30, impurity regions 32x, 32a to 32d, and 32y are formed spaced from one another. The impurity regions 32a and 32d are shared between the fuse elements adjacent to each other, respectively. The impurity regions 32a to 32d form the source/drain impurity region of a unit transistor of the fusing current supply transistor for one fuse element and the impurity regions 32x and 32y of the neighboring fuse elements are also utilized to form the drain region of the corresponding fusing current supply transistors, respectively.

Over the surface of the substrate region between these impurity regions 32x, 32a to 32d, and 32y, gate electrode wires 34x, 34a to 34c, and 34y are arranged. These impurity regions and gate electrode wires realize the fusing current supply unit transistor.

In correspondence with the impurity regions 32x, 32a to 32d, and 32y, respectively, first metal wires 35x, 35a to 35d, and 35y are arranged in a first metal wiring layer M1. These wires are coupled to the corresponding impurity regions via contacts 36x, 36a to 36d, and 36y, respectively.

In a second metal wiring layer M2, second metal wires 37x, 37a to 37d, and 37y are arranged corresponding to and aligned with the first metal wires 35x, 35a to 35d, and 35y. These second metal wires 37x, 37a to 37d, and 37y are coupled to the first metal wires 35x, 35a to 35d, and 35y via first groove-shaped vias 38x, 38a to 38d, and 38y, respectively. The second metal wires 37b and 37c are coupled to the node ND1 and coupled to the drain impurity regions 32b and 32c of the fusing current supply transistor. In the neighboring fuse element, similarly, the second metal wires 37x and 37y configure the node ND1 to which the end part of the corresponding fuse is coupled and are coupled to the drain impurity regions 32x and 32y.

In a third metal wiring layer M3, third metal wires 39a and 39b are arranged corresponding to and aligned with the second metal wires 37a and 37d. Over these second metal wires 37b and 37c, the third metal wire is not disposed. The third metal wires 39a and 39b are coupled to the second metal wires 37a and 37d in the lower layer via second groove-shaped vias 40a and 40b, respectively.

In a fourth metal wiring layer M4, fourth metal wires 41a and 41b are arranged corresponding to and aligned with the third metal wires 39a and 39b. Between these fourth metal wires 41a and 41b, the fuse FU and the four dummy fuses DFU are arranged using the fourth metal wire (copper wire).

The fourth metal wires 41a and 41b are coupled to the third metal wires 39a and 39b in the lower layer via the third groove-shaped vias 42a and 42b, respectively.

In a fifth metal wiring layer M5, fifth metal wires 43a and 43b are arranged corresponding to and aligned with the fourth metal wires 41a and 41b, respectively, and inside these fifth metal wires 43a and 43b, fifth metal wires 44a and 44b are arranged. The fifth metal wires 43a and 43b are coupled to the fourth metal wires 41a and 41b via fourth groove-shaped vias 45a and 45b, respectively. The fifth metal wires 44a and 44b are coupled to a sixth metal wire formed in a sixth metal wiring layer M6 via fifth groove-shaped vias 46a and 46b, respectively.

The fifth metal wires 43a and 43b are coupled to the ground line and transmit the ground voltage VSS. The sixth metal wire 48 is coupled to the power source line and transmits the power source voltage VDD. The sixth metal wire 48 is arranged so as to cover a trimming region 49 of the fuse FU and forms an upper diffusion protective wall wire. The sixth metal wire 48 forms a global power source line and transmits the power source voltage VDD. The shape of the sixth metal wire 48 formed directly above the fuse FU may be a solid wire or a wire in the shape of a stripe.

The fifth metal wire 43a to the first metal wire 35a and the fifth metal wire 43b to the first metal wire 35d are arranged continuously in the longitudinal direction and configure the second diffusion protective wall structures 26B and 26A shown in FIG. 4, respectively. The fifth metal wires 44a and 44b and the fifth vias 46a and 46b form the first diffusion protective wall structures 24B and 24A shown in FIG. 4.

As shown in FIG. 5, the copper thermal diffusion paths shown by the broken arrows from the trimming region 49 of the fuse FU are shut off by the fifth metal wires 44a and 44b formed in the upper layer thereof. Consequently, it is possible to securely suppress the copper atoms of the copper chip of the fuse FU from propagating to the neighboring fuse due to thermal diffusion.

Further, at least the interlayer insulating film between the fourth metal wiring layer M4 and the fifth metal wiring layer M5 is formed by a porous material having a low dielectric constant and the fuse FU and the four dummy fuses DFU are formed in the insulating layer formed by a porous material having a low dielectric constant. Due to this, it is possible to reduce the thermal conductivity of the interlayer insulating film and to suppress heat of the fuse FU to be transmitted to the dummy fuse DFU. Consequently, it is possible to easily melt the fuse FU even if the dummy fuse DFU is provided.

Insulating films formed by a porous material having a low dielectric constant include a SiOC film. The SiOC film is formed by a silicon oxide material, in which $CH_3$ etc. is bonded to the remaining two bond pairs of Si in the molecule bond chain . . . —Si—O—Si—O—Si . . . . The SiOC film is formed by, for example, the plasma CVD process.

As another insulating film formed by a porous material having a low dielectric constant, there is an HSQ (hydrogen silsesquioxane) film. The HSQ film is formed by silicon oxide having a Si—H bond or a silsesquioxane containing hydrogen. The HSQ film is formed by the application process.

As still another insulating film formed by a porous material having a low dielectric constant, there is an MSQ (methyl silsesquioxane) film. The MSQ film is formed by silicon oxide having a Si—C bond or silsesquioxane containing carbon. The MSQ film is formed by the application process. Each of these SiOC film, the HSQ film, and the MSQ film has a cavity. The size of the cavity is about 1 to 5 nm.

In the boundary region of each wiring layer, a copper diffusion prevention film CDP is disposed between the interlayer insulating films so as to come into contact with the top surface of the metal wire and thus copper is suppressed from thermally diffusing via the interlayer insulating film. The copper diffusion prevention film CDP is formed by a material including at least one of SiCN, SiN, SiC, SiCO, and SiON. Further, the diffusion protective wall structures 26A and 26B are shared between the neighboring fuse elements, respectively, and thereby, the layout area of the fuse element can be reduced.

Figure 6:
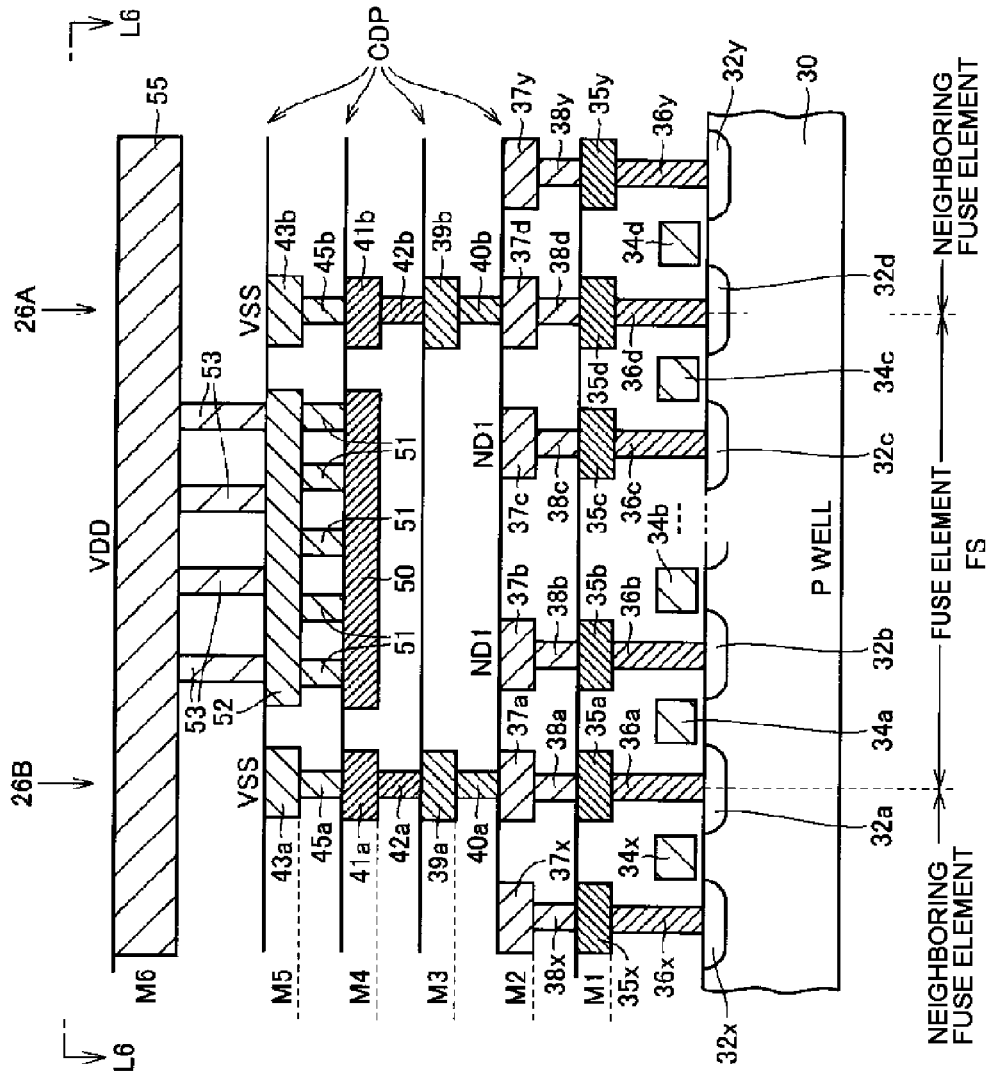
FIG. 6 is a diagram roughly showing a sectional structure along line L6-L6 shown in FIG. 4.

FIG. 6 is a diagram roughly showing a sectional structure along line L6-L6 shown in FIG. 4. In the sectional structure shown in FIG. 6, the same reference numerals are attached to components (metal wire, via, impurity region, etc.) corresponding to those in the sectional structure shown in FIG. 5 and their detailed explanation is omitted.

In the structure shown in FIG. 6, in the pad/bed wiring region 20 shown in FIG. 4, a fourth metal pad/bed wire 50 is disposed in the fourth metal wiring layer M4. The fourth metal pad/bed wire 50 is coupled to a pad/bed wire 52 formed in the fifth metal wiring layer M5 via a plurality of unit vias 51. The fifth metal pad/bed wire 52 is coupled to a metal wire 55 in the sixth metal wiring layer M6 formed in the upper layer thereof via a fifth unit via 53.

The sixth metal wire 55 forms a global power source line and transmits the power source voltage VDD. The sixth metal wire 48 (see FIG. 5) formed directly above the fuse FU needs only to have a structure that covers the trimming region 49 of the fuse FU, and therefore, in FIG. 6, reference numerals different from those of the sixth metal wire 55 and the sixth metal wire 48 are attached thereto, however, these are electrically coupled by the sixth metal wire, not shown schematically.

At the end part of the fuse element FS also, the fourth metal wire 41a, the pad/bed wire 50, and the fifth metal wire 41b are arranged in the fourth metal wiring layer M4, and thereby, the thermal diffusion path of the copper atoms to the outside of the fuse element is shut off (in the region shown in FIG. 6, the fuse FU is not provided, however, the pad/bed wire 50 is disposed in the same metal wiring layer M4 as that of the fuse FU).

Figure 7:
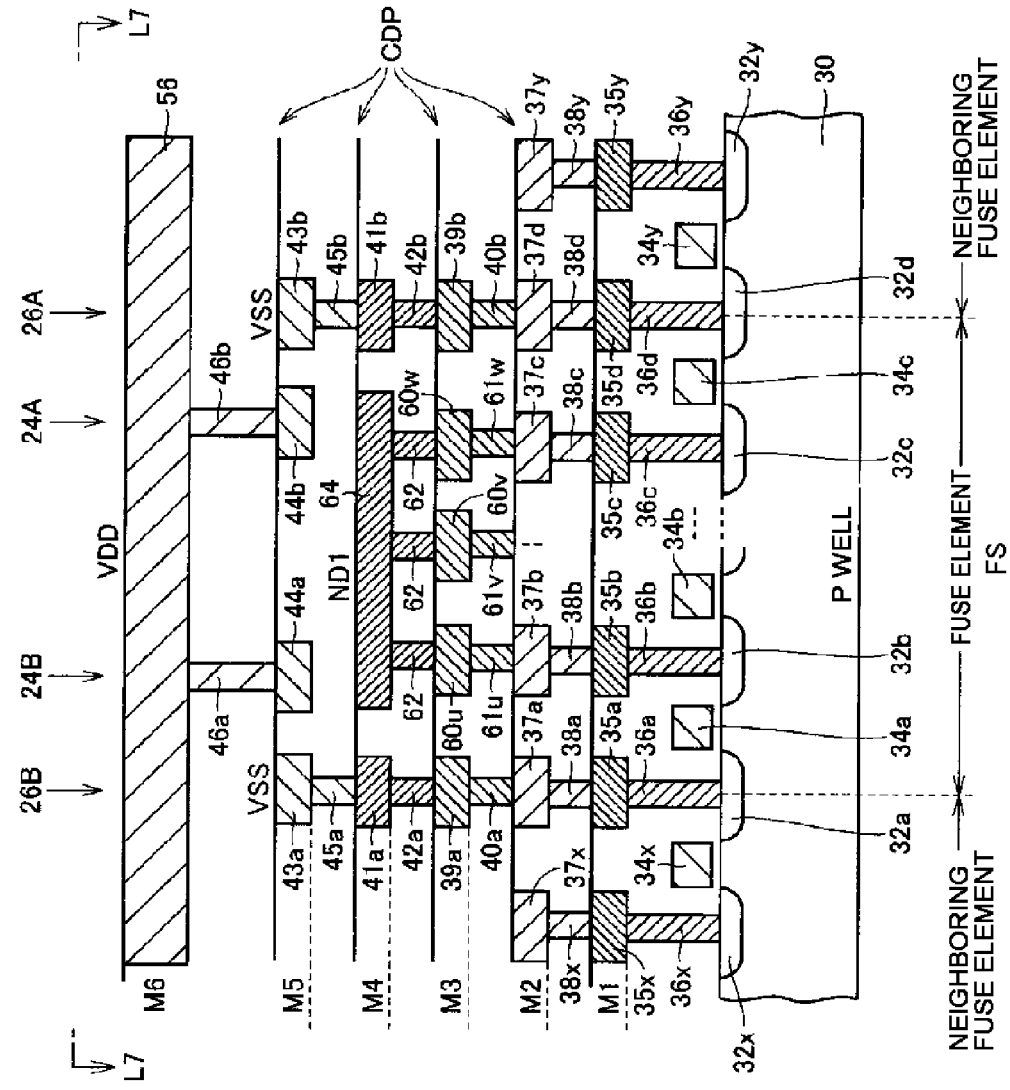
FIG. 7 is a diagram roughly showing a sectional structure along line L7-L7 shown in FIG. 4.

FIG. 7 is a diagram roughly showing a sectional structure along line L7-L7 shown in FIG. 4. The sectional structure shown in FIG. 7 differs from that of the fuse element shown in FIG. 5 in the following points. That is, no fuse is disposed in the pad/bed wiring region 22 shown in FIG. 4 but instead, a pad/bed wire 64 constituting the node ND1 is disposed in the fourth metal wiring layer M4. The pad/bed wire 64 is coupled to fourth metal intermediate wires 60u to 60w arranged in the third metal wiring layer M3 via a unit via 62, respectively. These fourth metal intermediate wires 60u to 60w are arranged corresponding to the second metal wires 37b and 37c arranged in the second metal wiring layer M2, respectively, and coupled to the corresponding second metal wire via unit vias 61u to 61w, respectively. In the formation region of the fuse element FS, the fusing current supply transistor is formed by a plurality of unit transistors and a third metal intermediate wire 60 (60u to 60w) is arranged corresponding to the drain electrode of each unit transistor. In FIG. 7, in order to show that a number of unit transistors are formed, the fourth metal intermediate wires 60 are shown to be arranged more in the number than the second metal wires 37b and 37c in the second metal wiring layer M2.

Other structures of the sectional structure of the fuse element shown in FIG. 7 are the same as the sectional structure of the fuse element shown in FIG. 5, and therefore, the same reference numerals are attached to the corresponding parts and their detailed explanation is omitted.

In the structure of the fuse element FS shown in FIG. 7 also, the pad/bed wire 64 is formed in the same wiring layer as the fourth metal wiring layer M4 in which the fuse FU is formed and the fifth metal wires 43a, 43b, 44a, and 44b are arranged thereabove and at the fuse termination section also, the diffusion protective wall structures without gaps are formed by the groove-shaped vias 45a, 45b, 46a, and 46b and it is possible to shut off the thermal diffusion path of copper to the outside of the fuse box.

As shown in FIG. 5 to FIG. 7, the neighboring fuse elements share the first diffusion protective wall structure and the second protective wall is formed therein in the fifth metal wiring layer, and therefore, it is possible to reduce the area occupied by the fuse element as well as securely shutting off the path through which coppers are thermally diffused to the neighboring fuse element.

Figure 8:
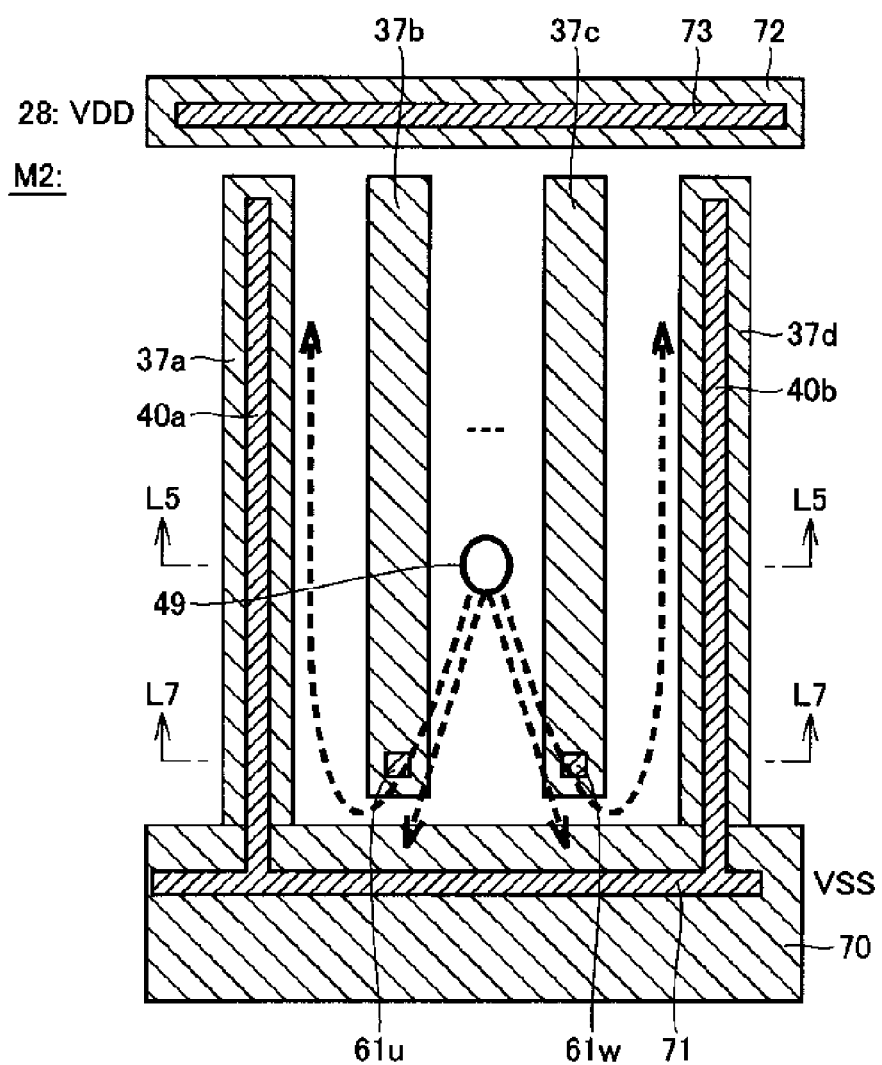
FIG. 8 is a diagram roughly showing a planar layout of a second metal wiring layer and a second via of a fuse element shown in FIG. 4.

FIG. 8 is a diagram roughly showing a wiring layout of the second metal wiring layer M2 of the fuse element FS shown in FIG. 4 to FIG. 7. When the wiring layout in FIG. 8 is cut along line L5-L5, the arrangement of the second metal wiring layer M2 in the sectional structure shown in FIG. 5 is obtained and when cut along line L7-L7, the sectional structure of the lower part of the second metal wiring layer shown in FIG. 7 is obtained.

In FIG. 8, the second metal wires 37a and 37d are arranged in the fuse element formation region extending continuously in the longitudinal direction. Over the second metal wires 37a and 37d, the second groove-shaped vias 40a and 40b are formed extending continuously in the longitudinal direction. For the second metal wires 37a and 37d, a second metal wire 70 extending continuously in the transverse direction is formed and on the surface of the second metal wire 70, a second groove-shaped via 71 extending in the transverse direction is formed. The second groove-shaped vias 40a and 40b are coupled to the second groove-shaped via 71 and the second metal wires 37a and 37d are coupled to the second metal wire 70.

The second metal wires 37b and 37c are formed extending in the longitudinal direction and in the end part thereof, the vias 61u and 61w are formed. In the global wiring region 28 outside the second metal wire arrangement region, a second metal wire 72 extending continuously in the transverse direction is formed and over the surface of the second metal wire 72, a second groove-shaped via 73 is formed. The wire 72 and the via 73 transmit the power source voltage VDD.

In FIG. 8, the wire to which the ground voltage VSS is applied is formed into the shape of a comb tooth. The wire (for example, 37a and 37d) to which the ground voltage VSS is applied and the wire group (for example 37b and 37c) constituting the node ND1 are arranged alternately. The wire (for example, 37a and 37d) to which the ground voltage VSS is applied is coupled to the source impurity region (for example, 32a, 32d) of the unit transistor of the fusing current supply transistor shown in FIG. 5. The wire (for example, 37b, 37c) constituting the node ND1 is coupled to the drain impurity region (for example, 32b, 32c) of the unit transistor of the fusing current supply transistor shown in FIG. 5.

As shown in FIG. 8, in the second metal wiring layer M2, all the thermal propagation paths of copper from the trimming region 49, as shown by the broken arrows, are shut off and particularly, the thermal diffusion path of copper to the outside of the fuse box is shut off securely. The thermal diffusion paths of copper are present along the second groove-shaped vias 40a and 40b in the second metal wiring layer, as shown by the broken arrows, however, the length of the path is sufficiently longer than the thermal diffusion range of copper, and therefore, the thermal diffusion of copper to the neighboring fuse element is suppressed securely.

Figure 9:
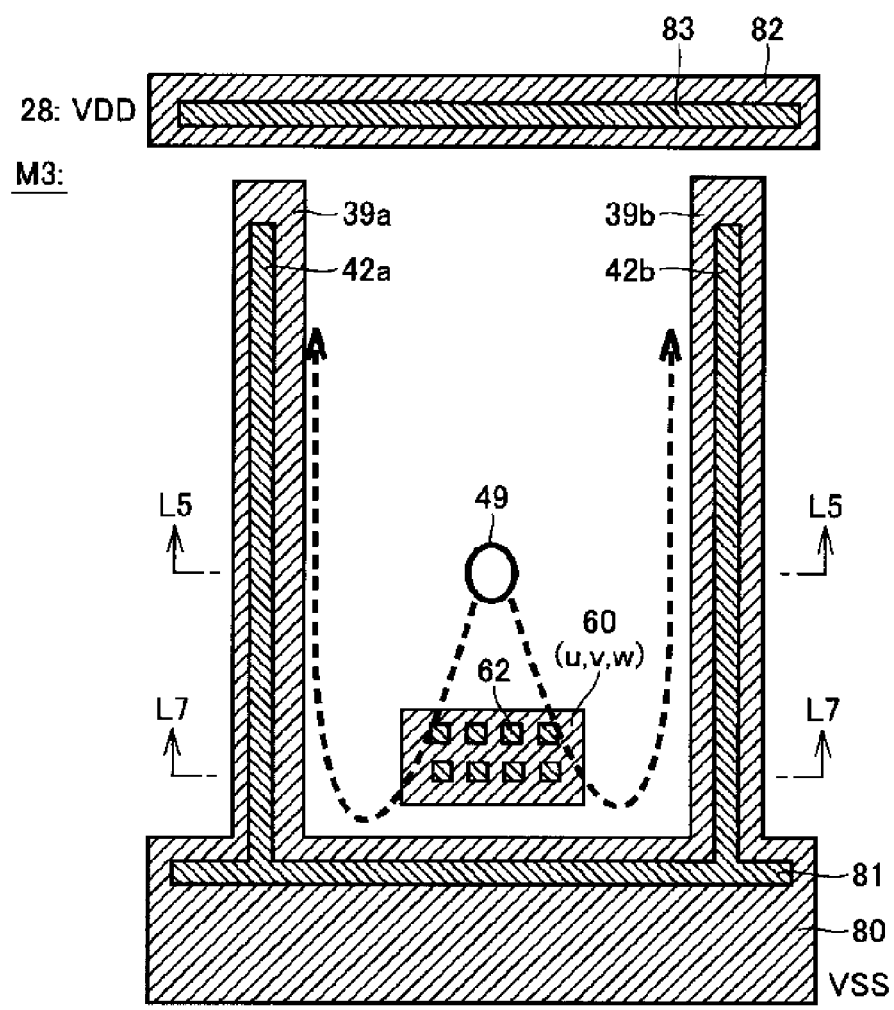
FIG. 9 is a diagram roughly showing a planar layout of a third metal wiring layer, which is the upper layer of the planar layout shown in FIG. 8, and a third via.

FIG. 9 is a diagram roughly showing a wiring layout of the third metal wiring layer M3 of the fuse element shown in FIG. 4 to FIG. 7. In FIG. 9 also, cut lines L5-L5 and L7-L7 of the sectional structures shown in FIG. 5 and FIG. 7 are shown together.

In FIG. 9, the third metal wires 39a and 39b are formed extending in the longitudinal direction and over the surface of the third metal wires 39a and 39b, the third groove-shaped vias 42a and 42b are formed extending continuously in the longitudinal direction. Between the third metal wires 39a and 39b, the third rectangular metal intermediate wire 60 is disposed. The third metal intermediate wire 60 corresponds to the third metal intermediate wires 60u, 60v, and 60w shown in FIG. 7 and is provided with the third via 62, respectively. The third metal intermediate wire 60 is coupled to the second metal wires 37b and 37c shown in FIG. 8 via the vias 61u and 61w, respectively. The third metal intermediate wire may be arranged separated corresponding to the second metal wires in the lower layer, respectively (the wires 60u, 60v, and 60w may be arranged separately). Here, for the sake of simplification of the drawing, the rectangular intermediate wire 60 is shown.

A third metal wire 80 is formed extending continuously in the transverse direction corresponding to the third metal wires 39a and 39b and on the surface of the third metal wire 80, a third groove-shaped via 81 is formed. The third metal wires 39a and 39b are coupled to the third metal wire 80 and the third vias 42a and 42b are coupled to the third via 81. The third metal wire 80 is coupled to the ground line and transmits the ground voltage VSS.

In the region 28, a third metal wire 82 is formed extending continuously in the transverse direction and over the surface of the third metal wire 82, a third groove-shaped via 83 extending continuously in the transverse direction is disposed. The third metal wire 82 transmits the power source voltage VDD.

In FIG. 9, as shown by the broken arrows, in the third metal wiring layer M3 also, the third metal wires 39a, 39b, and 80 and the third vias 42a, 42b, and 81 securely shut off the thermal diffusion paths of copper (Cu) from the fuse trimming region 49 and the thermal diffusion of copper to the outside of the fuse box is suppressed securely.

Figure 10:
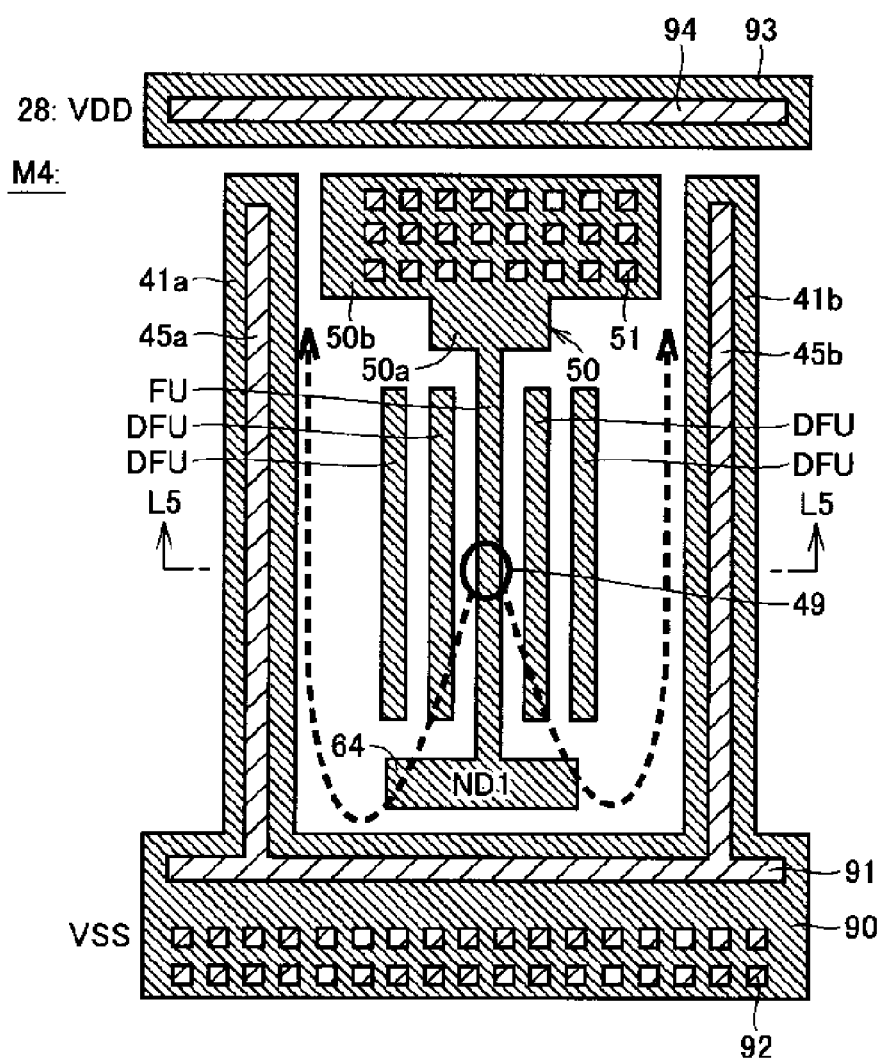
FIG. 10 is a diagram roughly showing a planar layout of a fourth metal wiring layer, which is the upper layer of the wiring layout shown in FIG. 9, and a fourth via.

FIG. 10 is a diagram roughly showing a wiring layout of the fourth metal wiring layer M4 of the fuse element FS shown in FIG. 4 to FIG. 7. In FIG. 10, cut line L5-L5 for the sectional structure shown in FIG. 5 is shown together.

In FIG. 10, the fourth metal wires 41a and 41b are arranged extending in the longitudinal direction and over the surface of the fourth metal wires 41a and 41b, the fourth groove-shaped vias 45a and 45b are arranged, respectively. The fuse FU and the four dummy fuses DFU are formed using the copper wire in the forth metal wiring layer M4. The two dummy fuses DFU are arranged adjacent to the center part on one side of the fuse FU and the two dummy fuses DFU are arranged adjacent to the center part on the other side of the fuse FU. Each wiring width of the fuse FU and the dummy fuse DFU is set to the minimum line width in the fuse formation region. Further, the fuse FU and the four dummy fuses DFU are arranged in parallel at equal intervals and the interval is set to the minimum interval in the fuse formation region. Consequently, by the OPC in the manufacturing process, the exposure condition of the fuse FU and the dummy fuse DFU is optimized, and therefore, it is possible to form the fuse FU with the minimum line width.

At both end parts of the fuse FU, the pad/bed wire 50 and the bed wire 64 are arranged, respectively. The pad/bed wire 50 includes a pad wire 50a and a bed wire 50b both coupled to each other. The pad wire 50a is coupled to one end of the fuse FU and a plurality of the unit vias 51 is arranged in alignment on the surface of the bed wire 50b. The bed wire 64 is coupled to the third metal intermediate wire 60 via the via 62 and forms the node ND1.

In the external region of the bed wire 64, a fourth metal wire 90 is disposed extending continuously in the transverse direction and over the surface of the fourth metal wire 90, a fourth groove-shaped via 91 is disposed. The fourth metal wire 90 is coupled to the fourth metal wires 41a and 41b and the fourth groove-shaped via 91 is coupled to the fourth groove-shaped vias 45a and 45b. In the fourth metal wire 90, a plurality of fourth unit vias 92 is arranged in alignment for the coupling with the upper wire. The fourth metal wire 90 is coupled to the third metal wire 80 shown in FIG. 9 via the via 81.

In the global wiring region 28 outside the pad/bed wire 50, a fourth metal wire 93 is disposed extending in the transverse direction and over the fourth metal wire 93, the fourth groove-shaped via 94 is disposed. The fourth metal wire 93 is electrically coupled to the third metal wire 82 shown in FIG. 9 via the third via 83. The fourth metal wire 90 is coupled to the ground line and transmits the ground voltage VSS and the fourth metal wire 93 is coupled to the power source line and transmits the power source voltage VDD.

As shown in FIG. 10, in the fourth metal wiring layer M4 also, the thermal diffusion paths of copper from the fuse trimming region 49 shown by the broken arrows are shut off securely and the thermal diffusion of copper to the outside of the fuse box is suppressed. Further, the thermal diffusion paths of copper to the neighboring fuse elements are present, however, the length of the path is sufficiently longer than the thermal diffusion range of copper and the thermal diffusion of the copper atom to the neighboring fuse is suppressed securely.

Figure 11:
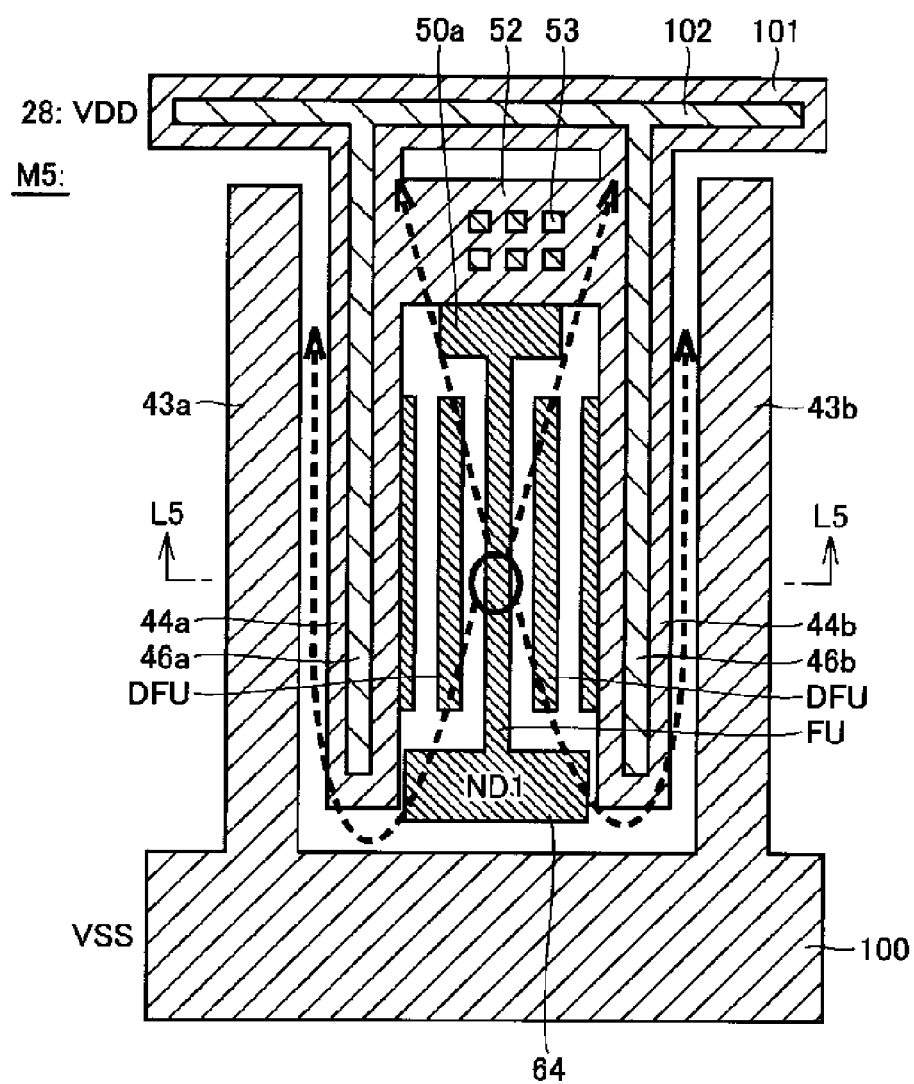
FIG. 11 is a diagram roughly showing a layout of a fifth metal wiring layer, which is the upper layer of that of the plan layout shown in FIG. 10, and a fifth via.

FIG. 11 is a diagram roughly showing a wiring layout of the fifth metal wiring layer M5 of the fuse element FS shown in FIG. 4 to FIG. 7. In FIG. 11, in the fuse element FS, the fifth metal wires 43*a* and 43*b* are arranged extending continuously in the transverse direction in the fuse element formation region. Inside the fifth metal wires 43*a* and 43*b*, the fifth metal wires 44*a* and 44*b* extending continuously in the fuse formation region are arranged. Over the surface of the fifth metal wires 44*a* and 44*b*, the fifth groove-shaped vias 46*a* and 46*b* are formed extending continuously in the longitudinal direction, respectively. On the surface of the fifth metal wires 43*a* and 43*b*, no via is formed.

The fifth metal bed wire 52 is disposed corresponding to the bed wire 50*b* shown in FIG. 10 and these fifth metal wires 44*a* and 44*b* are coupled mutually by the fifth metal bed wire 52. The fifth metal bed wire 52 is coupled to the pad/bed wire of the fuse FU in the lower layer. In FIG. 11, the pad wire 50*a* disposed for the fuse FU is shown. Further, the fourth metal pas wire 64 of the fuse FU is also shown together to show the arrangement of the fifth metal wiring layer for the fuse. On the surface of the fifth metal bed wire 52, a plurality of the fourth unit vias 53 is arranged in alignment for the electrical coupling with the upper layer wiring.

The fifth metal wires 43*a* and 43*b* are both coupled to a fifth metal wire 100 disposed extending continuously in the transverse direction. The fifth metal wire 100 forms a global ground line and transmits the ground voltage VSS commonly to the fuse elements in the fuse box. In the sixth metal wire 100 forming the global ground line, a power source line through which the power source voltage VDD is transmitted to the upper layer is disposed, and therefore, no groove-shaped via is formed. Similarly, for the fifth metal wires 43*a* and 43*b*, a power source wire is disposed in the upper layer thereof, and therefore, no via is disposed.

On the other hand, in the global wiring region 28 outside the bed wire 52, a sixth metal wire 101 extending continuously in the transverse direction is formed and over the surface of the sixth metal wire 101, a fifth groove-shaped via 102 is formed. The fifth groove-shaped via 102 is coupled to the fifth groove-shaped vias 46*a* and 46*b* and the fifth metal wires 44*a* and 44*b* and the bed wire 52 are coupled to the fifth metal wire 101. The fifth metal wire 101 is coupled to the fourth metal wire 93 shown in FIG. 10 via the fourth groove-shaped via 94.

In the configuration shown in FIG. 11 also, in the fifth metal wiring layer M5, the fifth metal wire and the groove-shaped via securely shut off the thermal diffusion paths of copper from the trimming region 49 shown by the broken arrows and the thermal diffusion of the copper atoms to the neighboring fuse is suppressed securely and at the same time, the thermal diffusion of copper to the outside of the fuse box is also prevented.

Figure 12:
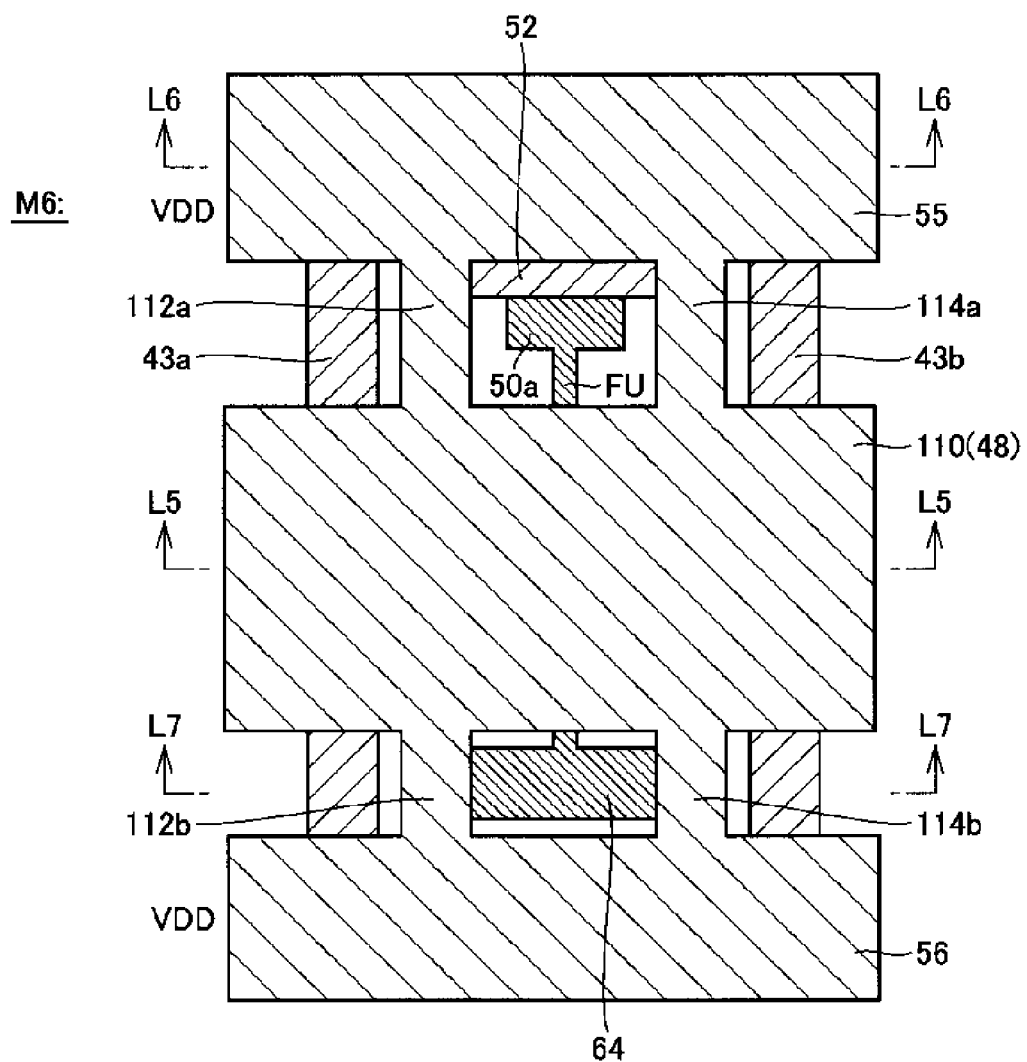
FIG. 12 is a diagram roughly showing a plan layout of a sixth metal wiring layer, which is the upper layer of the planar layout shown in FIG. 11.

FIG. 12 is a diagram roughly showing a wiring layout of the sixth metal wiring layer M6 of the fuse element shown in FIG. 4 to FIG. 7. In FIG. 12, the arrangement of the wiring part for the fuse FU in the lower layer and the fifth metal wires 43*a* and 43*b* is also shown together.

Lines L5-L5, L6-L6, and L7-L7 shown in FIG. 12 each show a cut line to obtain the sectional structure shown in FIG. 5 to FIG. 7. In FIG. 12, the sixth metal wire 55 is disposed above the bed wire 52 extending continuously in the transverse direction. The sixth metal wire 55 is provided commonly to a plurality of fuse elements and transmits the power source voltage VDD and is electrically coupled to the bed wire 52 in the lower layer via the via 53 shown in FIG. 11. Similarly, in the lower region of the fuse element also, the sixth metal wire 56 is disposed in the upper layer of the fifth metal wire 100 shown in FIG. 11 and transmits the power source voltage VDD commonly to the fuse elements.

Above the melting region (trimming region) 49 of the fuse FU in the center part, a metal wire 110 corresponding to the sixth metal wire 48 shown in FIG. 5 is disposed. The six metal wire 110 is a solid wire and coupled to the sixth metal wires 55 and 56, respectively, via sixth metal wires 112*a*, 112*b*, and 114*a* and 114*b*, respectively. The sixth metal wires 112*a* and 112*b* are coupled to the fifth metal wire 44*a* shown in FIG. 11 via the via 46*a* and the sixth metal wires 114*a* and 114*b* are coupled to the fifth metal wire 44*b* shown in FIG. 11 via the fifth via 46*b*.

As shown in FIG. 12, by arranging the sixth metal wire 110 that transmits the power source voltage VDD directly above the melting region (trimming region) of the fuse FU, it is possible to suppress the thermal diffusion of copper from the vicinity of the fuse melting part. Further, the wire that configures the node ND1 is not utilized as the diffusion preventive wire above the fuse, and therefore, it is possible to reduce the number of wiring layers required to prevent the thermal diffusion of copper.

Figure 13:
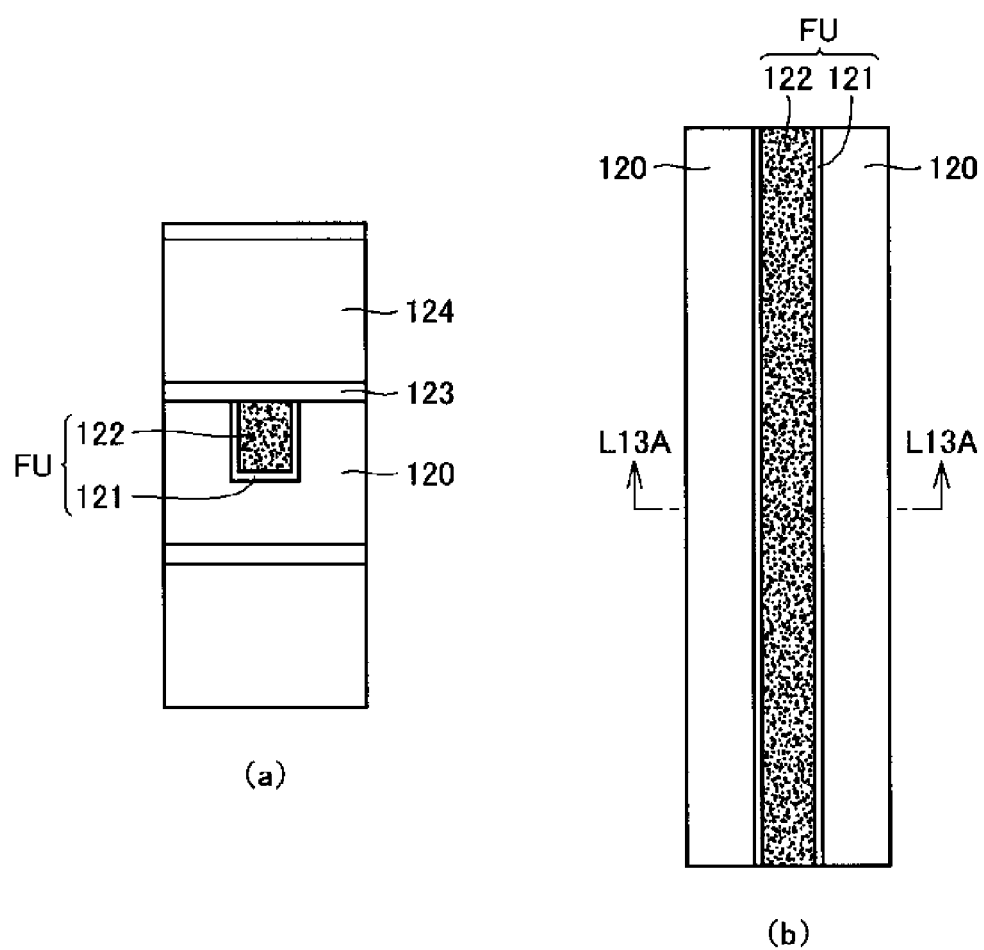
FIG. 13 is a diagram showing the configuration of the fuse shown in FIG. 5 in more detail.

Next, a method of melting the fuse FU is explained. FIG. 13(*a*) is a section view showing a configuration of the fuse FU and FIG. 13(*b*) is a plan view showing a configuration of the fuse FU. Line L13A-L13A shown in FIG. 13(*b*) shows a cut line to obtain the sectional structure shown in FIG. 13(*a*). In FIGS. 13(*a*) and 13(*b*), the fuse FU is formed in a groove formed on the surface of an insulating layer 120 and includes a barrier layer 121 formed so as to cover the bottom and the sidewall of the groove and a main wiring layer 122 made of copper filled in the region surrounded by the barrier layer 121. Over the insulating layer 120, a copper diffusion prevention film 123 to prevent diffusion of copper and an insulating layer 124 are laminated. The insulating layers 120 and 124 are formed by a porous material having a low dielectric constant.

Figure 14:
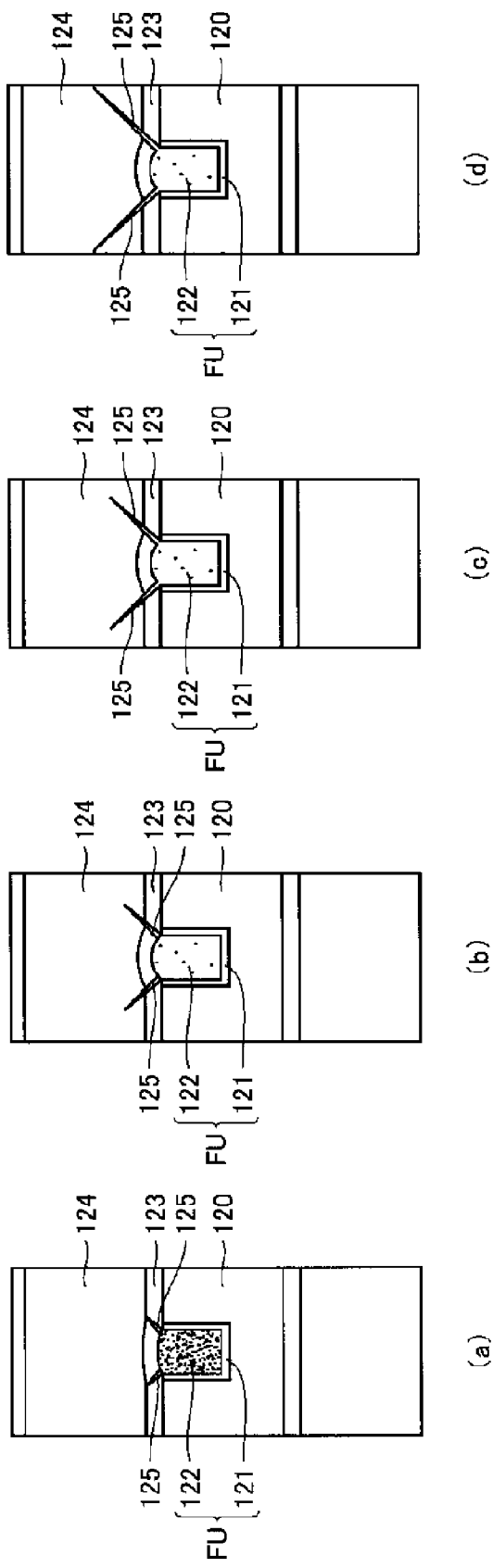
FIG. 14 is a section view showing a conventional method of melting the fuse shown in FIG. 13.
Figure 15:
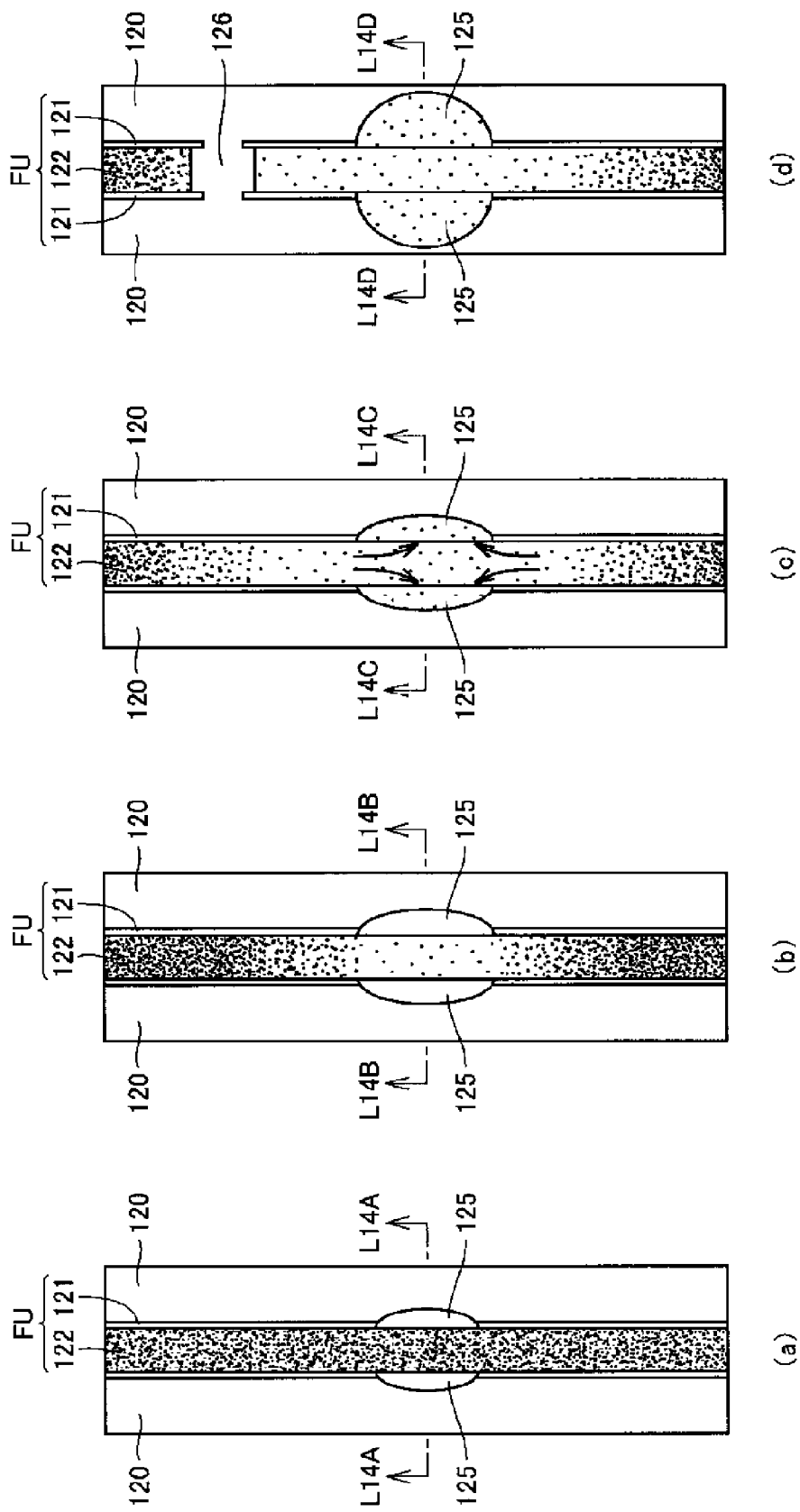
FIG. 15 is a plan view showing a conventional method of melting the fuse shown in FIG. 13.

FIGS. 14(*a*) to 14(*d*) and FIGS. 15(*a*) to 15(*d*) are diagrams showing a conventional method of melting the fuse FU by causing a high current to flow through the fuse FU, also showing states in chronological order from when an electric current is caused to flow through the fuse FU until the fuse FU is melted. Lines L14A-L14A, L14B-L14B, L14C-L14C, and L14D-L14D show cut lines to obtain the sectional structures shown in FIGS. 14(*a*) to 14(*d*). The density of dots in the figures shows the density of the copper atoms.

First, in FIG. 14(*a*) and FIG. 15(*a*), when an electric current is caused to flow through the fuse FU, the temperature reaches the maximum in the center part of the fuse FU and the center part of the fuse FU expands. Because of this, stress concentrates at edges on both sides of the top surface of the fuse FU and two cracks 125 occur. The crack 125 becomes larger in FIG. 14(b) and FIG. 15(b) and the liquefied copper is sucked up by the crack 125 by capillarity in FIG. 14(c) and FIG. 15(c). In FIG. 14(d) and FIG. 15(d), copper is sucked up by the crack 125 and the density of copper in the groove where the fuse FU is present is reduced, and a gap 126 occurs in the fuse FU and the cutting of the fuse FU is completed.

FIGS. 16(a) and 16(b) are SEM photos of the melted fuse FU. FIG. 16(a) is a center section view of the melted fuse FU, corresponding to FIG. 14(d). FIG. 16(b) shows the melted fuse FU when viewed from above, corresponding to FIG. 15(d). It can be seen from FIGS. 16(a) and 16(b) that the feather-like crack 125 occurs on both sides of the fuse FU and the gap 126 occurs in the vicinity thereof.

The inventors of the present invention name the feather-like metal part formed by the sucking up of copper by the crack 125 a butterfly wing. The conventional melting method has a possibility that the butterfly wing comes into contact with other wires (for example, the dummy fuse DFU). Consequently, it is necessary to melt the fuse FU without causing the crack 125 to occur.

Here, the mechanism of the occurrence of the crack 125 is considered. In the above-mentioned method, a high current is caused to flow through the fuse FU in order to melt the fuse FU. Due to such a high current, the temperature of the fuse FU rises rapidly by joule heating (about 500° C. per 100 ns).

However, the thermal conductivity of the insulating layers 120 and 124 around the fuse FU is low, and therefore, the temperature of the insulating layers 120 and 124 does not rise at the same rate as that of the fuse FU. Because of this, the temperature gradient between the fuse FU and the insulating layers 120 and 124 will be very steep. In the state of the same temperature, the ratio of the thermal expansion coefficient between the insulating layers 120 and 124 and the fuse FU is about 10:1. Hence, a very large thermal stress occurs at the edge of the top surface part of the fuse FU and it can be thought that the crack 125 occurs at the edge of the top surface part of the fuse FU.

Based on this assumption, we think it necessary to keep the thermal stress at the time of melting lower than the breakdown strength of the insulating layers 120 and 124 while the temperature of the fuse FU is not more than the melting point (700° C.) of copper in order to suppress the crack 125 from occurring. Consequently, we have examined the control of the fusing current and the utilization of the pinch effect in order to melt the fuse FU while suppressing the occurrence of the crack 125.

First, the control of fusing current is explained. In the above-mentioned conventional method, the fusing current supply transistor CTr causes a high current to flow through the fuse FU to melt it. In this case, as shown in FIG. 17(a), the saturated region of the I-V characteristic of the transistor CTr is used. When an electric current is caused to flow through the fuse FU, the temperature of the fuse FU rises and the resistance value of the fuse FU increases (R→2R→3R→4R). However, the saturated region of the I-V characteristic of the transistor CTr is used, and therefore, the current that flows through the fuse FU is constant as shown in FIG. 17(b). Consequently, the Joule heat ($IR^2$) produced in the fuse FU increases exponentially.

Hence, the temperature gradient between the fuse FU and the insulating layers 120 and 124 will be very steep. As a result, the thermal stress at the edge of the top surface of the fuse FU exceeds the breakdown strength of the insulating layers 120 and 124 and the crack 125 occurs at the edge of the top surface of the fuse FU. Hence, it is necessary to control the temperature gradient between the fuse FU and the insulating layers 120 and 124 while melting the fuse FU in order to prevent the occurrence of the crack 125.

In order to reduce the temperature gradient, as shown in FIG. 18(a), the region between the linear region and the saturated region of the I-V characteristic of the transistor CTr in which the electric current changes is used while melting the fuse FU. Specifically, the fuse gate power source voltage FGVDD applied to the gate of the transistor CTr is set to an appropriate value lower than the power source voltage VDD. When an electric current is caused to flow through the fuse FU, the temperature of the fuse FU rises and the resistance value of the fuse FU increases (R→2R→3R→4R). However, the linear region of the I-V characteristic of the transistor CTr is used, therefore, the electric current that flows through the fuse FU gradually decreases as shown in FIG. 18(b). Due to this, it is possible to suppress a rapid rise in temperature of the fuse FU caused by Joule heat and as a result, the temperature gradient can be reduced. By utilizing this phenomenon, it is possible to prevent the occurrence of the crack 125. It is also possible to suppress a rapid rise in temperature of the fuse FU by using the above-described low withstand voltage transistor as the fusing current supply transistor CTr and as a result, the temperature gradient can be reduced. When a high withstand voltage transistor is used as the fusing current supply transistor CTr, the saturated region shown in FIG. 17 is used as a result, and therefore, a crack occurs.

Next, the utilization of the pinch effect is explained. FIGS. 19(a) and 19(b) show Fleming's left-hand rule. From FIGS. 19(a) and 19(b), it can be seen that when an electric current is caused to flow through the fuse FU, the Lorentz force acts from the periphery of the fuse FU toward the center. According to the result of the simulation by the FEM analysis, the Lorentz force that acts on the fuse FU is as high a value as 200 $GN/m^3$. On the surface of the earth, the gravity of a matter having a mass of 1 kg is about 9.81 N (Newton). That is, the force of 200 GN (Newton) is a force about ten orders of magnitude greater than the gravity of 1 kg.

Figure 20:
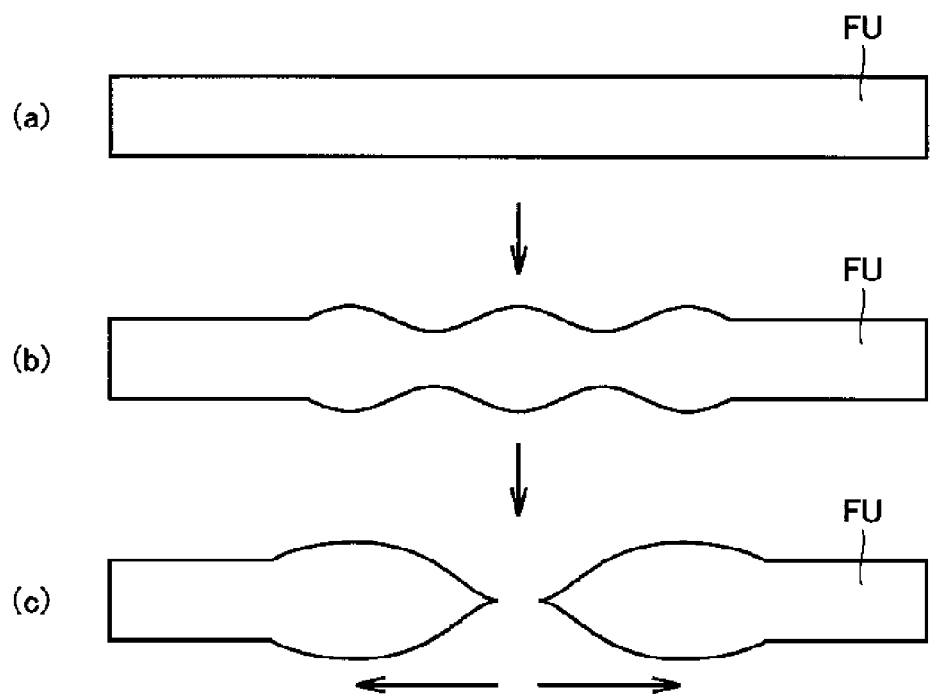
FIG. 20 is a diagram showing a result of simulation using the FEM analysis of the pinch effect acting on a fuse when the fuse is melted.

FIGS. 20(a) to 20(c) show the simulation results using the FEM analysis of the pinch effect that acts on the fuse FU when the fuse FU is melted. In order to facilitate the analysis, it is assumed that the shape of the fuse FU is a cylinder and the fuse FU is disposed in the air. As shown in FIG. 20(a), when the fuse FU is in the solid phase, the shape of the fuse FU will not change even if a very large Lorentz force acts thereon. However, when the fuse FU turns into the liquid phase, the shape of the fuse FU changes by the Lorentz force. This phenomenon is generally called the pinch effect. As shown in FIGS. 20(b) and 20(c), when the fuse FU turns into the liquid phase, part of the fuse FU shrinks rapidly toward the center due to the pinch effect. Then, a gap is formed by the rapid movement of the copper in the liquid phase toward both ends of the fuse FU. As a result, the melting of the fuse FU is completed. As described above, in the present invention, by appropriately controlling an electric current caused to flow through the fuse FU, the crack 125 is suppressed from occurring and the fuse FU is melted by utilizing the pinch effect.

FIG. 21(a) is an SEM photo when the four melted fuses FU are viewed from above, FIG. 21(b) is an SEM photo in which the center part of the melted fuse FU is enlarged, and FIG. 21(c) is a section photo along line A-A' in FIG. 21(b). As can be seen from FIGS. 21(a) to 21(c), the butterfly wing shown in FIGS. 16(a) and 16(b) does not occur. The melted point of the fuse FU is seen at the center part of the fuse FU at all times. This agrees with the result when the fuse FU is melted by the pinch effect at the center part of the fuse FU where the temperature becomes highest in the simulation shown in FIGS. 20(a) to 20(c). The period of time during which an electric current is caused to flow to melt the fuse FU is as short as 10 μsec per fuse.

Figure 22:
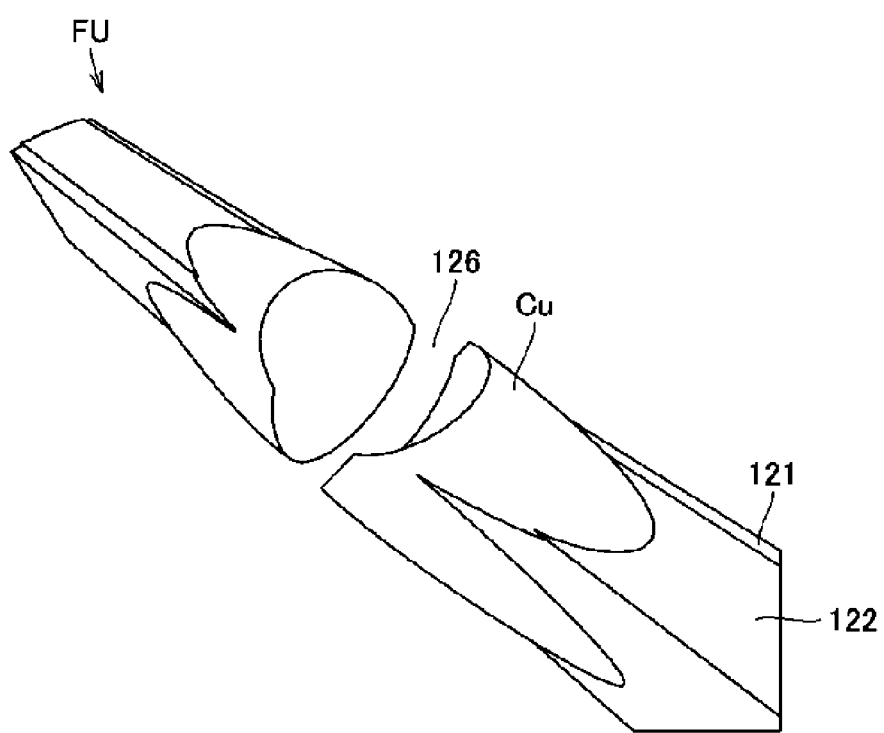
FIG. 22 is an image diagram showing the fuse in three dimensions melted by the fuse melting method of the present application shown in FIG. 18 to FIG. 20.

FIG. 22 is a diagram showing the center part of the melted fuse FU in three dimensions. FIG. 22 is a synthesized photo of all the SEM photos shot by SEM photographing each time dry etching is completed when dry etching is performed little by little a plurality of times for the center part of the melted fuse FU. From FIG. 22, it can be seen that a gap occurs at the center part of the fuse FU and copper located in the position of the gap moves to both sides and both sides of the gap is expanded by copper. That is, the fuse FU is melted at the center part and divided into two fuse chips and the parts of the two fuse chips facing each other are thicker than other parts of the respective fuse chips.

When the resistance value of the fuse FU was measured before and after the fuse FU was melted, it was known that the resistance value changes not less than five orders of magnitude before and after the melting and the distribution of the resistance value is very stable. This means that a cutoff judgment circuit with a simple configuration can be used. Further, a high-temperature preservation test of the leak current of the melted fuse FU was conducted. The leak current was sufficiently stable after about 1,500 hours.

As described above, in the first embodiment, the dummy fuse DFU is provided adjacent to the fuse FU, each wiring width of the fuse FU and the dummy fuse DFU is set to the minimum line width, and the interval between the fuse FU and the dummy fuse DFU is set to the minimum interval. Because of this, the exposure condition of the fuse FU and the dummy fuse DFU is optimized by the OPC, and therefore, it is possible to form the fuse FU with the minimum line width.

FIG. 23(a) is a design drawing of the fuse FU and the dummy fuse DFU and FIG. 23(b) is a diagram showing the fuse FU and the dummy fuse DFU formed actually over a silicon wafer based on the design drawing. As can be seen from FIGS. 23(a) and 23(b), the dimensions of the fuse FU of the design drawing and the dimensions of the fuse FU of the product are the same.

Figure 24:
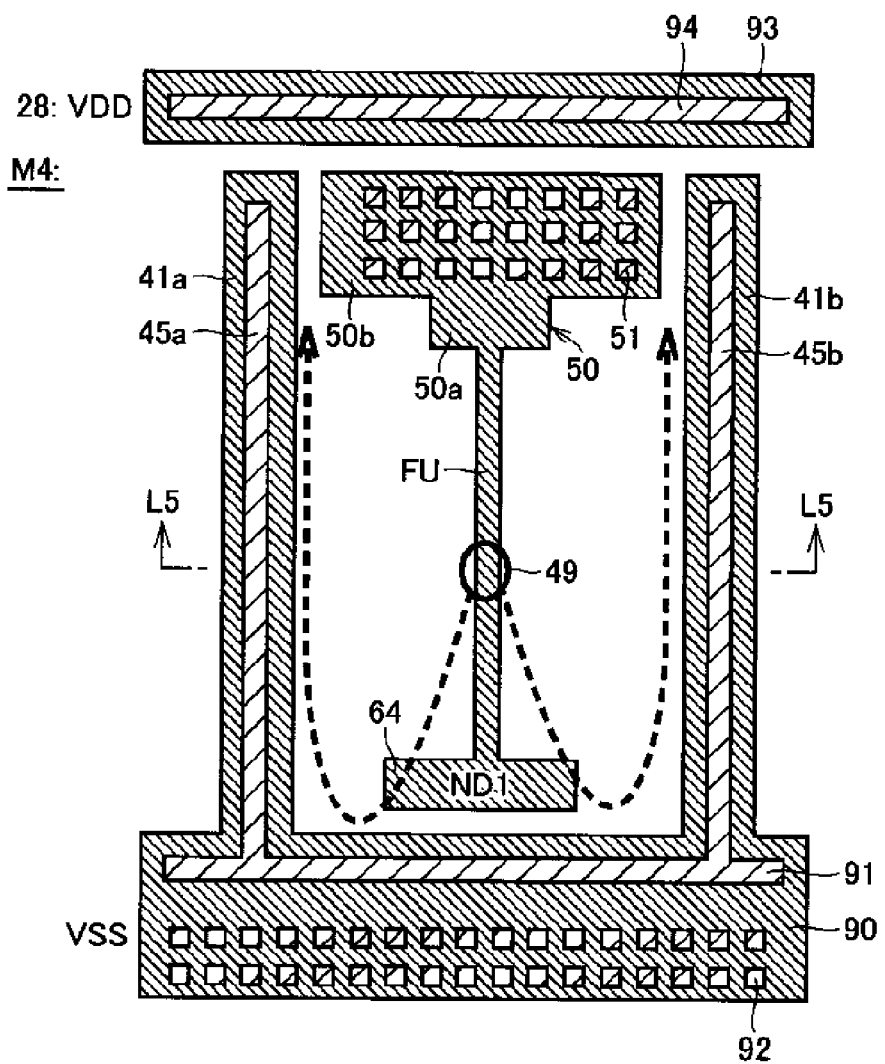
FIG. 24 is a diagram showing a comparative example of the first embodiment.

FIG. 24 is a diagram showing a comparative example of the present application, to be compared with FIG. 10. The comparative example differs from the first embodiment in that the dummy fuse DFU is not provided. In this case, the fuse FU is an isolated wire, and therefore, the wiring width by a mask is set greater than that of the design drawing by the OPC.

FIG. 25(a) is a design drawing of the fuse FU and FIG. 25(b) is a diagram showing the fuse FU formed actually over a silicon wafer based on the design drawing. As can be seen from FIGS. 25(a) and 25(b), the wiring width of the fuse FU of the product is greater than that of the fuse FU of the design drawing. Consequently, it is necessary to cause an electric current larger than that in the present invention to flow in order to melt the fuse FU.

Further, in the first embodiment, between the fuse FU and the dummy fuse DFU, the insulating layer formed by a porous material having a low dielectric constant is provided, and therefore, it is possible to prevent the heat of the fuse FU from being conducted to the dummy fuse DFU to suppress the rise in temperature of the fuse FU. Consequently, it is unlikely that the provision of the dummy fuse DFU obstructs the melting of the fuse FU.

Further, the fuse FU is melted by utilizing the pinch effect, and therefore, it is unlikely that the butterfly wing comes into contact with the dummy fuse DFU etc. As explained above using FIG. 17 and FIG. 18, if the temperature of the fuse FU is raised rapidly, a crack occurs, however, it is not possible to melt the fuse FU unless the temperature is raised to a certain temperature. In the first embodiment, the fuse FU is melted by utilizing the pinch effect, a low withstand voltage transistor is used as the fusing current supply transistor CTr, and the periphery of the fuse FU is formed by a porous material having a low dielectric constant. Therefore, it is possible to dispose the fusing current supply transistor CTr having sufficient drive capability to melt the fuse FU in a region having a small area. Further, the porous material having a low dielectric constant makes it hard for heat to escape, and therefore, it is possible to give the fuse FU sufficient energy for the fusing current supply transistor CTr having a small area to melt the fuse FU and to make an attempt to reduce the area of the wire fusing program circuit 4.

Furthermore, the periphery of the fuse FU and the dummy fuse DFU is surrounded by the diffusion protective wall and the copper diffusion prevention film is provided between the metal wiring layers, and therefore, it is possible to prevent the copper atoms generated when the fuse FU is melted from diffusing to the peripheral circuits and to prevent the peripheral circuits from malfunctioning due to the diffused copper atoms.

First Modified Example

Figure 26:
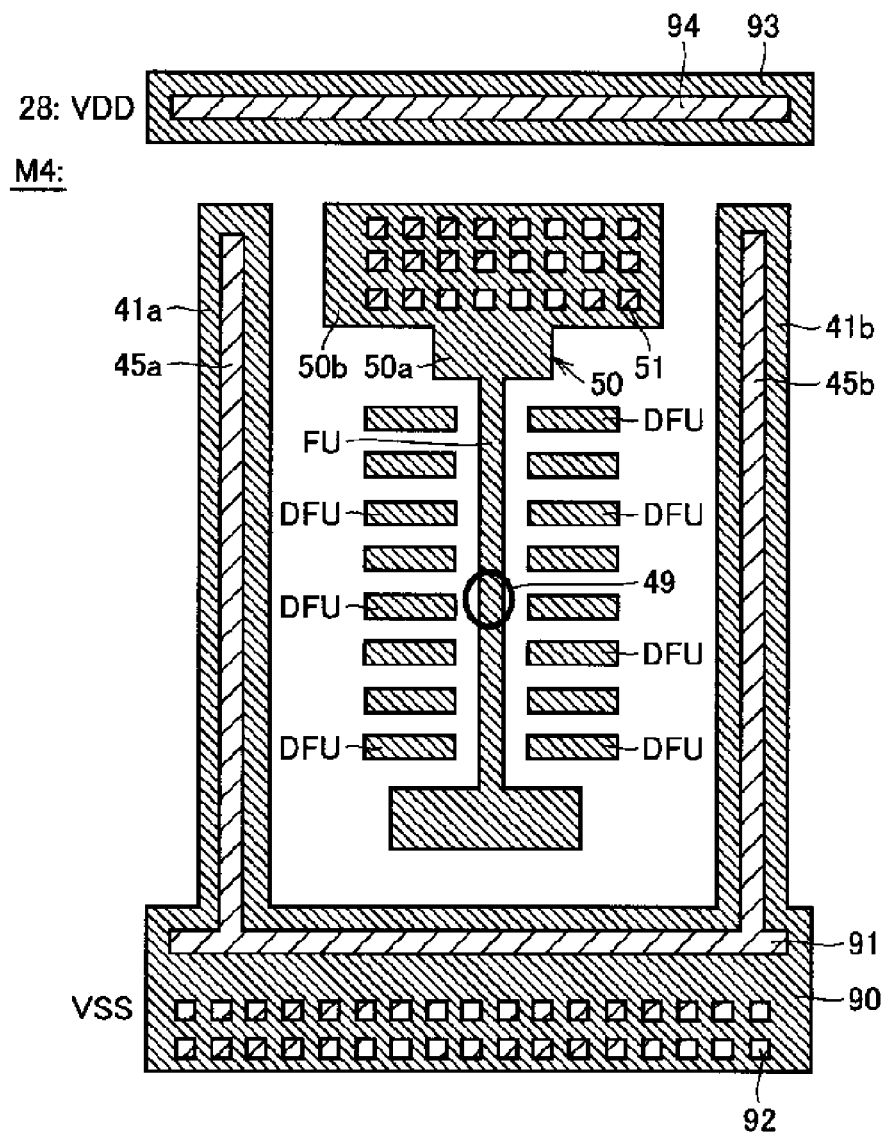
FIG. 26 is a diagram showing a first modified example 1 of the first embodiment.

FIG. 26 is a diagram showing a first modified example of the first embodiment, to be compared with FIG. 10. In FIG. 26, in the first modified example, a plurality (eight in the figure) of the dummy fuses DFU is arranged on both sides of the fuse FU, respectively. The fuse FU extends in the longitudinal direction and the dummy fuses DFU extend in the transverse direction.

Each wiring width of the fuse FU and the dummy fuse DFU is set to the minimum line width in the fuse formation region. The interval between the fuse FU and each dummy fuse DFU is set to the minimum interval in the fuse formation region. The dummy fuses DFU are arranged at equal intervals and the interval between the two neighboring dummy fuses DFU is set to the minimum interval in the fuse formation region. Therefore, since the exposure condition of the fuse FU and the dummy fuse DFU is optimized by the OPC in the manufacturing process, it is possible to form the fuse FU with the minimum line width.

Figure 27:
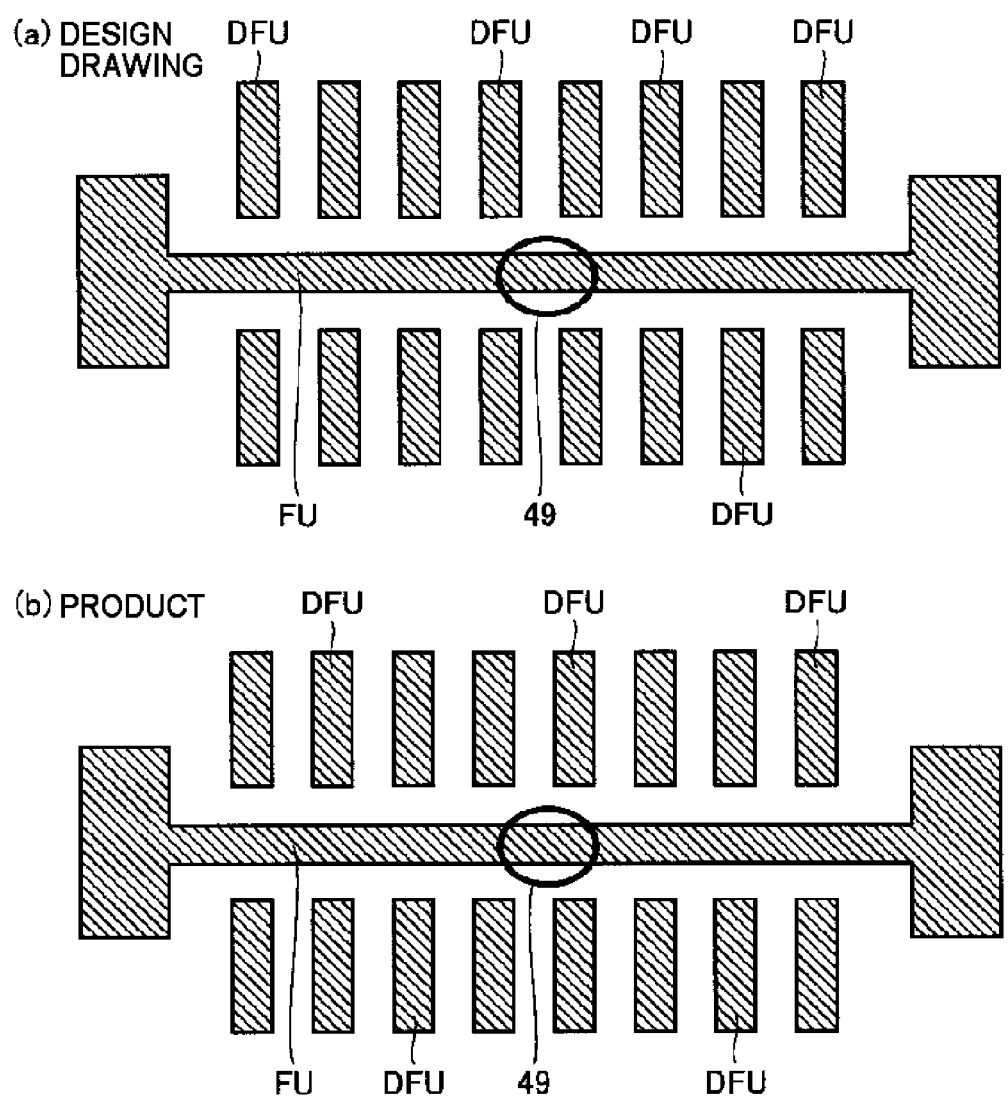
FIG. 27 is a diagram showing the effect of the first modified example shown in FIG. 26.

FIG. 27(a) is a design drawing of the fuse FU and the dummy fuse DFU and FIG. 27(b) is a diagram showing the fuse FU and the dummy fuse DFU formed actually over a silicon wafer based on the design drawing. As can be seen from FIGS. 27(a) and 27(b), the dimensions of the fuse FU of the design drawing and the dimensions of the fuse FU of the product are the same.

Second Modified Example

Figure 28:
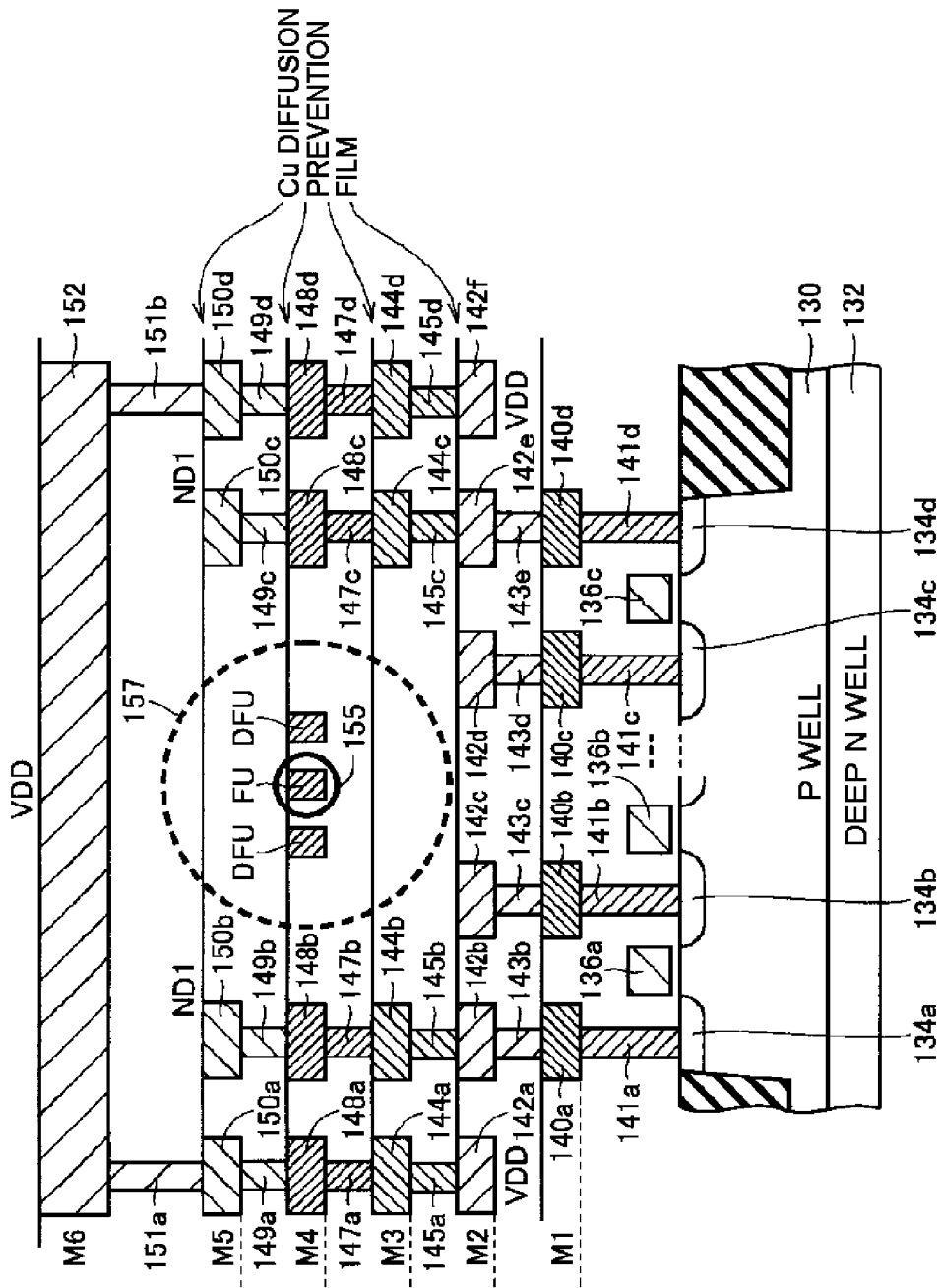
FIG. 28 is a diagram roughly showing a sectional structure of a fuse element in a second modified example of a second embodiment.

FIG. 28 is a section view showing a second modified example of the first embodiment, to be compared with FIG. 5. In FIG. 28, on the surface of a P-type well (P well) 130, N-type active regions (impurity regions) 134a to 134d are formed spaced from one another. Under the P well 130, a deep N well 132 is formed and thereby the P well 130 is separated from other circuit formation regions. The P well 130 is disposed commonly in the fuse program circuit.

Over the surface of the P well 130 between the impurity regions 134a to 134d, gate electrode wires 136a, 136b, and 136c formed by, for example, polysilicon, are arranged. These gate electrode wires 136a to 136c and the active regions (impurity regions) 134a to 134d form the fusing current supply transistor CTr. That is, the fusing current supply transistor CTr is configured by a plurality of unit MOS transistors arranged in parallel and these unit MOS transistors are formed by the active regions and the gate electrode wires shown schematically.

The impurity regions 134a to 134d are coupled to wires 140a to 140d in the first metal wiring layer M1 via contacts 141a to 141d, respectively. The first metal wires 140b and 140c are coupled to wires 142c and 142d in the second metal wiring layer M2 via first vias 143c and 143d. These second metal wires 142c and 142d are coupled to the ground line, respectively, and receive the ground voltage VSS.

The first metal wire 140a is coupled to a second metal wire 142b via a first via 143b and the first metal wire 140d is coupled to a second metal wire 142e via a first via 143e.

In the second metal wiring layer M2, second metal wires 142a and 142f are further arranged outside the second metal wires 142b and 142e. These second metal wires 142a and 142f transmit the power source voltage VDD, as will be explained later.

In the third metal wiring layer M3, third metal wires 144a, 144b, 144c, and 144d are arranged spaced from one another and electrically coupled to the second metal wires 142a, 142b, 142e, and 142f, respectively, via second vias 145a, 145b, 145c, and 145d, respectively. Above the second metal wires 142c and 142d, the third metal wire is not disposed.

In the fourth metal wiring layer M4, fourth metal wires 148a, 148b, 148c, and 148d are arranged spaced from one another and electrically coupled to the third metal wires 144a, 144b, 144c, and 144d via third vias 147a, 147b, 147c, and 147d, respectively. In the fourth metal wiring layer M4, the fuse FU formed using the fourth metal wire is disposed. One dummy fuse DFU formed using the fourth metal wire is disposed on each of the both sides of the fuse FU. In the third metal wiring layer M3, no wire is disposed directly under the fuse FU and the second metal wires 142c and 142d in the second metal wiring layer M2 and the fuse FU are arranged in positions that do not align with each other.

In the fifth metal wiring layer M5, fifth metal wires 150a, 150b, 150c, and 150d are arranged spaced from one another and electrically coupled to the fourth metal wires 148a, 148b, 148c, and 148d via fourth vias 149a, 149b, 149c, and 149d, respectively.

The fifth metal wires 150b and 150c are coupled to anode bed region ND1B and coupled to the node ND1.

On the other hand, the fifth metal wires 150a and 150d are coupled to a sixth metal wire 152 in the sixth wiring layer M6 via sixth vias 151a and 151b. To this sixth metal wire 152, the power source voltage VDD is transmitted. This sixth metal wire 152 is disposed above the fuse element FU so as to cover the fuse FU. Because of this, at least a gap between the two wiring layers is secured directly above and directly under the fuse FU. A trimming region 155 of the fuse FU is a region melted by Joule heat by the fusing current and the copper atoms at the time of melting move from this trimming region 155 by thermal diffusion. On the periphery of this fuse trimming region 155, there is a damage-expected region 157. The damage-expected region 157 is a region where the temperature is expected to rise up to the melting point of copper (1,000° C. or more) and in which copper is expected to diffuse when the fuse FU is melted by Joule heat. In reality, the region is a region where deterioration of product quality of the insulating film by heat is expected to be caused and a region where insulation defect due to the migration of the copper atoms is not expected to occur.

The copper diffusion protective wall structure suppresses the short circuit of the wire (insulation defect) due to the thermal diffusion of the copper atom and the melting defect of the fuse FU from occurring in the damage-expected region 157. The via and wire arranged on the periphery of the fuse FU form the copper (Cu) diffusion preventive wall to realize the copper diffusion preventive structure. As shown in FIG. 28, by forming the upper copper diffusion preventive wall of the fuse FU using the wire in the sixth metal wiring layer, it is possible to reduce the number of wiring layers utilized to form a fuse element and to reduce the occupied area compared to the configuration in which a protective film is formed above a fuse by utilizing the wires 150b and 150c that form the node ND1.

Further, as shown in FIG. 28, the thermal diffusion of copper beyond the gap region above the fifth metal wires 150b and 150c is prevented by the fifth vias 151a and 151b. Because of this, it is possible to suppress coppers from thermally diffusing to the fuse element disposed adjacent thereto. The protective wall has a double-wall structure of a plug configured by the intermediate metal wires from the sixth metal wire to the second metal wire and the vias and a plug configured by the intermediate metal wires from the substrate region to the fifth metal wiring layer, and therefore, securely shuts off the thermal diffusion paths of copper.

Between the metal wires in each metal wiring layer, an interlayer insulating film is disposed and a diffusion prevention film having a small copper diffusion coefficient formed by SiCN etc. that prevents copper (Cu) diffusion is disposed in each wiring layer of the interlayer insulating film. By disposing the copper diffusion prevention film (Cu diffusion prevention film in FIG. 28), the copper diffusion in the damage region is suppressed and the deterioration of the insulating film is suppressed and at the same time, the copper atoms are suppressed from thermally diffusing in the insulating film. In particular, the copper diffusion prevention film is disposed in each of the second to fifth metal wiring layers M2 to M5 and the diffusion prevention film disposed between the wire to which the power source voltage VDD is applied and the wire to which the voltage of the node ND1 is applied plays an important role to prevent the copper atoms that are diffused when the neighboring fuse FU is melted from diffusing.

Figure 29:
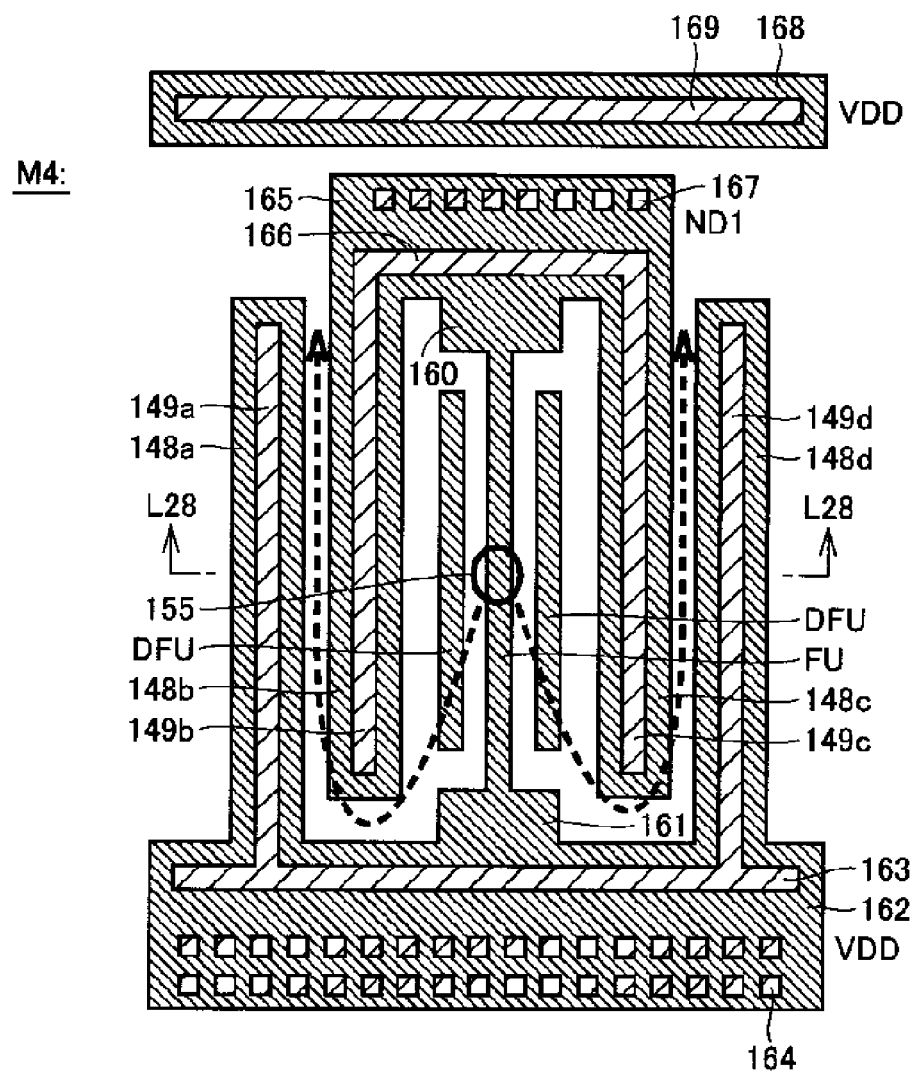
FIG. 29 is a diagram roughly showing a planar layout of a fourth metal wiring layer and a fourth via shown in FIG. 28.

FIG. 29 is a diagram showing a wiring layout of the fourth metal wiring layer M4 shown in FIG. 13, to be compared with FIG. 10. In FIG. 29, the sectional structure along line L28-L28 is the sectional structure of the fourth metal wiring layer, the fourth metal via, and the lower layer shown in FIG. 28.

In FIG. 29, in the fourth metal wiring layer M4 of the fuse element FS, the fourth metal wires 148a and 148d are arranged extending in the longitudinal direction and over the fourth metal wires 148a and 148d, the fourth groove-shaped vias 149a and 149d are formed extending rectilinearly and continuously. For the fourth metal wires 148a and 148d, a fourth metal bed wire 162 extending continuously in the transverse direction is provided and for the fourth metal bed wire 162, a fourth groove-shaped via 163 is formed. To the fourth metal bed wire 162, the fourth metal wires 148a and 148d are coupled and to the fourth via 163, the fourth vias 149a and 149d are coupled. On the surface of the fourth metal bed wire 162, a plurality of fourth unit vias 164 for the electrical coupling with the wire in the upper layer is arranged spaced from one another in alignment. The fourth metal bed wire 162 transmits the power source voltage VDD.

Inside the fourth metal wires 148a and 148d, the fourth metal wires 148b and 148c are arranged extending rectilinearly. Over the fourth metals 148b and 148c, the fourth groove-shaped vias 149b and 149c are arranged.

For the fourth metal wires 148b and 148c, a fourth metal bed wire 165 is disposed and on the surface of the fourth metal bed wire 165, a fifth groove-shaped via 166 is formed. The fourth metal wires 148b and 148c are coupled to the fourth metal bed wire 165 and the fourth groove-shaped via 166 is coupled to the fourth vias 149b and 149c.

Inside the fourth metal wires 148b and 148c, the fuse FU and the two dummy fuses DFU are formed using the copper wire in the fourth metal wiring layer M4. One dummy fuse DFU is disposed adjacent to the center part on one side of the fuse FU and the other dummy fuse DFU is disposed adjacent to the center part on the other side of the fuse FU. Each wiring width of the fuse FU and the dummy fuse DFU is set to the minimum line width in the fuse formation region. Further, the fuse FU and the four dummy fuses DFU are arranged in parallel at equal intervals and the interval is set to the minimum interval in the fuse formation region. Consequently, the exposure condition of the fuse FU and the dummy fuse DFU is optimized by the OPC in the manufacturing process, and therefore, it is possible to form the fuse FU with the minimum line width.

At both ends of the fuse FU, fourth metal pad wires 160 and 161 are arranged. The fourth metal pad wire 160 is coupled to the fourth metal bed wire 165 and the fourth metal pad wire 161 is coupled to the fourth metal wire 162. Due to this, both ends of the fuse FU are coupled to the node ND1 and the power source node, respectively. In the second modified example also, the same effect as that in the first embodiment can be obtained.

Third Modified Example

Figure 30:
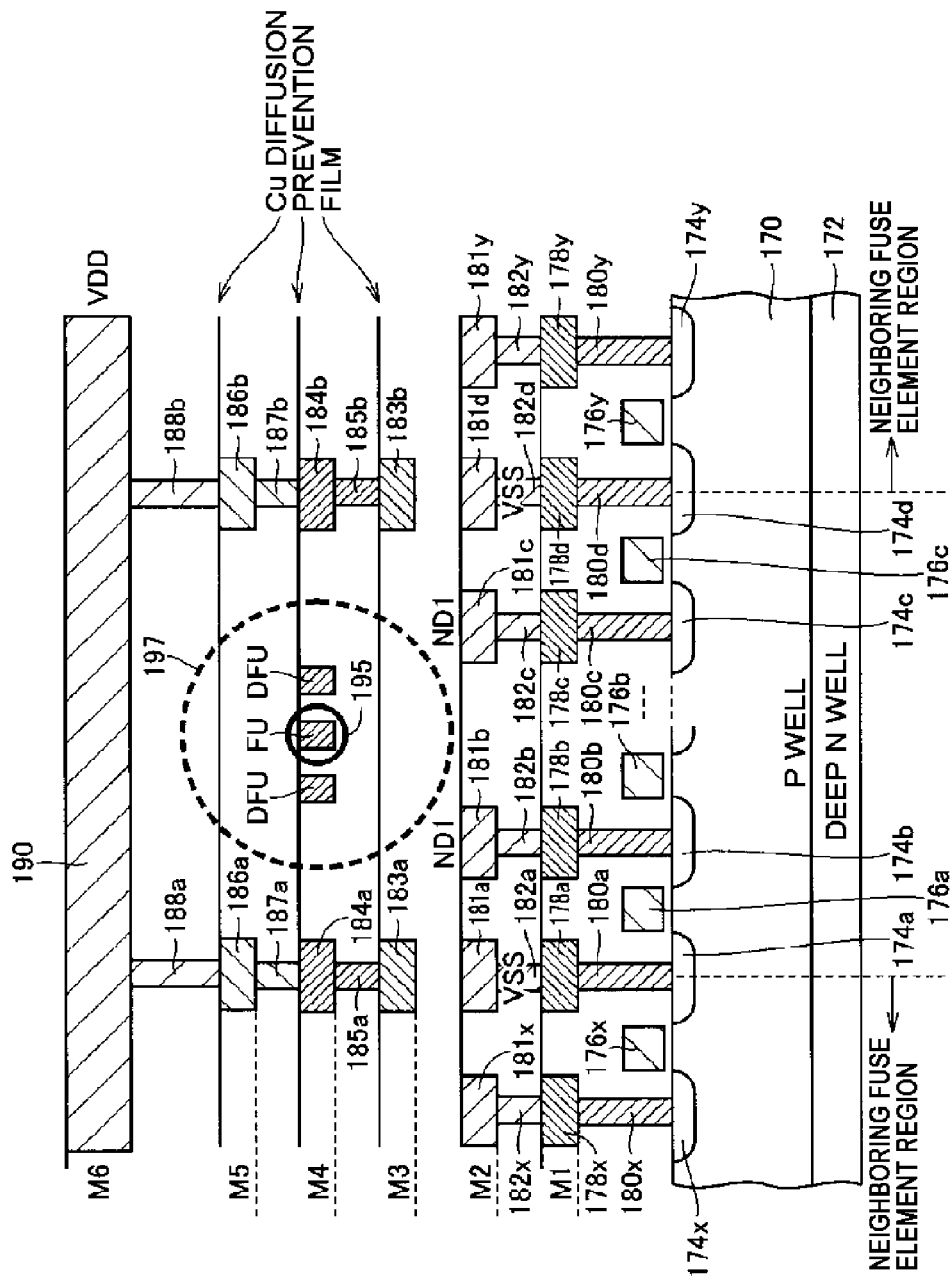
FIG. 30 is a diagram roughly showing a sectional structure of a fuse element in a third modified example of the second embodiment.

FIG. 30 is a section view showing a third modified example of the second embodiment, to be compared with FIG. 5. In FIG. 30, under a P well 170, a deep N well 172 is provided. The P well 170 and the deep N well 172 are arranged commonly to the fuse elements in the fuse box. Here, the fuse box refers to a region in which a plurality of fuse elements is arranged in alignment.

On the surface of the P well 170, active regions (N-type impurity regions) 174a to 174d are arranged spaced from one another and in the neighboring fuse element regions, active regions 174x and 174y are arranged. The impurity regions 174a and 174d are shared by the fusing current supply transistors for the fuse elements included in the neighboring fuse program circuits, respectively.

Over the surface of the P well 170 between the impurity regions 174a to 174d, gate electrode wires 176a, 176b, and 176c are arranged via gate insulating films. In the neighboring fuse element region also, over the region between the impurity regions 174x and 174a, a gate electrode wire 176x is arranged and over the region between the impurity region s 174d and 174y, a gate electrode wire 176y is disposed.

First metal wires 178a to 178d, 178x, and 178y in the first metal wiring layer M1 are arranged corresponding to the impurity regions 174a to 174d, 174x, and 174y, respectively. The first metal wires 178a to 178d, 178x, and 178y are coupled to the corresponding impurity regions 174a to 174d, 174x, and 174y, respectively, via contacts 180a to 180d, 180x, and 180y, respectively.

In the second metal wiring layer M2, second metal wires 181a to 181d, 181x, and 181y are arranged corresponding to the first metal wires 178a to 178d, 178x, and 178y, respectively. The second metal wires 181a to 181d, 181x, and 181y are coupled to the corresponding first metal wires 178a to 178d, 178x, and 178y via first groove-shaped vias 182a to 182d, 182x, and 182y, respectively. The second metal wires 181a and 181d are coupled to the ground line, respectively, and transmit the ground voltage VSS. The second metal wires 181b and 181c are coupled to the node ND1, respectively.

In the third metal wiring layer M3, third metal wires 183a and 183b are arranged corresponding to the second metal wires 181a and 181d, respectively. Under the third metal wires 183a and 183b, no via is formed and between the second metal wire 181a and the third metal wire 183a and between the second metal wire 181d and the third metal wire 183d, a gap is present, respectively.

In the fourth metal wiring layer M4, fourth metal wires 184a and 184b are arranged corresponding to the third metal wires 183a and 183b and electrically coupled to the corresponding third metal wires 183a and 183b via third groove-shaped vias 185a and 185b, respectively.

The fuse FU (M4) is formed between the fourth metal wires 184a and 184b using the wire in the fourth metal wiring layer M4. In the fourth metal wiring layer M4, the fuse FU formed using the fourth metal wire is disposed. At each of the both sides of the fuse FU, one dummy fuse DFU formed using the fourth metal wire is disposed.

In the fifth metal wiring layer M5, fifth metal wires 186a and 186b are arranged corresponding to the fourth metal wires 184a and 184b and electrically coupled to the corresponding fourth metal wires 184a and 184b via fourth groove-shaped vias 187a and 187b, respectively.

Fifth groove-shaped vias 188a and 188b are arranged corresponding to the fifth metal wires 186a and 186b, respectively and the fifth vias 188a and 188b are electrically coupled to a power source wire 190 in the sixth metal wiring layer M6. The power source line formed by the sixth metal wire 190 is disposed commonly to a plurality of fuse elements and at the same time, disposed so as to cover a fuse trimming region 195, functioning as an upper diffusion protective wall wire for the fuse.

In the configuration shown in FIG. 30, there exists a damage region 197 with the trimming region 195 of the fuse FU (M4) as a center. The damage region 197 is heated to a temperature of the melting point of copper or higher when copper (Cu) constituting the fuse FU (M4) is melted, and therefore, the region has a possibility that deterioration is caused due to the influence thereof. In the interlayer insulating film in each metal wiring layer, a copper diffusion prevention film (the Cu diffusion prevention film in FIG. 30) is disposed.

In the configuration shown in FIG. 30 also, the diffusion prevention film for copper (Cu) of the fuse FU (M4) is formed using the wire in the third metal wiring layer to the sixth metal wiring layer and the copper diffusion protective wall structure is realized.

In the configuration shown in FIG. 30, a configuration is utilized, in which the second metal wires 181b and 181c are coupled to the node ND1, and therefore, the distance between the fuse FU (M4) and the second metal wires 181b and 181c can be made sufficiently long, the node ND1 does not need to be disposed in the upper layer, that is, the fourth or fifth metal wiring layer, it is not necessary to secure a space for arranging a wire and a via to extend the node ND1, and the layout area of the fuse can be reduced.

As to the thermal diffusion of copper when the fuse FU (M4) is melted, the copper diffusion paths in the horizontal direction in the configuration shown in FIG. 30 can be shut off by the diffusion protective wall structure.

However, there exists a gap under the wires 183a and 183b in the third metal wiring layer M3, and therefore, there is a possibility that copper is thermally diffused in this region. However, in this case, by setting the distance between the third metal wires 183a and 183b and the trimming region 195 of the fuse FU (M4) sufficiently long in view of the thermal diffusion distance of copper, it is possible to prevent copper shown by the broken line in FIG. 30 from thermally diffusing to the neighboring fuse.

In particular, the wire in the fuse box is maintained at the same potential as the power source voltage VDD level in terms of circuitry, and therefore, it is possible to set the thermal diffusion distance of copper sufficiently short and to securely suppress copper from thermally diffusing to the neighboring fuse element region.

Figure 31:
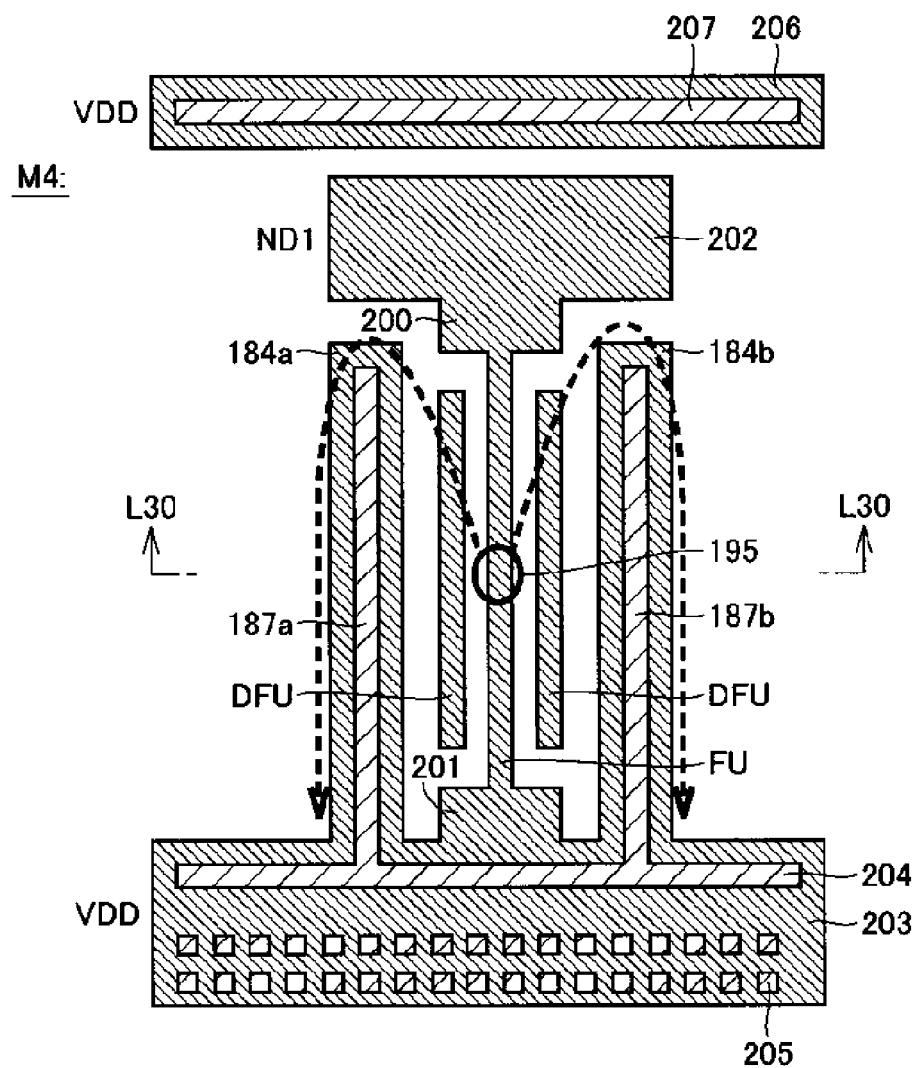
FIG. 31 is a diagram roughly showing a planar layout of the fourth metal wiring layer and the fourth via shown in FIG. 30.

FIG. 31 is a diagram roughly showing a planar layout of the fourth metal wiring layer M4 and the fourth via of the fuse element FS shown in FIG. 30. In FIG. 31, section line L30-L30 for the sectional structure of the fuse element shown in FIG. 30 is shown.

In FIG. 31, the fourth metal wires 184a and 184b are formed into a shape elongated in the longitudinal direction and for the fourth metal wires 184a and 184b, the fourth groove-shaped vias 187a and 187b are formed extending continuously in the fuse element formation region.

Between the fourth metal wires 184a and 184b, the fuse FU and the two dummy fuses DFU are formed using the copper wire in the fourth metal wiring layer M4. One dummy fuse DFU is disposed adjacent to the center part on one end of the fuse FU and the other dummy fuse DFU is disposed adjacent to the center part on the other side of the fuse FU. Each wiring width of the fuse FU and the dummy fuse DFU is set to the minimum line width in the region in which the fuse element FS is formed. Further, the fuse FU and the two dummy fuses DFU are arranged in parallel at equal intervals and the interval is set to the minimum interval in the fuse formation region. Consequently, since the exposure condition of the fuse FU and the dummy fuse DFU is optimized by the OPC in the manufacturing process, it is possible to form the fuse FU with the minimum line width.

At both ends of the fuse FU (M4), fourth metal pad wires 200 and 201 are formed. The pad wires 200 and 201, which are wide, suppress an electric current from concentrating when the fuse FU (M4) is melted.

Adjacent to the fourth metal pad wire 200, a fifth metal bed wire 202 is disposed and the pad wire 200 and the bed wire 202 are coupled. On the other hand, adjacent to the fourth metal wires 184a and 184b and the fourth metal pad wire 201, a fourth metal wire 203 extending continuously in the transverse direction is disposed. Over the surface of the fourth metal wire 203, a fourth groove-shaped via 204 is disposed. The fourth metal wires 184a and 184b and the pad wire 181 are coupled to the fourth metal wire 203 and the fourth groove-shaped via 204 is coupled to the fourth vias 187a and 187b. The fourth metal wire 203 is disposed commonly to a plurality of fuse elements and electrically coupled to the wire in the upper layer via a plurality of fourth unit vias 205 formed on the surface thereof.

In a region outside the bed wire 202, a fourth metal wire 206 is disposed and a fourth groove-shaped via 207 is formed on the surface of the fourth metal wire 206. The fourth metal wires 203 and 206 transmit the power source voltage VDD.

As shown in FIG. 31, in the fourth metal wiring layer M4 also, in the thermal diffusion paths of copper from the fuse trimmed region 195 shown by the broken arrows, the diffusion paths from the fourth metal wire 203 and the via 204 to the outside of the fuse box are shut off.

In FIG. 31 also, in the thermal diffusion paths of copper shown by the broken arrows, there is a possibility that copper is thermally diffused to the neighboring fuse element, however, the wires in the fuse box are usually maintained at the same potential and in this wiring layer also, the thermal diffusion distance of copper can be shortened sufficiently and the diffusion of copper to the neighboring fuse element can be suppressed sufficiently. In the third modified example also, the same effect as that in the first embodiment can be obtained.

Second Embodiment

Figure 32:
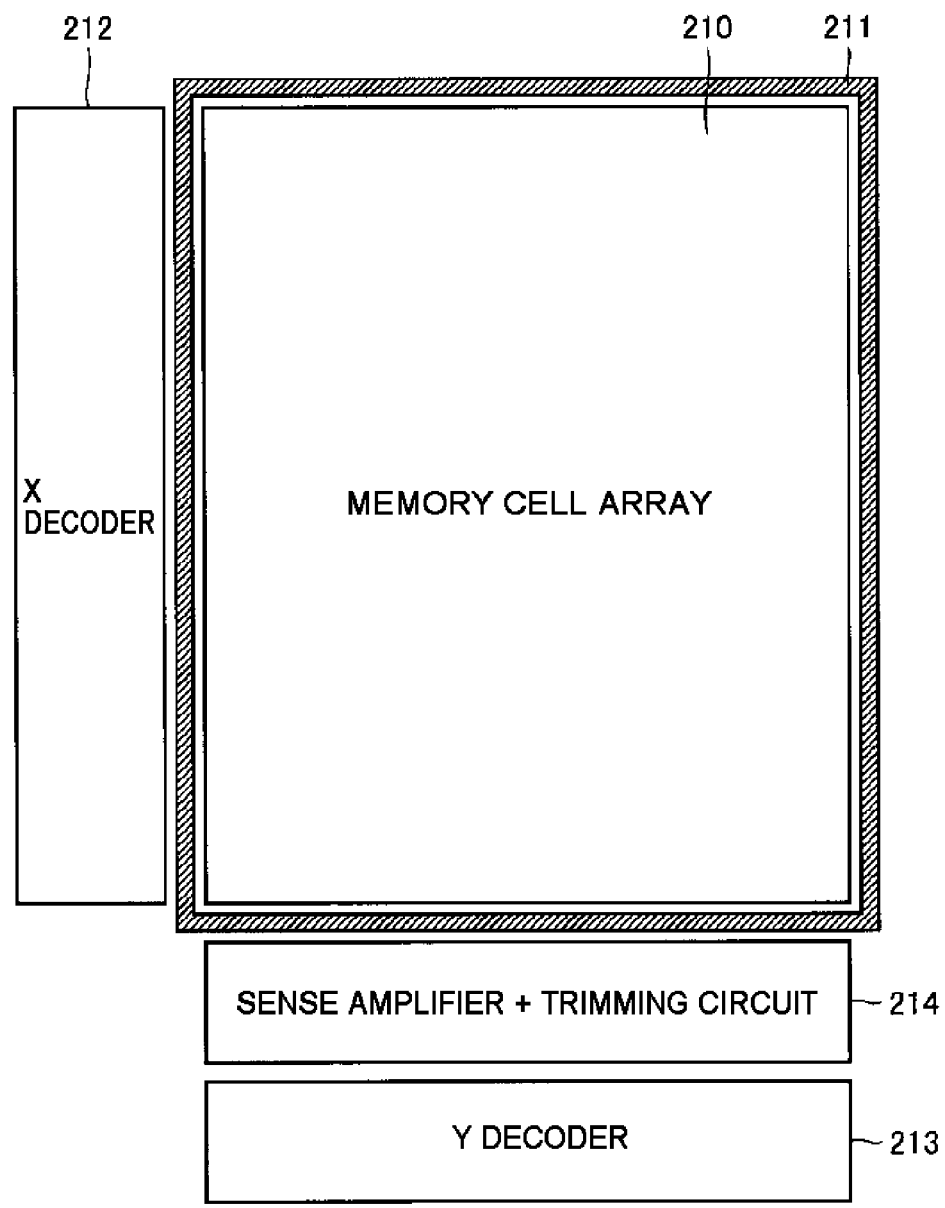
FIG. 32 is a diagram roughly showing a general configuration of a semiconductor storage device according to the second embodiment of the present invention.

FIG. 32 is a block diagram showing a configuration of a semiconductor storage device according to a second embodiment of the present invention. In FIG. 32, the semiconductor storage device comprises a memory cell array 210, a diffusion protective wall 211, an X decoder 212, a Y decoder 213, and a sense amplifier+trimming circuit 214. The memory cell array 210, the diffusion protective wall 211, the X decoder 212, the Y decoder 213, and the sense amplifier+trimming circuit 214 are components of the wire fusing program circuit 4 in FIG. 1. Consequently, the semiconductor storage device comprises the internal circuit 2, the fuse information utilization circuit 3, the wire fusing program circuit 4, and the signal input/output circuit 5 illustrated in FIG. 1. The transistors that configure the memory cell array 210, the diffusion protective wall 211, the X decoder 212, the Y decoder 213, and the sense amplifier+trimming circuit 214 are the above-described low withstand voltage transistors.

Figure 33:
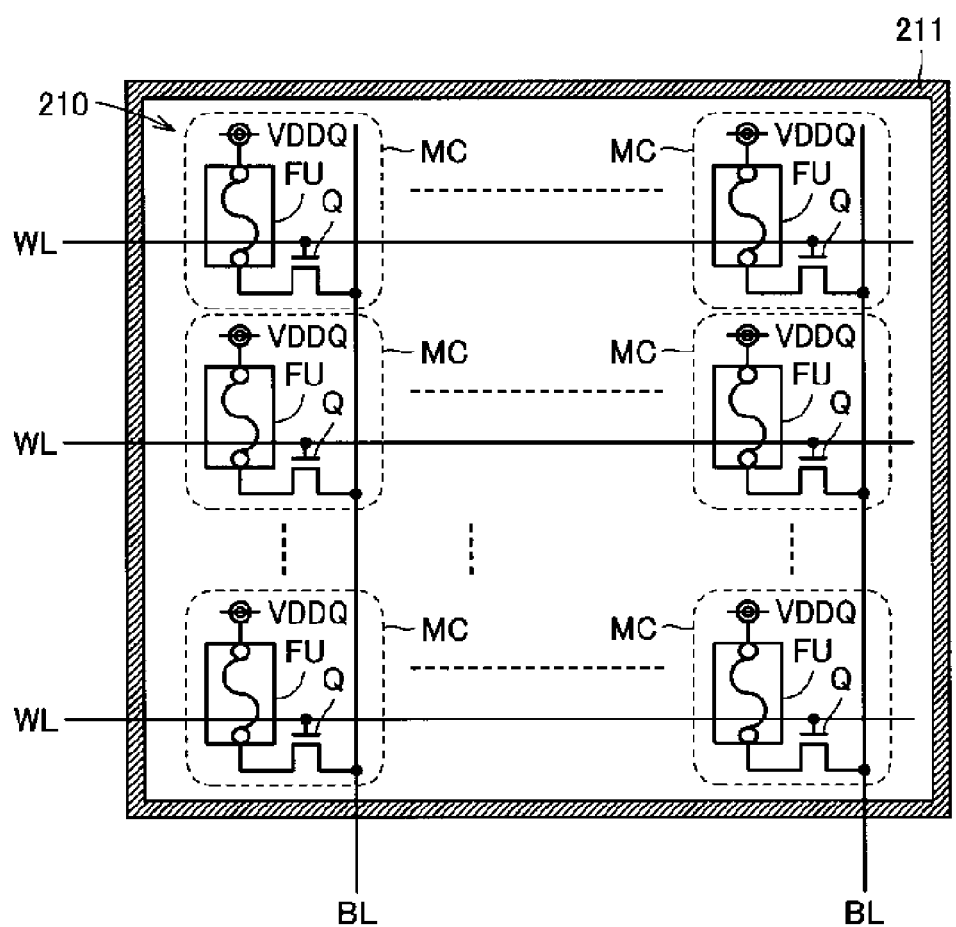
FIG. 33 is a circuit diagram showing a configuration of a memory cell array shown in FIG. 32.

As shown in FIG. 33, the memory cell array 210 includes a plurality of memory cells MC arranged in a plurality of rows and columns, a plurality of word lines WL provided corresponding to the rows, and a plurality of bit lines BL provided corresponding to the columns, respectively. Each memory cell MC includes the fuse FU and an N-channel MOS transistor Q. The fuse FU and the transistor Q are coupled in series between a line of a fuse power source voltage VDDQ and the corresponding bit line BL. A gate of the transistor Q is coupled to the corresponding word line WL. The fuse FU stores a data signal depending on whether it is melted or not. The fuse FU is formed by a copper wire. The copper diffusion protective wall 211 is formed so as to surround all the memory cells MC included in the memory cell array 210 and prevents the copper atoms from diffusing to the outside of the memory cell array 210.

Returning to FIG. 32, the X decoder 212 selects any one of the word lines WL according to a row address signal and changes the word line WL to "H" level, the selection level, and turns on each transistor Q corresponding to the word line WL. The Y decoder 213 selects any one of the bit lines BL according to a column address signal. The sense amplifier+trimming circuit 214 writes/reads a data signal to/from the memory cell MC disposed at the intersection of the word line WL selected by the X decoder 212 and the bit line BL selected by the Y decoder 213.

At the time of write operation, the fuse power source voltage VDDQ is raised into a high voltage. The word line WL selected by the row address signal is changed to "H" level, the selection level, by the X decoder 212 and each transistor Q corresponding to the word line WL is turned on. The bit line BL selected by the Y decoder 213 according to the column address signal is grounded by the sense amplifier+trimming circuit 214 for a predetermined period of time. Due to this, an electric current flows through the fuse FU of the memory cell MC selected by the row address signal and the column address signal and the fuse FU is melted. At this time, the transistor Q operates in the linear region and the fuse FU is melted by using the pinch effect. The voltage at the selection level (gate voltage of the transistor Q) to be applied from the X decoder 212 to the word line WL at the time of write operation is set to a predetermined voltage VDDF lower than the fuse power source voltage VDDQ raised into a high voltage and higher than the ground voltage so that the operating point of the transistor Q moves from the saturated region to the linear region.

At the time of read operation, the fuse power source voltage VDDQ is set to the ground voltage. The word line WL selected by the row address signal is changed to "H" level, the selection level, by the X decoder 212 and each transistor Q corresponding to the word line WL is turned on. To the bit line BL selected by the Y decoder 213 according to the column address signal, a read voltage is applied for a predetermined period of time by the sense amplifier+trimming circuit 214. When the fuse FU of the memory cell MC selected by the row address signal and the column address signal is already melted, the selected bit line BL is charged to the read voltage. When the fuse FU of the selected memory cell MC is not melted, the selected bit line BL is not charged to the read voltage but set to the ground voltage. After applying the read voltage to the selected bit line BL for a predetermined period of time, the sense amplifier+trimming circuit 214 outputs a data signal at a logic level corresponding to the voltage of the bit line BL.

Figure 34:
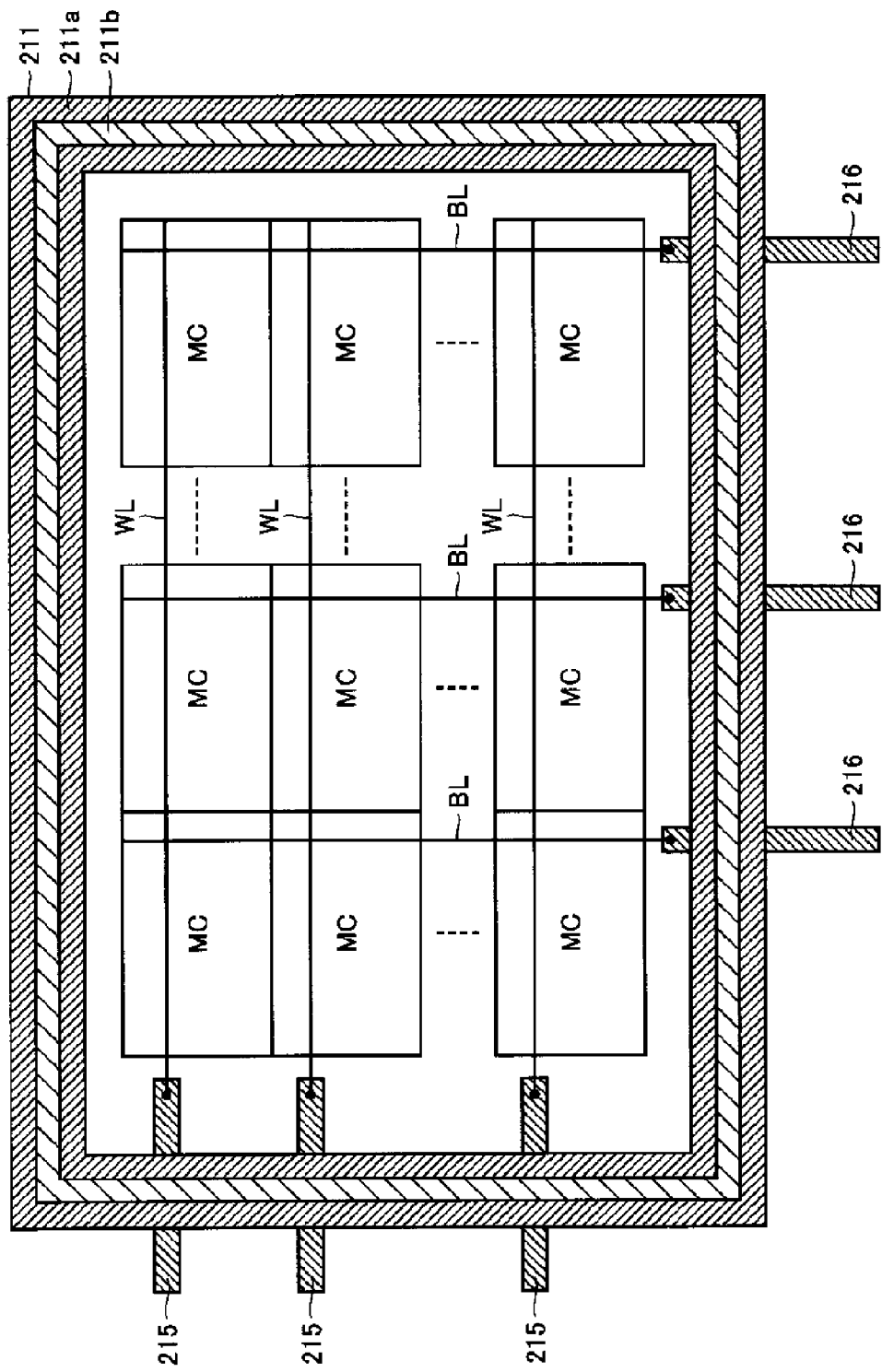
FIG. 34 is a diagram showing a configuration of a diffusion protective wall shown in FIG. 33.

FIG. 34 is a diagram showing a configuration of the diffusion protective wall 211. In FIG. 34, the diffusion protective wall 211 includes a metal wire 211a formed into an annular shape and a via 211b formed into an annular shape over the metal wire 211a. The via 211b is a groove-shaped via continuously formed rectilinearly. The metal wire 211a is a wire in the same metal wiring layer as that of the fuse FU. When the fuse FU is formed by the wire in the fourth metal wiring layer, the metal wire 211a is also the wire in the fourth metal wiring layer. The metal wire 211a is seamless. The diffusion protective wall 211 prevents the copper atoms generated when the fuse is melted from diffusing to the peripheral circuits. The copper diffusion prevention film is formed between each of the metal wiring layers, and therefore, it is unlikely that the copper atoms are diffused in the vertical direction.

Each word line WL is coupled to the X decoder 212 via a metal wire 215 in the metal wiring layer different from that of the metal wire 211a. Each bit line BL is coupled to the Y decoder 213 and the sense amplifier+trimming circuit 214 via a metal wire 216 in the metal wiring layer different from that of the metal wire 211a. When the metal wire 211a is the wire in the fourth metal wiring layer, the metal wires 215 and 216 are wires, for example, in the first metal wiring layer or the second metal wiring layer. Alternatively, the metal wires 215 and 216 are wires in the metal wiring layer higher than the fourth metal wiring layer.

Figure 35:
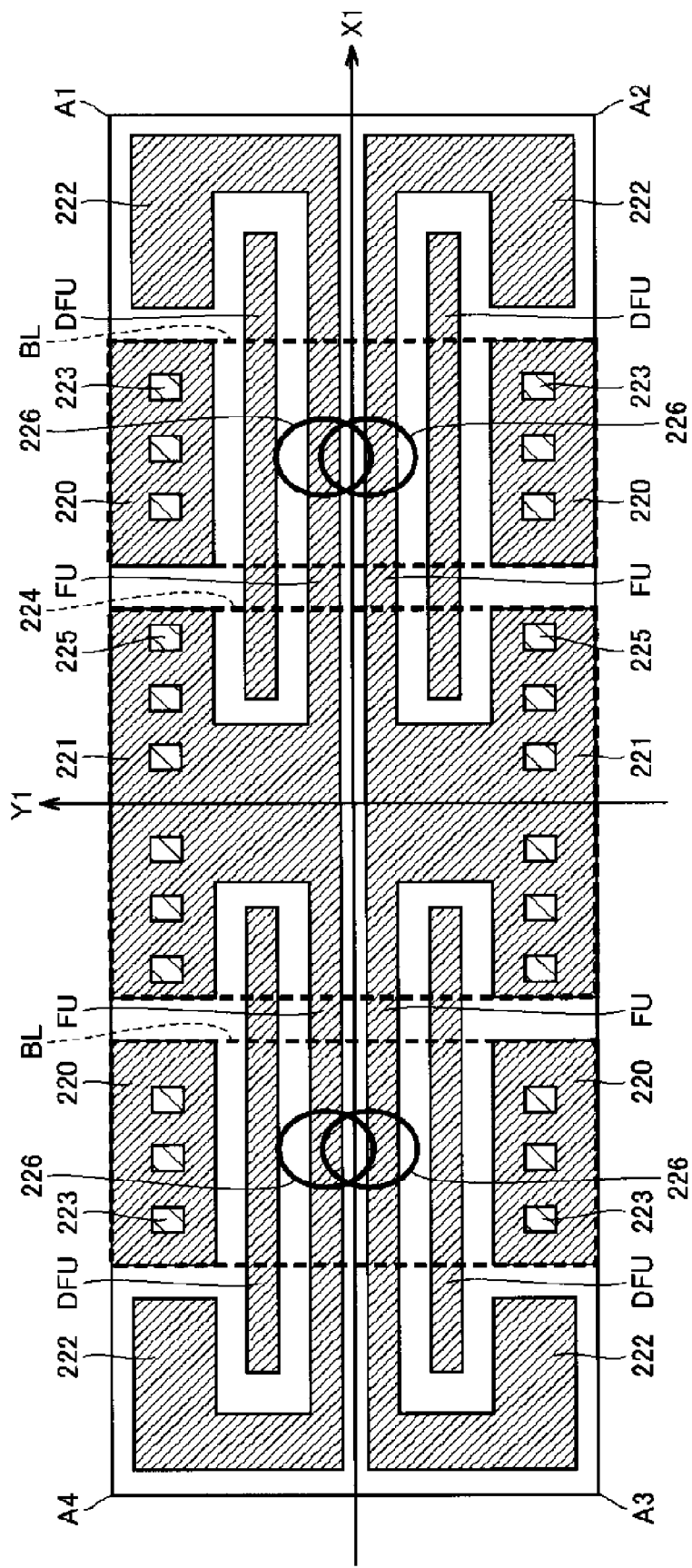
FIG. 35 is a diagram showing a layout of a fuse of the memory cell shown in FIG. 33.

FIG. 35 is a diagram showing a layout of main parts of the memory cells MC included in the memory cell array 210. The memory cells MC are divided into a plurality of memory cell groups each including four 2 (row) x2 (column) memory cells. FIG. 35 shows a layout of the four memory cells MC included in one memory cell group.

The metal wiring layer (for example, the fourth metal wiring layer) in which the fuse FU of the memory cell MC is formed is divided into four rectangular regions A1 to A4 corresponding to the four memory cells MC, respectively. The long sides of the rectangular regions A1 to A4 are arranged along an X1 axis and the short sides of the rectangular regions A1 to A4 are arranged along a Y1 axis. The rectangular regions A1 and A2 are arranged on one side (right-hand side in the figure) of the Y1 axis and the rectangular regions A3 and A4 are arranged on the other side (left-hand side in the figure) of the Y1 axis. The rectangular regions A1 and A4 are arranged on one side (upper side in the figure) of the X1 axis and the rectangular regions A2 and A3 are arranged on the other side (lower side in the figure) of the X1 axis.

In the region A1, the fuse FU is disposed along the X1 axis a predetermined interval spaced from the X1 axis. The dummy fuse DFU is disposed adjacent to the center part of the fuse FU. Adjacent to the center part of the dummy fuse DFU, a metal wire 220 is disposed along the long side of the rectangular region A1 on the opposite side of the X1 axis. A metal wire 221 is disposed on one side (left-hand side in the figure) of the metal wire 220 along the long side of the rectangular region A1 on the opposite side of the X1 axis and a metal wire 222 is disposed on the other side (right-hand side in the figure) of the metal wire 220.

Above the metal wire 220, the bit line BL is formed and the metal wire 220 is coupled to the bit line BL via a plurality of vias 223. The bit line BL extends in the direction parallel with the Y1 axis. One side (left-hand side in the figure) of the metal wire 221 is coupled to one end of the fuse FU. Above the metal wire 221, a metal wire 224 is formed and the metal wire 221 is coupled to the metal wire 224 via a plurality of vias 225. The metal wire 224 is formed in the direction in which the Y1 axis extends and transmits the fuse power source voltage VDDQ.

The other side (right-hand side in the figure) of the metal wire 222 is coupled to the other end of the fuse FU. The metal wire 222 is coupled to the drain of the transistor Q located below via a plurality of vias (not shown schematically). Through the bit line BL and the metal wires 222 and 224, an electric current to melt the fuse FU is caused to flow, and therefore, each width is set sufficiently great.

The layout of the regions A1 and A2 and the layout of the regions A4 and A3 are symmetric with respect to the Y1 axis. Further, the layout of the regions A1 and A4 and the layout of the regions A2 and A3 are symmetric with respect to the X1 axis. Hence, the metal wire 221 in the regions A1 and A4 are formed continuously and the metal wire 221 in the regions A2 and A3 is formed continuously. Further, the metal wire 224 corresponding to the regions A1 to A4 is formed continuously.

Each wiring width of each fuse FU and each dummy fuse DFU is set to the minimum line width in the memory cell array 210. The interval between the two neighboring fuses FU in the direction of the Y1 axis, the interval between the fuse FU and the neighboring dummy fuse DFU, and the interval between the dummy fuse DFU and the neighboring metal wires 220 to 222 are set to the minimum interval in the memory cell array 210, respectively. Consequently, since the exposure condition of the fuse FU and the dummy fuse DFU is optimized by the OPC in the manufacturing process, it is possible to form the fuse FU with the minimum line width.

Between the two fuses FU and between the fuse FU and the dummy fuse DFU, a porous insulating material having a low dielectric constant is filled. Because of this, when melting the fuse FU, it is unlikely that the heat of the fuse FU is conducted to the fuse FU and the dummy fuse DFU to prevent the temperature of the fuse FU from rising. Further, the fuse FU is melted by utilizing the pinch effect, and therefore, the center part of the fuse FU will become a trimming region 226.

Figure 36:
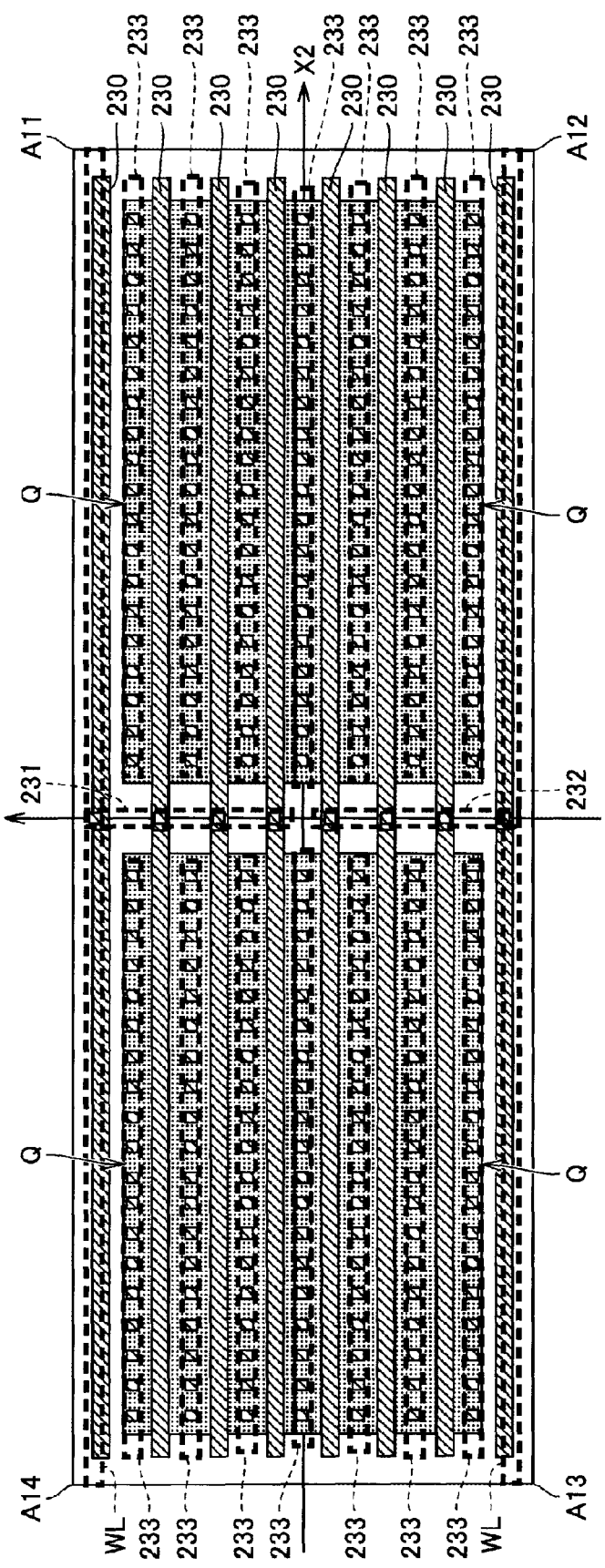
FIG. 36 is a diagram showing a layout of a transistor of the memory cell shown in FIG. 33.

FIG. 36 is a diagram showing a layout of the transistor Q of the memory cell MC, to be compared with FIG. 35. The surface of the silicon substrate on which the transistor Q of the memory cell MC is formed is divided into four rectangular regions A11 to A14 corresponding to the four memory cells MC, respectively. The four rectangular regions A11 to A14 correspond to the rectangular regions A1 to A4 in FIG. 35. The long sides of the rectangular regions A11 to A14 are arranged along an X2 axis and the short sides of the rectangular regions A11 to A14 are arranged along a Y2 axis. The rectangular regions A11 and A12 are arranged on one side (right-hand side in the figure) of the Y2 axis and the rectangular regions A13 and A14 are arranged on the other side (left-hand side in the figure) of the Y2 axis. The rectangular regions A11 and A14 are arranged on one side (upper side in the figure) of the X2 axis and the rectangular regions A12 and A13 are arranged on the other side (lower side in the figure) of the X2 axis.

In the regions A11 to A14, eight polysilicon wires 230 extending in the direction of the X2 axis are formed at equal intervals. In the regions A11 and A12, between neighboring ones of the six polysilicon wires 230 except for the two at both ends and in the two polysilicon wires 230 at both ends, an impurity region is formed, respectively. In the regions A13 and A14, between neighboring ones of the six polysilicon wires 230 other than the two at both ends and in the two polysilicon wires 230 at both ends, an impurity region is formed, respectively. The three polysilicon wires 230 arranged in each of the regions A11 to A14, and the impurity regions therebetween and at both ends configure the transistors Q. The three polysilicon wires 230 configure the gate electrode of the transistor Q.

Each center part of the four upper polysilicon wires 230 in the figure is coupled to a metal wire 231 in the first metal wiring layer located above via a via. The metal wire 231 is coupled to the word line WL, which is the metal wire in the first metal wiring layer above the polysilicon wire 230 formed at the top end in the figure.

Each center part of the four lower polysilicon wires 230 in the figure is coupled to a metal wire 232 in the first metal wiring layer located above via a via. The metal wire 232 is coupled to the word line WL, which is the metal wire in the first metal wiring layer above the polysilicon wire 230 formed at the bottom end in the figure.

The first and third impurity regions of the four impurity regions of each transistor Q form the drain region and the second and fourth impurity regions form the source region. The transistor Q in the region A11 and the transistor Q in the region A12 share the fourth impurity region (impurity region along the X2 axis). The transistor Q in the region A13 and the transistor Q in the region A14 share the fourth impurity region (impurity region along the X2 axis). Each impurity region is coupled to a metal wire 233 in the first metal wiring layer located above via a plurality of vias.

Figure 37:
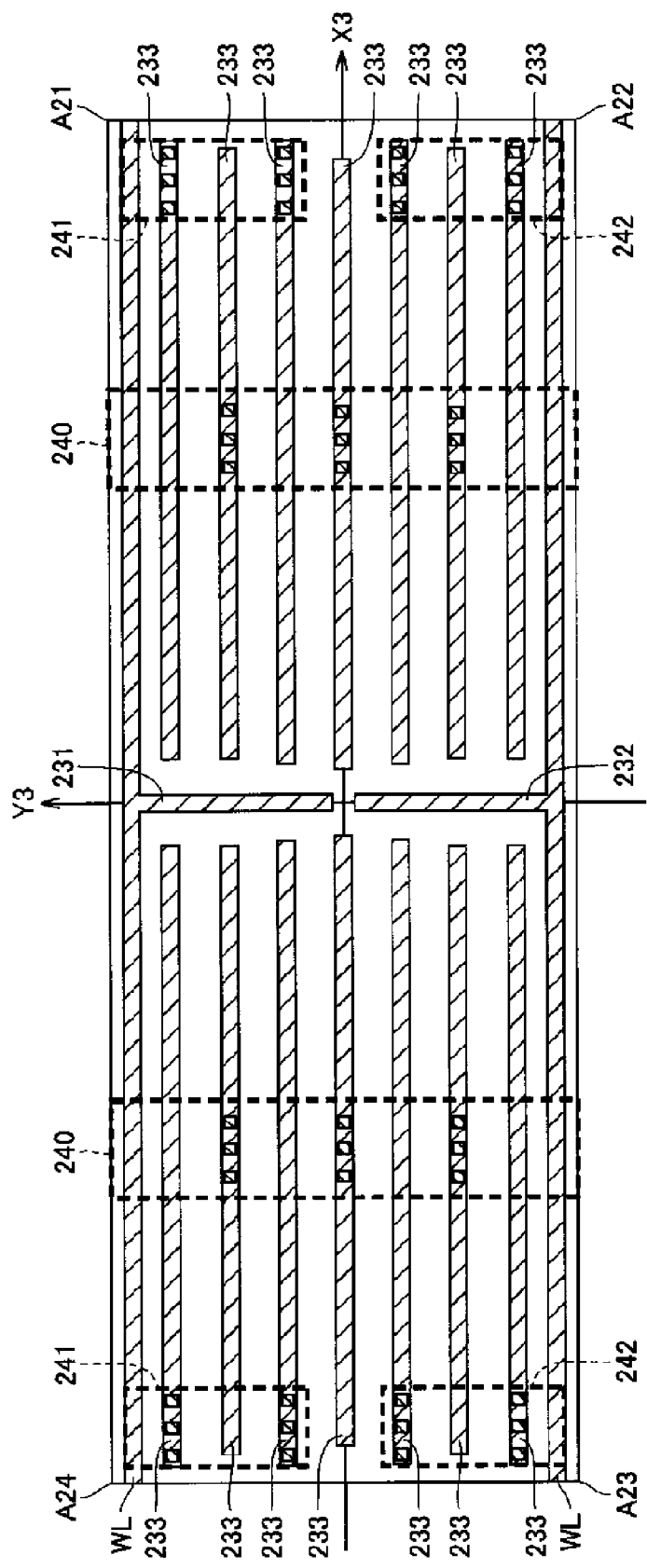
FIG. 37 is a diagram showing a layout of a metal wiring layer between a metal wiring layer shown in FIG. 35 and the transistor shown in FIG. 36.

FIG. 37 is a diagram showing a layout of the first metal wiring layer above the transistor Q of the memory cell MC, to be compared with FIG. 36. The first metal wiring layer is divided into four rectangular regions A21 to A24 corresponding to the four memory cells MC, respectively. The rectangular regions A21 to A24 correspond to the rectangular regions A11 to A14 in FIG. 36. The long sides of the rectangular regions A21 to A24 are arranged along an X3 axis and the short sides of the rectangular regions A21 to A24 are arranged along a Y3 axis. The rectangular regions A21 and A22 are arranged on one side (right-hand side in the figure) of the Y3 axis and the rectangular regions A23 and A24 are arranged on the other side (left-hand side in the figure) of the Y3 axis. The rectangular regions A21 and A24 are arranged on one side (upper side in the figure) of the X3 axis and the rectangular regions A22 and A23 are arranged on the other side (lower side in the figure) of the X3 axis.

Along the upper long sides of the regions A21 and A24, the word line WL is arranged and along the short side between the regions A21 and A24, the metal wire 231 is arranged and the top end of the metal wire 231 is coupled to the word line WL.

Along the lower long sides of the regions A22 and A23, the word line WL is arranged and along the short side between the regions A22 and A23, the metal wire 232 is arranged and the bottom end of the metal wire 232 is coupled to the word line WL.

In the regions A21 and A22, between the two word lines WL, the seven metal wires 233 extending in the direction of the X3 axis are arranged. Above the center part of the metal wire 233, a metal wire 240 extending in the direction of the Y3 axis is formed and each of the second, fourth, and sixth metal wires 233 is coupled to the metal wire 240 via a plurality of vias. The metal wire 240 is coupled to the bit line BL located further above.

Above one end part (end part on the opposite side of the metal wire 231) of the first to third metal wires 233, a metal wire 241 extending in the direction of the Y3 axis is formed and each of the first and third metal wires 233 is coupled to the metal wire 241 via a plurality of vias. The metal wire 241 is coupled to the fuse FU via the metal wire 222 in FIG. 35 located further above.

Above one end part (end part on the opposite side of the metal wire 232) of the fifth to seventh metal wires 233, a metal wire 242 extending in the direction of the Y3 axis is formed and each of the fifth and seventh metal wires 233 is coupled to the metal wire 242 via a plurality of vias. The metal wire 242 is coupled to the fuse FU via the metal wire 222 in FIG. 35 located further above. The layout in the regions A24 and A23 and the layout in the regions A21 and A22 are symmetric with respect to the Y3 axis.

As described above, in the second embodiment, the fuses FU included in the memory cell array 210 are surrounded by one diffusion protective wall 211, and therefore, it is possible to reduce the layout area compared to the conventional case where each fuse is surrounded by the diffusion protective wall. Because the memory cell array 210 is surrounded by the diffusion protective wall 211, it is possible to prevent copper from diffusing and to prevent the peripheral circuits from malfunctioning due to the diffused copper.

The dummy fuse DFU is provided adjacent to the fuse FU, each wiring width of the fuse FU and the dummy fuse DFU is set to the minimum line width, the interval between the two neighboring fuses FU is set to the minimum interval, and the interval between the fuse FU and the dummy fuse DFU is set to the minimum interval. Hence, since the exposure condition of the fuse FU and the dummy fuse DFU is optimized by the OPC, the dimensions of the fuse FU of the design drawing and the dimensions of the fuse FU of the product are the same. Consequently, it is possible to form the fuse FU with the minimum line width and to melt the fuse FU with a small current.

Further, between the two neighboring fuses FU and between the fuse FU and the dummy fuse DFU adjacent to each other, the insulating layer formed by a porous material having a low dielectric constant is provided, and therefore, it is possible to prevent the heat of the fuse FU from being conducted to the other fuse FU or dummy fuse DFU to suppress the rise in temperature of the fuse FU. Consequently, it is unlikely that the provision of the dummy fuse DFU prevents the fuse FU from being melted.

The fuse FU is melted by utilizing the pinch effect, and therefore, it is unlikely that the butterfly wing comes into contact with the other fuse FU, the dummy fuse DFU, etc.

Figure 38:
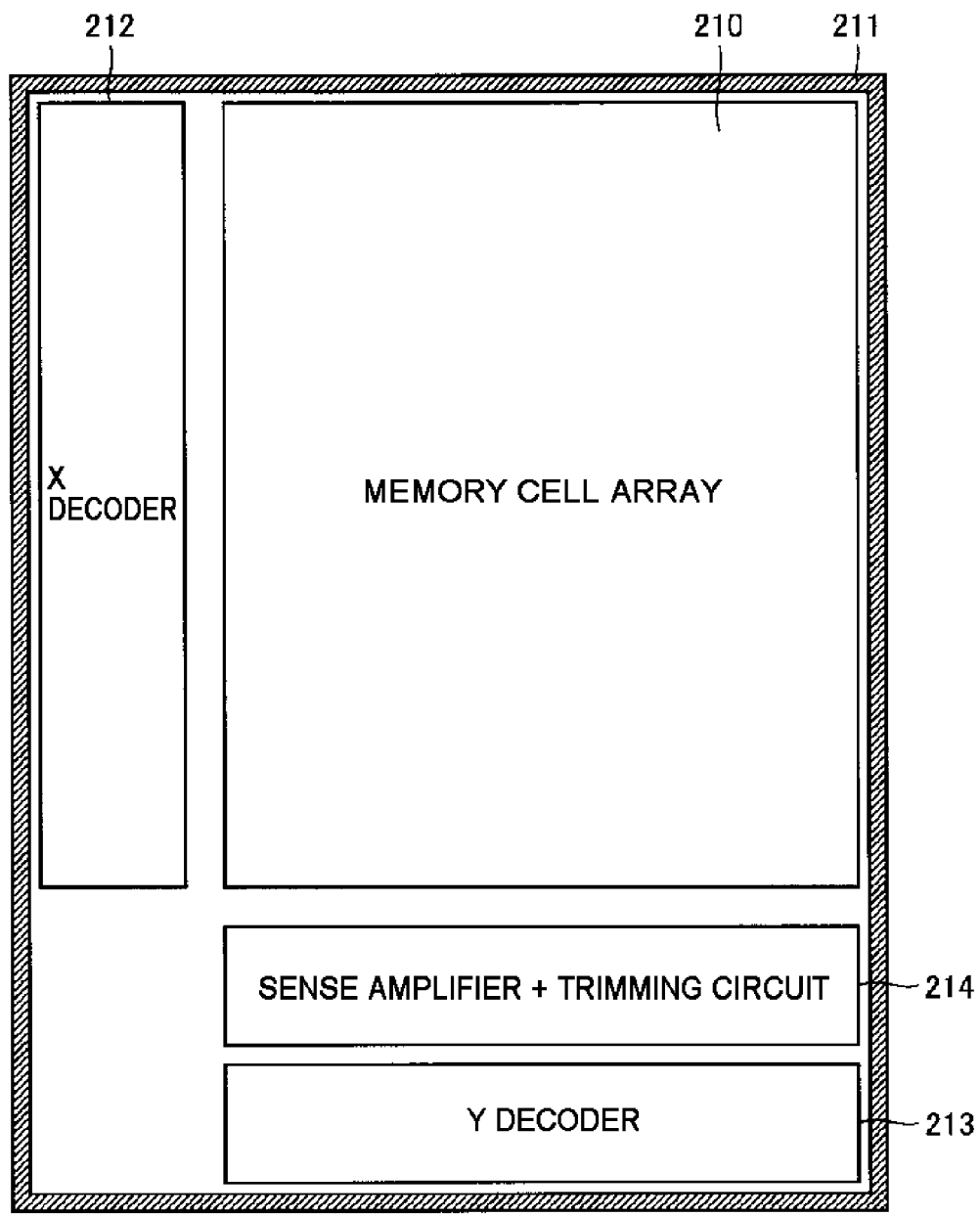
FIG. 38 is a diagram showing a modified example of the second embodiment.

In the second embodiment, the memory cell array 210 is surrounded by the diffusion protective wall 211, however, when another logic circuit is mounted around the semiconductor storage device and the influence of the diffusion of copper on the X decoder 212, the Y decoder 213, and the sense amplifier+trimming circuit 214 is small, it may also be possible to surround the entire semiconductor storage device by the diffusion protective wall 211 as shown in FIG. 38.

Modified Example

Figure 39:
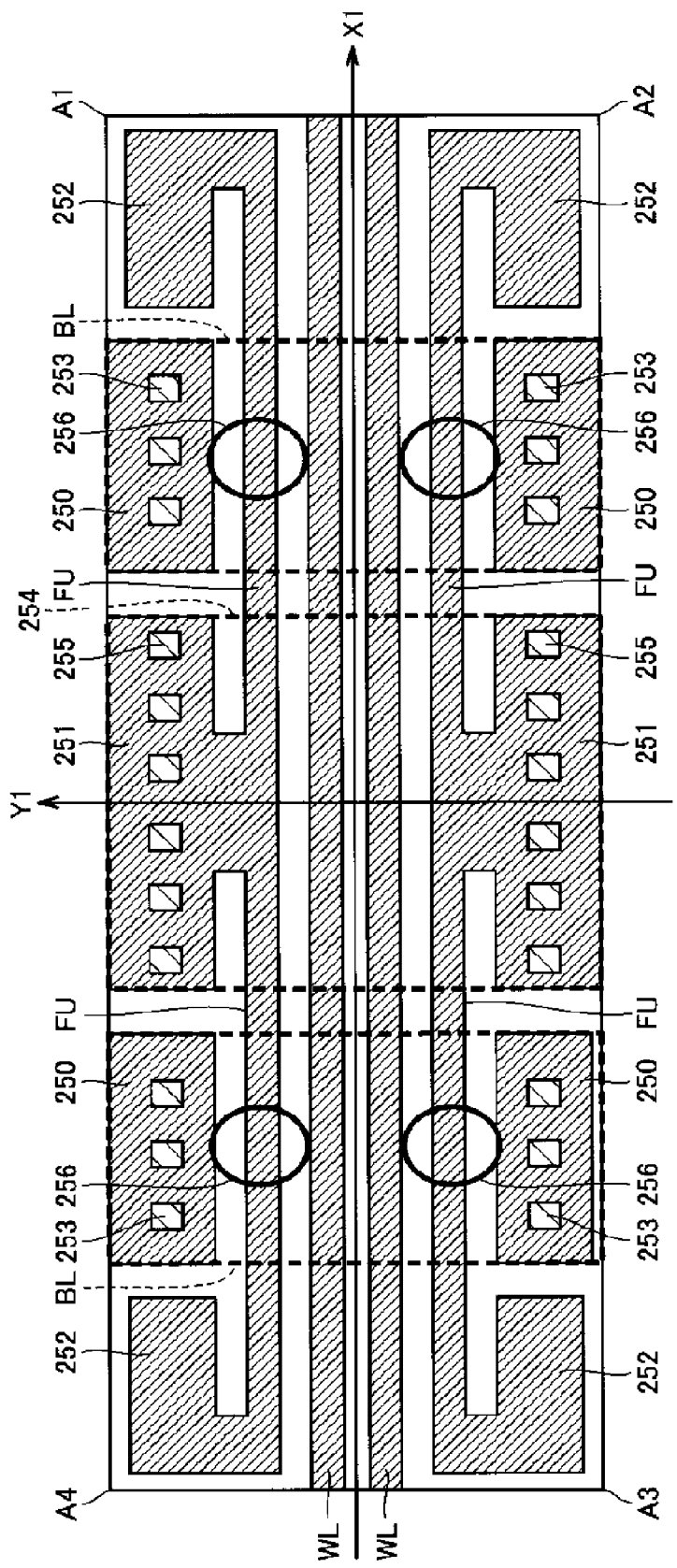
FIG. 39 is a diagram showing another modified example of the second embodiment.

FIG. 39 is a diagram showing a modified example of the second embodiment, to be compared with FIG. 35. In FIG. 39, as in FIG. 35, the metal wiring layer (for example, the fourth metal wiring layer) in which the fuse FU of the memory cell MC is formed is divided into the four rectangular regions A1 to A4 corresponding to the four memory cells MC, respectively. The long sides of the rectangular regions A1 to A4 are arranged along the X1 axis and the short sides of the rectangular regions A1 to A4 are arranged along the Y1 axis. The rectangular regions A1 and A2 are arranged on one side (right-hand side in the figure) of the Y1 axis and the rectangular regions A3 and A4 are arranged on the other side (left-hand side in the figure) of the Y1 axis. The rectangular regions A1 and A4 are arranged on one side (upper side in the figure) of the X1 axis and the rectangular regions A2 and A3 are arranged on the other side (lower side in the figure) of the X1 axis.

In the regions A1 to A4, so as to sandwich the X1 axis, the two word lines WL are arranged in parallel a predetermined interval spaced from each other. In the region A1, the fuse FU is disposed in parallel with and a predetermined interval spaced from the word line WL. Adjacent to the center part of the fuse FU, a metal wire 250 is disposed along the long side of the rectangular region A1 on the opposite side of the X1 axis. Along the long side of the rectangular region A1 on the opposite side of the X1 axis, a metal wire 251 is arranged on one side (left-handed side in the figure) of the metal wire 250 and a metal wire 252 is disposed on the other side (right-hand side in the figure) of the metal wire 250.

Above the metal wire 250, the bit line BL is formed and the metal wire 250 is coupled to the bit line BL via a plurality of vias 253. The bit line BL is formed in parallel with the Y1 axis. One side (left-hand side in the figure) of the metal wire 251 is coupled to one end of the fuse FU. Above the metal wire 251, a metal wire 254 is formed and the metal wire 251 is coupled to the metal wire 254 via a plurality of vias 255. The metal wire 254 is formed in the direction in which the Y1 axis extends and transmits the fuse power source voltage VDDQ.

The other side (right-hand side in the figure) of the metal wire 252 is coupled to the other end of the fuse FU. The metal wire 252 is coupled to the drain of the transistor Q located below via a plurality of vias (not shown schematically). Through the bit line BL and the metal wires 252 and 254, an electric current to melt the fuse FU is caused to flow, and therefore, each width is set sufficiently great.

The layout in the regions A1 and A2 and the layout in the regions A4 and A3 are symmetric with respect to the Y1 axis. Further, the layout in the regions A1 and A4 and the layout in the regions A2 and A3 are symmetric with respect to the X1 axis. Hence, the metal wire 251 in the regions A1 and A4 is formed continuously and the metal wire 251 in the regions A2 and A3 is formed continuously. Furthermore, the metal wire 254 corresponding to the regions A1 to A4 is formed continuously.

Each wiring width of the fuse FU and the word line WL is set to the minimum line width in the memory cell array 210. Further, the interval between the two neighboring word lines WL, the interval between the fuse FU and the neighboring word line WL, and the interval between the fuse FU and the neighboring metal wires 250 to 252 are set to the minimum interval in the memory cell array 210, respectively. Hence, since the exposure condition of the fuse FU and the word line WL is optimized by the OPC in the manufacturing process, it is possible to form the fuse FU with the minimum line width.

Between the fuse FU and the word line WL and between the fuse FU and the metal wires 250 to 252, the porous insulating material having a low dielectric constant is filled. Because of this, it is unlikely that the heat of the fuse FU is conducted to the neighboring word line WL and the metal wires 250 to prevent the temperature of the fuse FU from rising when melting the fuse FU. Further, the fuse FU is melted by utilizing the pinch effect, and therefore, the center part of the fuse FU will be a trimming region 256. Note that, since the fuse FU is melted by utilizing the pinch effect, it is unlikely that the butterfly wing comes into contact with the word line WL etc.

Figure 40:
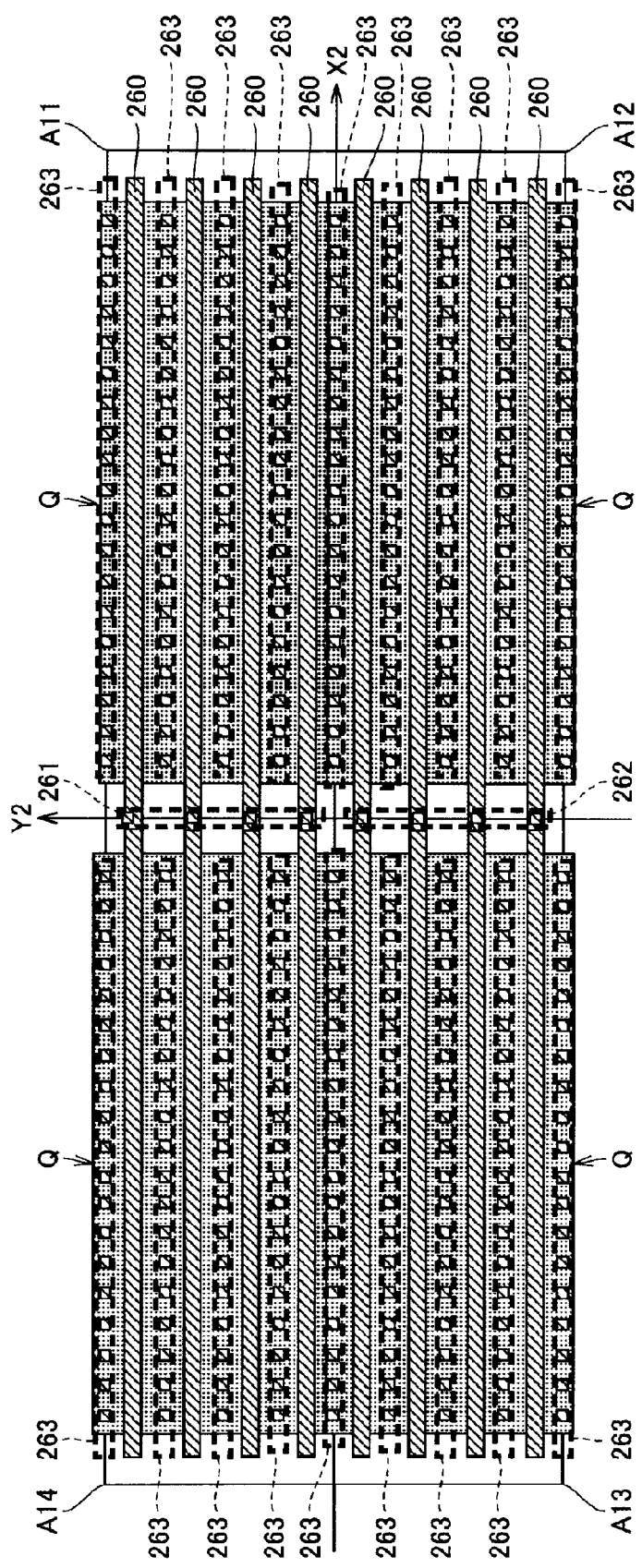
FIG. 40 is a diagram showing a layout of a transistor of a memory cell shown in FIG. 39.

FIG. 40 is a diagram showing a layout of the transistor Q of the memory cell MC, to be compared with FIG. 39. The surface of the silicon substrate on which the transistor Q of the memory cell MC is formed is divided into the fourth rectangular regions A11 to A14 corresponding to the four memory cells MC, respectively. The rectangular regions A11 to A14 correspond to the rectangular regions A1 to A4 in FIG. 39. The long sides of the rectangular regions A11 to A14 are arranged along the X2 axis and the short sides of the rectangular regions A11 to A14 are arranged along the Y2 axis. The rectangular regions A11 and A12 are arranged on one side (right-hand side in the figure) of the Y2 axis and the rectangular regions A13 and A14 are arranged on the other side (left-hand side in the figure) of the Y2 axis. The rectangular regions A11 and A14 are arranged on one side (upper side in the figure) of the X2 axis and the rectangular regions A12 and A13 are arranged on the other side (lower side in the figure) of the X2 axis.

In the regions A11 to A14, eight polysilicon wires 260 extending in the direction parallel with the X2 axis are formed at equal intervals. In the regions A11 and A12, impurity regions are formed between neighboring wires of the eight polysilicon wires 260 and at both sides of the eight polysilicon wires 260, respectively. In the regions A13 and A14, impurity regions are formed between neighboring wires of the eight polysilicon wires 260 and at both sides of the eight polysilicon wires 260, respectively. The four polysilicon wires 260 arranged in the regions A11 to A14, respectively, and the impurity regions therebetween and at both sides configure the transistor Q. The four polysilicon wires 260 configure the gate electrode of the corresponding transistor Q.

Each center part of the four upper polysilicon wires 260 in the figure is coupled to a metal wire 261 in the first metal wiring layer located above via a via. Each center part of the four lower polysilicon wires 260 in the figure is coupled to a metal wire 262 in the first metal wiring layer located above via a via.

The first, third, and fifth impurity regions of the five impurity regions of each transistor Q form the source region and the second and fourth impurity regions form the drain region. The transistor Q in the region A11 and the transistor Q in the region A12 share the fifth impurity region (impurity region along the X2 axis). The transistor Q in the region A13 and the transistor Q in the region A14 share the fifth impurity region (impurity region along the X2 axis). Each impurity region is coupled to a metal wire 263 in the first metal wiring layer located above via a plurality of vias.

Figure 41:
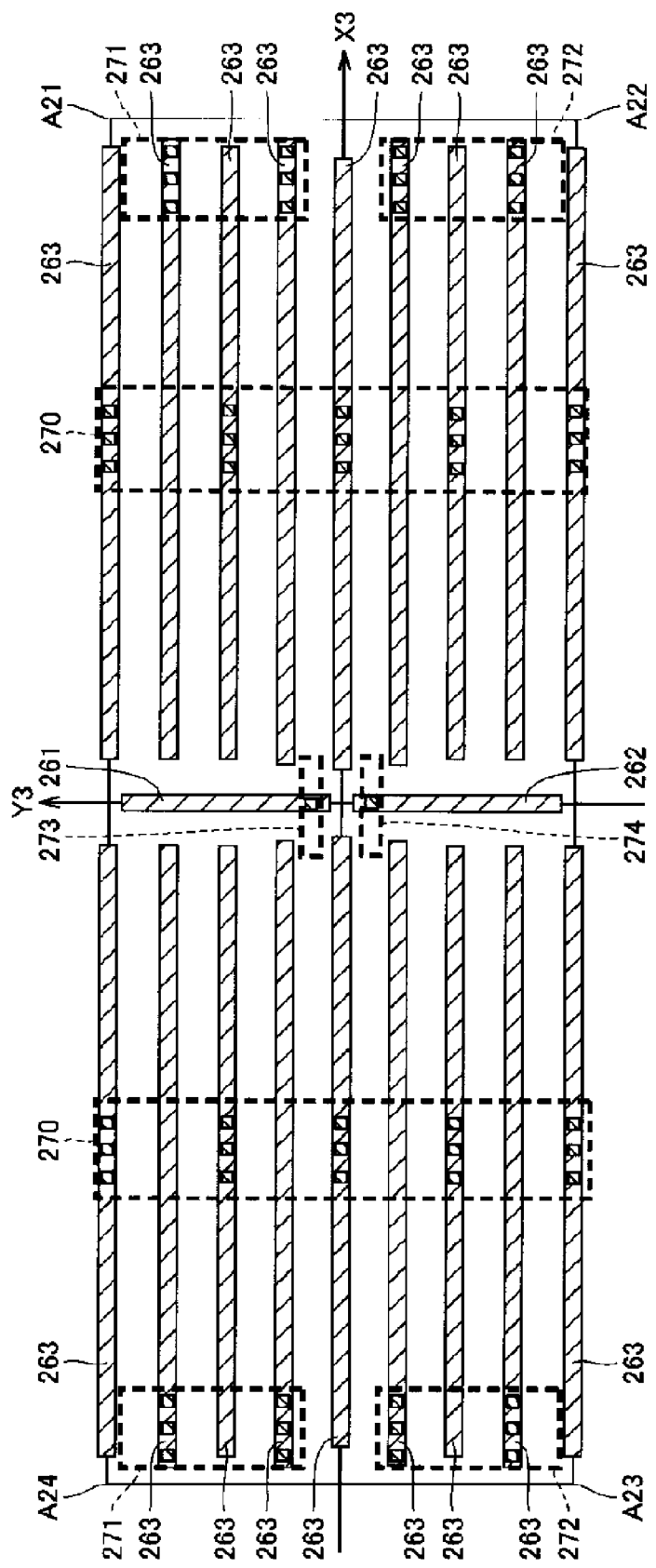
FIG. 41 is a diagram showing a layout of a metal wiring layer between a metal wiring layer shown in FIG. 39 and the transistor shown in FIG. 40.

FIG. 41 is a diagram showing a layout of the first metal wiring layer above the transistor Q of the memory cell MC, to be compared with FIG. 40. The first metal wiring layer is divided into the four rectangular regions A21 to A24 corresponding to the four memory cells MC, respectively. The rectangular regions A21 to A24 correspond to the rectangular regions A11 to A14 in FIG. 40. The long sides of the rectangular regions A21 to A24 are arranged along the X3 axis and the short sides of the rectangular regions A21 to A24 are arranged along the Y3 axis. The rectangular regions A21 and A22 are arranged on one side (right-hand side in the figure) of the Y3 axis and the rectangular regions A23 and A24 are arranged on the other side (left-hand side in the figure) of the Y3 axis. The rectangular regions A21 and A24 are arranged on one side (upper side in the figure) of the X3 axis and the rectangular regions A22 and A23 are arranged on the other side (lower side in the figure) of the X3 axis.

Along the short side between the regions A21 and A24, the metal wire 261 is disposed. Above the bottom end part of the metal wire 261, a metal wire 273 extending in the direction of the X3 axis is formed and the metal wire 261 is coupled to the word line WL located further above via a via and the metal wire 273. Along the short side between the regions A22 and A23, the metal wire 262 is disposed. Above the bottom end part of the metal wire 262, a metal wire 274 extending in the direction of the X3 axis is formed and the metal wire 262 is coupled to the word line WL located further above via a via and the metal wire 274.

In the regions A21 and A22, the nine metal wires 263 extending in the direction of the X3 axis are arranged. Above the center part of the metal wire 263, a metal wire 270 extending in the direction of the Y3 axis is formed and each of the first, third, fifth, seventh, and ninth metal wires 263 is coupled to the metal wire 270 via a plurality of vias. The metal wire 270 is coupled to the bit line BL located further above.

Above one end part (end part on the opposite side of the metal wire 261) of the second to fourth metal wires 263, a metal wire 271 extending in the direction of the Y3 axis is formed and each of the second and fourth metal wires 263 is coupled to the metal wire 271 via a plurality of vias. The metal wire 271 is coupled to the fuse FU via the metal wire 252 in FIG. 39 located further above.

Above one end part (end part on the opposite side of the metal wire 262) of the sixth to eighth metal wires 263, a metal wire 272 extending in the direction of the Y3 axis is formed and each of the sixth and eighth metal wires 263 is coupled to the metal wire 272 via a plurality of vias. The metal wire 272 is coupled to the fuse FU via the metal wire 252 in FIG. 39 located further above. The layout in the regions A24 and A23 and the layout in the regions A21 and A22 are symmetric with respect to the Y3 axis. In this modified example also, the same effect as that in the second embodiment can be obtained.

The embodiments disclosed this time should be regarded as merely examples and not limitative in all points. The scope of the present invention is specified by claims not by the above-described explanation and it is intended that meanings equivalent to claims and all modifications within the scope are included.

What is claimed is:

1. A semiconductor device having a plurality of metal wiring layers, the semiconductor device comprising:
    a fuse which is formed using a first copper wire in a metal wiring layer upper than a lowermost metal wiring layer of the metal wiring layers and which stores a data signal by being melted or not;
    a dummy fuse provided adjacent to the fuse and formed using a second copper wire in the same metal wiring layer as that of the fuse; and
    a diffusion protective wall which is formed using the metal wiring layers so as to surround the fuse and the dummy fuse and which prevents diffusion of copper,
    wherein each wiring width of the fuse and the dummy fuse is set to a minimum line width in a region surrounded by the diffusion protective wall, and
    wherein an interval between the fuse and the dummy fuse is set to the minimum interval in the region surrounded by the diffusion protective wall.

2. The semiconductor device according to claim 1, further comprising:
    a transistor coupled in series to the fuse between a node of a first power source voltage and a node of a second power source voltage lower than the first power source voltage; and
    a drive circuit that turns on the transistor and causes an electric current to flow through the fuse to melt the fuse,
    wherein the drive circuit operates the transistor in a region including a linear region so that the electric current flowing through the fuse decreases when a temperature of the fuse rises and a resistance value of the fuse increases and melts the fuse by utilizing a pinch effect.

3. The semiconductor device according to claim 2,
    wherein the drive circuit melts the fuse by applying a third power source voltage lower than the first power source voltage and higher than the second power source voltage to a gate of the transistor and utilizing the pinch effect.

4. The semiconductor device according to claim 3,
    wherein the melted fuse is melted in the center part of the fuse and divided into two fuse chips, and parts of the two fuse chips facing each other are thicker than other parts of the respective fuse chips.

5. The semiconductor device according to claim 2,
    wherein the melted fuse is melted in the center part of the fuse and divided into two fuse chips and parts of the two fuse chips facing each other are thicker than other parts of the respective fuse chips.

6. The semiconductor device according to claim 1,
    wherein the fuse is formed in an insulating layer formed by a porous material having a low dielectric constant.

7. The semiconductor device according to claim 1,
    wherein the dummy fuse extends in the same direction as that of the fuse.

8. The semiconductor device according to claim 1,
    wherein the dummy fuse extends in a direction orthogonal to that of the fuse,
    wherein a plurality of the dummy fuses is arranged in a direction in which the fuse extends, and
    wherein an interval between the two neighboring dummy fuses is set to the minimum interval in a region surrounded by the diffusion protective wall.

9. A semiconductor device having a plurality of metal wiring layers, the semiconductor device comprising a memory array including:
    a plurality of fuses arranged in a plurality of rows and columns and each of which stores a data signal by being melt or not;
    a plurality of word lines provided corresponding to the rows, respectively;
    a plurality of bit lines provided corresponding to the columns, respectively; and
    a plurality of transistors each provided corresponding to each of the fuses and each of which has a gate coupled to the corresponding word line,
    wherein each of the fuses and the transistor corresponding each of the fuses are coupled in series between a fuse power source node and the corresponding bit line,
    wherein each of the fuses is formed using a first copper wire in a metal wiring layer upper than a lowermost metal wiring layer of the metal wiring layers, and wherein the semiconductor device further includes:
a row decoder that sets any of the word lines to a selection level according to a row address signal and turns on the transistor corresponding to the word line;
a column decoder that selects any of the bit lines according to a column address signal;
a write circuit that melts the selected fuse by applying a predetermined voltage between the fuse power source node and the bit line selected by the column decoder at a time of write operation;
a read circuit that detects whether or not an electric current flows between the fuse power source node and the bit line selected by the column decoder and outputs a data signal at a logic level in accordance with a detection result at the time of read operation; and
a diffusion protective wall formed using a metal wire in the same metal wiring layer as that of the fuses so as to surround at least the fuses and which prevents diffusion of copper,
wherein the memory array further includes a dummy fuse provided corresponding to each of the fuses and adjacent to the corresponding fuse, the dummy fuse being formed using a second copper wire in the same metal wiring layer as that of the corresponding fuse,
wherein each wiring width of the fuse and the dummy fuse which are adjacent to each other is set to a minimum line width in a region surrounded by the diffusion protective wall, and
wherein an interval between the fuse and the dummy fuse which are adjacent to each other is set to the minimum interval in the region surrounded by the diffusion protective wall.

10. The semiconductor device according to claim 9,
wherein each of the transistors is arranged below the corresponding fuse, and
wherein the gate of each of the transistors is formed into a shape of a comb tooth.

11. The semiconductor device according to claim 9,
wherein the row decoder and the write circuit operate the transistor in a region including a linear region so that an electric current that flows through the fuse decreases when a temperature of the fuse rises and a resistance value of the fuse increases and melt the fuse by utilizing a pinch effect at a time of the write operation.

12. The semiconductor device according to claim 11,
wherein the row decoder applies a voltage lower than the predetermined voltage as a selection level to the gate of the transistor via the selected word line and the write circuit applies the predetermined voltage between the fuse power source node and the selected bit line, thereby melting the fuse by utilizing the pinch effect.

13. The semiconductor device according to claim 11,
wherein the melted fuse is melted in the center part of the fuse and divided into two fuse chips and parts of the two fuse chips facing each other are thicker than other parts of the respective fuse chips.

14. The semiconductor device according to claim 9,
wherein the fuse is formed in an insulating layer formed by a porous material having a low dielectric constant.

15. A semiconductor device having a plurality of metal wiring layers, the semiconductor device comprising a memory array including:
a plurality of fuses arranged in a plurality of rows and columns and each of which stores a data signal by being melt or not;
a plurality of word lines provided corresponding to the rows, respectively;
a plurality of bit lines provided corresponding to the columns, respectively; and
a plurality of transistors each provided corresponding to each of the fuses and each of which has a gate coupled to the corresponding word line,
wherein each of the fuses and the transistor corresponding each of the fuses are coupled in series between a fuse power source node and the corresponding bit line,
wherein each of the fuses is formed using a first copper wire in a metal wiring layer upper than a lowermost metal wiring layer of the metal wiring layers, and
wherein the semiconductor device further includes:
a row decoder that sets any of the word lines to a selection level according to a row address signal and turns on the transistor corresponding to the word line;
a column decoder that selects any of the bit lines according to a column address signal;
a write circuit that melts the selected fuse by applying a predetermined voltage between the fuse power source node and the bit line selected by the column decoder at a time of write operation;
a read circuit that detects whether or not an electric current flows between the fuse power source node and the bit line selected by the column decoder and outputs a data signal at a logic level in accordance with a detection result at the time of read operation; and
a diffusion protective wall formed using a metal wire in the same metal wiring layer as that of the fuses so as to surround at least the fuses and which prevents diffusion of copper,
wherein part of each of the word lines is provided adjacent to the corresponding fuse and formed using a third copper wire in the same metal wiring layer as that of the corresponding fuse,
wherein each wiring width of the fuse and a part of the word line which are adjacent to each other is set to a minimum line width in a region surrounded by the diffusion protective wall, and
wherein an interval between the fuse and the part of the word line which are adjacent to each other is set to the minimum interval in the region surrounded by the diffusion protective wall.

16. The semiconductor device according to claim 15,
wherein each of the transistors is arranged below the corresponding fuse, and wherein the gate of each of the transistors is formed into a shape of a comb tooth.

17. The semiconductor device according to claim 15,
wherein the row decoder and the write circuit operate the transistor in a region including a linear region so that an electric current that flows through the fuse decreases when a temperature of the fuse rises and a resistance value of the fuse increases and melt the fuse by utilizing a pinch effect at a time of the write operation.

18. The semiconductor device according to claim 17,
wherein the row decoder applies a voltage lower than the predetermined voltage as a selection level to the gate of the transistor via the selected word line and the write circuit applies the predetermined voltage between the fuse power source node and the selected bit line, thereby melting the fuse by utilizing the pinch effect.

19. The semiconductor device according to claim 17,
wherein the melted fuse is melted in the center part of the fuse and divided into two fuse chips and parts of the two fuse chips facing each other are thicker than other parts of the respective fuse chips.

20. The semiconductor device according to claim 15, wherein the fuse is formed in an insulating layer formed by a porous material having a low dielectric constant.

* * * * *